US008525156B2

(12) United States Patent
Nakamura et al.

(10) Patent No.: US 8,525,156 B2
(45) Date of Patent: Sep. 3, 2013

(54) ORGANIC THIN FILM TRANSISTOR HAVING AN AMORPHOUS CHANNEL CONTROL LAYER WITH SPECIFIED INOZATION POTENTIAL

(75) Inventors: Hiroaki Nakamura, Chiba (JP); Yuki Nakano, Chiba (JP); Masatoshi Saito, Chiba (JP); Hirofumi Kondo, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 523 days.

(21) Appl. No.: 12/679,634

(22) PCT Filed: Sep. 9, 2008

(86) PCT No.: PCT/JP2008/066248
§ 371 (c)(1),
(2), (4) Date: Jun. 30, 2010

(87) PCT Pub. No.: WO2009/041254
PCT Pub. Date: Apr. 2, 2009

(65) Prior Publication Data
US 2010/0283041 A1    Nov. 11, 2010

(30) Foreign Application Priority Data

Sep. 26, 2007  (JP) ................................ 2007-249132
Jul. 30, 2008   (JP) ................................ 2008-196278

(51) Int. Cl.
*H01L 51/30* (2006.01)
(52) U.S. Cl.
USPC ........ 257/40; 257/57; 257/E51.025; 428/690; 428/917
(58) Field of Classification Search
None
See application file for complete search history.

(56) References Cited

U.S. PATENT DOCUMENTS

| 6,150,668 | A | 11/2000 | Bao et al. |
| 7,671,448 | B2 | 3/2010 | Furukawa et al. |
| 7,868,319 | B2 | 1/2011 | Adachi et al. |
| 7,875,494 | B2 | 1/2011 | Furukawa et al. |
| 2006/0158102 | A1 | 7/2006 | Kawamura et al. |
| 2006/0214160 | A1 | 9/2006 | Furukawa et al. |
| 2007/0290194 | A1 | 12/2007 | Becker et al. |
| 2009/0051281 | A1 | 2/2009 | Inoue et al. |
| 2009/0212281 | A1 | 8/2009 | Adachi et al. |
| 2010/0136740 | A1 | 6/2010 | Furukawa et al. |
| 2011/0111555 | A1 | 5/2011 | Furukawa et al. |

FOREIGN PATENT DOCUMENTS

| CN | 1855570 A | 11/2006 |
| CN | 1943056 A | 4/2007 |
| DE | 10 2004 009 355 A1 | 9/2005 |
| EP | 0716459 A2 | 6/1996 |
| EP | 1 718 126 A1 | 11/2006 |
| EP | 1880990 A1 * | 1/2008 |
| JP | 05055568 A | 3/1993 |
| JP | 05055568 W | 3/1993 |
| JP | 08228034 W | 9/1996 |
| JP | 10135481 A | 5/1998 |
| JP | 10135481 W | 5/1998 |
| JP | 200029403 A | 1/2000 |
| JP | 2003-282884 A | 10/2003 |
| JP | 2003318196 A | 11/2003 |
| JP | 2003318196 W | 11/2003 |
| JP | 2006303459 A | 11/2006 |
| JP | 2007103819 A | 4/2007 |
| JP | 2007103819 W | 4/2007 |
| JP | 2007220772 A | 8/2007 |
| WO | 2005056505 A1 | 6/2005 |
| WO | WO 2005083812 A2 * | 9/2005 |
| WO | 2006120859 A1 | 11/2006 |
| WO | WO 2006120859 A1 * | 11/2006 |
| WO | PCT/JP08/66248 R | 12/2008 |

OTHER PUBLICATIONS

Shirota, Y., "Photo- and electroactive amorphous molecular materials-molecular design, synthesis, reactions, properties, and applications," Journal of Materials Chemistry, Nov. 24, 2004, vol. 15, pp. 75-93, The Royal Society of Chemistry, Cambridge, GB; Cited in EP Extended Search Report, dated Dec. 5, 2011, issued in corresponding EP 08 83 3663.
EP Extended Search Report, dated Dec. 5, 2011, issued in corresponding EP 08 83 3663.
Horowitz, et al., "Evidence for n-Type Conduction in a Perylene Tetracarboxylic Diimide Derivative." Advanced Materials, vol. 8, No. 3, p. 242, (1996).
H. Fuchigami, et al., "Polythienylenevinylene thin-film transistor with high carrier mobility." Applied Physics Letter, vol. 63, p. 1372, (1993).
Lay-Lay Chua, et al., "General observation of n-Type field effect behaviour in organic semiconductors." Nature, vol. 434, p. b194, (Mar. 10, 2005).
Ishikawa, et al., Preprint of The 54th Spring Meeting, JSAP and Related Societies, 30a-W-11, p. 1424, (2007).
Myung-Han Moon, et al., "Low-Voltage Organic Field-Effect Transistors and Inverters Enabled by Ultrathin Cross-Linked Polymers as Gate Dielectrics." Journal of American Chemical Society, vol. 127, p. 10388-10395, (2005).
Office Action, dated Jun. 15, 2011, issued in corresponding CN 200880108574.3.

* cited by examiner

*Primary Examiner* — Lynda Salvatore
*Assistant Examiner* — Andrew K Bohaty
(74) *Attorney, Agent, or Firm* — Millen, White, Zelano & Branigan, P.C.

(57) ABSTRACT

An organic thin film transistor including a substrate having thereon at least three terminals of a gate electrode, a source electrode and a drain electrode, an insulator layer and an organic semiconductor layer, with a current between a source and a drain being controlled upon applying a voltage to the gate electrode, wherein a channel control layer including an amorphous organic compound having an ionization potential of less than 5.8 eV is provided between the organic semiconductor layer and the insulator layer, has excellent stability of a field-effect mobility and a high response speed even when stored at a high temperature.

18 Claims, 2 Drawing Sheets

DEVICE A

DEVICE B

DEVICE C

DEVICE D

ORGANIC THIN FILM TRANSISTOR HAVING AN AMORPHOUS CHANNEL CONTROL LAYER WITH SPECIFIED INOZATION POTENTIAL

TECHNICAL FIELD

The present invention relates to an organic thin film transistor. In particular, the present invention relates to an organic thin film field-effect transistor which even when stored at a high temperature, has excellent stability of field-effect mobility and high response speed.

BACKGROUND ART

A thin film transistor (hereinafter sometimes abbreviated as "TFT") is widely used as a switching device for display of a liquid crystal display, etc. A sectional structure of a representative TFT is shown in FIG. 1. As shown in FIG. 1, the TFT has a gate electrode, an insulator layer and an organic semiconductor layer in this order on a substrate and has a source electrode and a drain electrode formed at a prescribed interval on the organic semiconductor layer. A part of each of the source electrode and the drain electrode is exposed on the surface, and the semiconductor layer is formed on the surface exposing between the both electrodes. In the TFT having such a configuration, the semiconductor layer forms a channel region, a current flowing between the source electrode and the drain electrode is controlled by a voltage to be applied to the gate electrode, and the TFT undergoes an ON/OFF operation.

A TFT has hitherto been prepared using amorphous or polycrystalline silicon. However, a CVD apparatus which is used for the preparation of a TFT using such silicon is very expensive, and therefore, there was involved such a problem that increasing in size of a display, etc. using a TFT is accompanied by a big increase of manufacturing costs. Also, since a process for depositing amorphous or polycrystalline silicon is carried out at a very high temperature, the kind of a material which can be used as a substrate is limited. Thus, there was encountered such a problem that a lightweight polymer film substrate, to which flexibility can be imparted and which is able to be freely subjected to shape design, or the like cannot be used. If it is possible to manufacture a TFT on a lightweight polymer film substrate, it is expected that an application to portable electronic devices will become possible.

In order to solve such problems, there has been proposed a TFT using an organic semiconductor (hereinafter sometimes abbreviated as "organic TFT"). As a deposition method which is adopted during the formation of a TFT by an organic semiconductor, there are known a vacuum vapor deposition method, a coating method and so on. According to such a deposition method, it is possible to realize to increase the size of a device while suppressing an increase of the manufacturing costs, and the process temperature which is necessary at the time of deposition can be made relatively low. Also, in the TFT using an organic material, there is an advantage that limitations at the time of selection of a material to be used for the substrate are few, and its practical implementation is expected. Under such a circumstance, there have been made a number of research reports regarding the organic TFT. For example, Non-Patent Documents 1 to 3 can be enumerated. Also, as a material to be used for a semiconductor layer of TFT, so far as a p-type is concerned, multimers such as conjugated polymers, and thiophenes (Patent Document 1); condensed aromatic hydrocarbons such as pentacene (Patent Document 2); and the like are known. Also, as a material of an n-type FET, 1,4,5,8-naphthalenetetracarboxyl dianhydride (NTCDA), 11,11,12,12-tetracyanonaphth-2,6-quinodimethane (TCNNQD), 1,4,5,8-naphthalenetetracarboxyl diimide (NTCDI) and the like are disclosed in Patent Document 3.

Similar to the organic TFT, there is known an organic electroluminescence device (hereinafter sometimes abbreviated as "organic EL device") as a device using electric conduction. The organic EL device generally forcedly feeds charges upon applying a strong electric field of $10^5$ V/cm or more in a thickness direction to a ultra-thin film of not more than 100 nm; whereas in the case of the organic TFT, it is necessary to feed charges at a high speed over a distance of several μm or more in an electric field of not more than $10^5$ V/cm. For that reason, the organic material itself is required to have conductivity exceeding the organic EL device material. However, organic materials which are used in the conventional organic TFTs are low in a field-effect mobility (hereinafter sometimes abbreviated as "mobility") and slow in a response speed. For that reason, there was involved a problem in high-speed response as a transistor. Also, an ON/OFF ratio was small.

The "ON/OFF ratio" as referred to herein means a value obtained by dividing a current (ON current) flowing between a source and a drain when a gate voltage is applied, namely in an ON state by a current flowing between the source and the drain when a gate voltage is not applied, namely in an OFF state. Also, the "ON current" as referred to herein means a current value (saturated current) when the current flowing between the source and the drain is saturated at the time of increasing the gate voltage.

There have been made attempts to solve these problems of organic TFTs and to enhance the mobility by an improvement of the device configuration. For example, it is attempted to insert a vapor deposited film of N,N-dinaphthalen-1-yl-N,N'-diphenyl-biphenyl-4,4'-diamine (NPD) at an interface between a channel layer (organic semiconductor layer) and an insulating layer (Non-Patent Document 4). However, since NPD is low in glass transition temperature and insufficient in heat resistance, there was involved such a problem that in the case where it is put into practical use at a high temperature, its mobility is lowered with time. Also, on the contrary, in order to obtain an organic TFT which is stable against heat, it is attempted to use a polymer such as polystyrene upon being crosslinked (Non-Patent 5). However, there was involved such a problem that when only this is applied, a high mobility is not obtained.

[Patent Document 1] JP-A-8-228034
[Patent Document 2] JP-A-5-55568
[Patent Document 3] JP-A-10-135481
[Non-Patent Document 1] Horowitz, et al., *Advanced Materials*, Vol. 8, No. 3, page 242 (1996)
[Non-Patent Document 2] H. Fuchigami, et al., *Applied Physics Letter*, Vol. 63, page 1372 (1993)
[Non-Patent Document 3] Lay-Lay Chua, et al., *Nature*, Vol. 434, Mar. 10, 2005, page 194
[Non-Patent Document 4] Ishikawa, et al., *Preprint of The 54th Spring Meeting, JSAP and Related Societies*, 2007, 30a-W-11, page 1424
[Non-Patent Document 5] Myung-Han Yoon, et al., *J. AM. CHEM. SOC*, 2005, 127, 10388 to 10395

DISCLOSURE OF THE INVENTION

Problems that the Invention is to Solve

In order to solve the foregoing problems, the present invention has been made. An object of the present invention is to provide an organic thin film transistor (organic TFT) which even when stored at a high temperature, has excellent stability of a field-effect mobility and a high response speed.

Means for Solving the Problems

In order to achieve the foregoing object, the present inventors made extensive and intensive investigations. As a result, it has been found that when a channel control layer composed of an amorphous material having a specified ionization potential is formed between an insulator layer and an organic semiconductor layer each constituting an organic TFT, not only the response speed (driving speed) can be made high, but the organic TFT is stable against the storage under a high-temperature condition, leading to accomplishment of the present invention.

That is, the present invention is to provide an organic thin film transistor comprising a substrate having thereon at least three terminals of a gate electrode, a source electrode and a drain electrode, an insulator layer and an organic semiconductor layer, with a current between a source and a drain being controlled upon applying a voltage to the gate electrode, wherein a channel control layer including an amorphous organic compound having an ionization potential of less than 5.8 eV is provided between the foregoing organic semiconductor layer and the foregoing insulator layer.

Advantages of the Invention

The organic TFT of the present invention is made high in a response speed (driving speed) and even when stored at a high temperature, is excellent in stability of a field-effect mobility.

BEST MODES FOR CARRYING OUT THE INVENTION

The present invention is concerned with an organic thin film transistor (organic TFT) comprising a substrate having thereon at least three terminals of a gate electrode, a source electrode and a drain electrode, an insulator layer and an organic semiconductor layer, with a current between a source and a drain being controlled upon applying a voltage to the gate electrode, wherein a channel control layer including an amorphous organic compound having an ionization potential of less than 5.8 eV is provided between the foregoing organic semiconductor layer and the foregoing insulator layer.

The organic TFT of the present invention is preferably a first organic TFT of the present invention in which a glass transition temperature of the amorphous organic compound is 100° C. or higher; and also preferably a second organic TFT of the present invention in which a molecular weight of the amorphous organic compound is 1,000 or more.

Details of the organic TFT of the present invention are hereunder described.

(Basic Device Configuration)

The device configuration of the organic TFT of the present invention is not limited so far as it is a TFT in which at least three terminals of agate electrode, a source electrode and a drain electrode, an insulator layer and an organic semiconductor layer are provided on a substrate, and a channel control layer is inserted between the foregoing organic semiconductor layer and the foregoing insulator layer, with a current between a source and a drain being controlled upon applying a voltage to the gate electrode. It may be one which is made based on a known device configuration. The present invention is characterized in that a channel control layer is inserted between this organic semiconductor layer and the foregoing insulator layer.

Device configurations A to D of the present invention are shown in FIGS. 2 to 5. It should not be construed that the device configuration of the organic TFT is limited to these A to D. As shown in the device configurations A to D, though there are known some known basic configurations depending upon the locations of electrodes, the lamination order of layers and so on, the organic TFT of the present invention has a field-effect transistor (FET) structure. The organic TFT has an organic semiconductor layer, an insulator layer, a source electrode and a drain electrode formed opposing to each other at a prescribed interval and a gate electrode formed at a prescribed distance from each of the source electrode and the drain electrode and controls a current flowing between the source and drain electrodes upon applying a voltage to the gate electrode. Here, the interval between the source electrode and the drain electrode is in general determined by an application and is usually from 0.1 μm to 1 mm, preferably from 1 μm to 100 μm, and more preferably from 5 μm to 100 μm.

Figure 4:
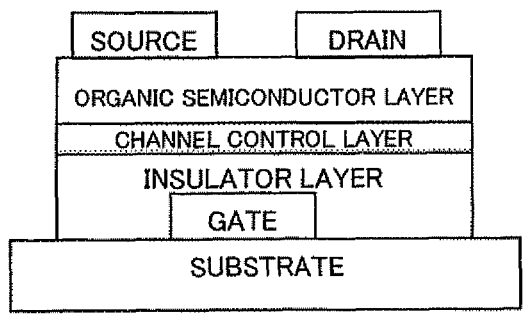
FIG. 4 is a view showing an embodiment of a device configuration of an organic TFT of the present invention.

Among the devices A to D, the device C shown in FIG. 4 is described as an example in more detail. The device C has a gate electrode, an insulator layer, a channel control layer and an organic semiconductor layer in this order on a substrate and has a pair of a source electrode and a drain electrode formed at a prescribed interval on the organic semiconductor layer. A current flowing between the source electrode and the drain electrode is controlled by a voltage to be applied to the gate electrode, thereby undergoing an ON/OFF operation.

(Function of Channel Control Layer)

The channel control layer has a function of reducing carrier traps at an interface with the organic semiconductor layer to be deposited thereon and enhancing the mobility. Also, the stability of TFT in the air is enhanced by the reduction of carrier traps.

(Physical Characteristics of Amorphous Organic Compound which the Channel Control Layer Includes)

The channel control layer includes an amorphous organic compound having an ionization potential (Ip) of less than 5.8 eV, preferably not more than 5.7 eV, and more preferably not more than 5.5 eV. When Ip of the amorphous organic compound which the channel control layer includes is 5.8 eV or more, since carrier traps are formed, the mobility is insufficient. Though a lower limit of Ip is not particularly limited, it is preferably 4.0 eV or more from the standpoint of easiness of availability of a material.

Furthermore, another important matter resides in a point that the foregoing amorphous organic compound is essentially amorphous. When the compound is amorphous, in general, a channel region of an interface with the organic semiconductor layer to be constituted of a single crystal or a polycrystalline substance becomes smooth, whereby the mobility of a carrier is enhanced. Also, a point that a pinhole or a defective portion is hardly formed contributes to an enhancement of the mobility of a carrier. The channel control layer is not required to be completely amorphized, but a crystallized portion may be included so far as the effects of the present invention are impaired.

When an amorphous organic compound which meets the requirements regarding the foregoing ionization potential and glass transition temperature is used for the channel control layer, a channel control layer made of an amorphous material can be formed. According to the formation of this layer, traps of the carrier transferring within the channel region are reduced, thereby enabling one to contrive to enhance the mobility. Thus, this layer was named as "channel control layer".

In a first organic TFT of the present invention, an amorphous organic compound having a glass transition temperature of 100° C. or higher is used. Since there may be a possibility that portable electronic devices are placed in a high-temperature atmosphere of 100° C. or higher, high-temperature storage stability as described later is required. For that reason, it has been found that when a material having a glass transition temperature of 100° C. or higher is used for the channel control layer, high-temperature storage at 100° C. which is essential for electronic devices for a portable application becomes possible. According to this, it is possible to suppress a lowering of the performance in a high-temperature atmosphere.

On the contrary, in a second organic TFT of the present invention, an amorphous organic compound having a molecular weight of 1,000 or more is used. For example, since there may be a possibility that portable electronic devices are placed in a high-temperature atmosphere of 100° C. or higher, high-temperature storage stability as described later is required. For that reason, when an amorphous organic compound having a molecular weight of 1,000 or more is used for the channel control layer, high-temperature storage at 100° C. which is essential for electronic devices for a portable application becomes possible. According to this, it is possible to suppress a lowering of the performance in a high-temperature atmosphere. Also, when the channel control layer is formed using an amorphous organic compound having a molecular weight of 1,000 or more, resistance to an organic solvent is revealed, and therefore, it becomes possible to laminate the organic semiconductor layer or the insulator layer thereon by means of coating. Even when a coating method from a solution is adopted, the channel control layer is not completely dissolved by the solvent, and an effect for enhancing the mobility of the channel control layer is not impaired. In this way, the molecular weight significantly contributes to the stability of the film. The molecular weight of the foregoing amorphous organic compound is more preferably 10,000 or more, and especially preferably 100,000 or more. Also, though its upper limit is not particularly limited, it is usually not more than 10,000,000.

(Specific Examples of Amorphous Compound)

The amorphous compound is not particularly limited so far as it meets the foregoing physical characteristics. Specifically, amorphous organic compounds as enumerated below can be preferably exemplified. When such an amorphous organic compound is used for the channel control layer, a large mobility and excellent stability under a high-temperature condition are obtained. In that case, a crystalline compound may be blended so far as the effects of the present invention are not impaired.

(Amorphous Compound to be Used for the First Organic TFT)

Preferred examples of the amorphous compound which is used for the channel control layer in the first organic TFT of the present invention are enumerated below, but it should not be construed that the present invention is limited thereto.

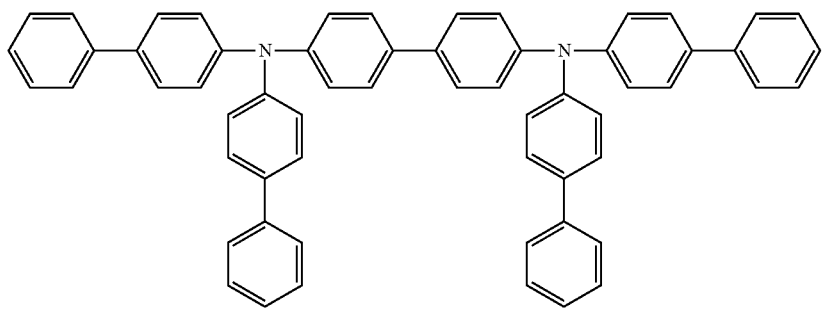

(1)

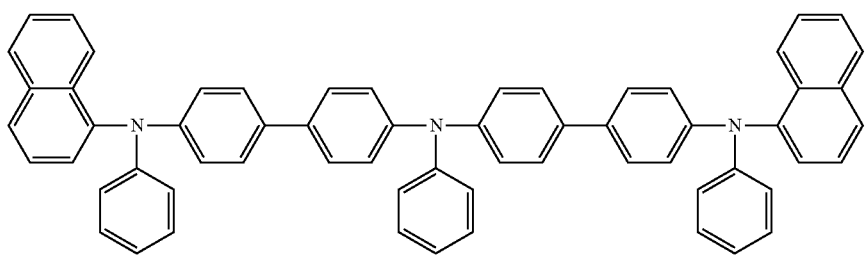

(2)

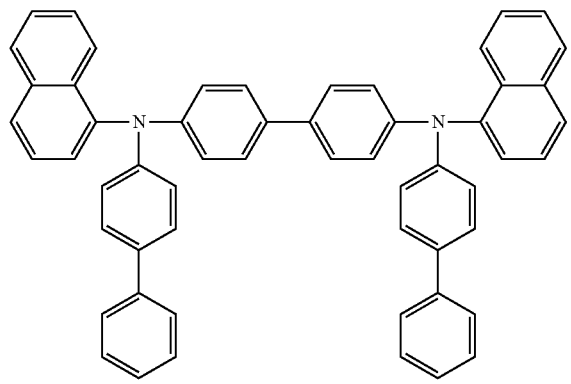
(3)
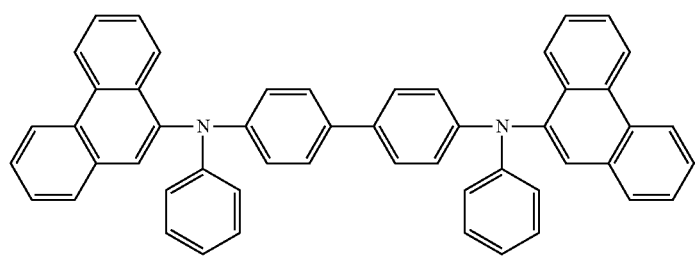
(4)
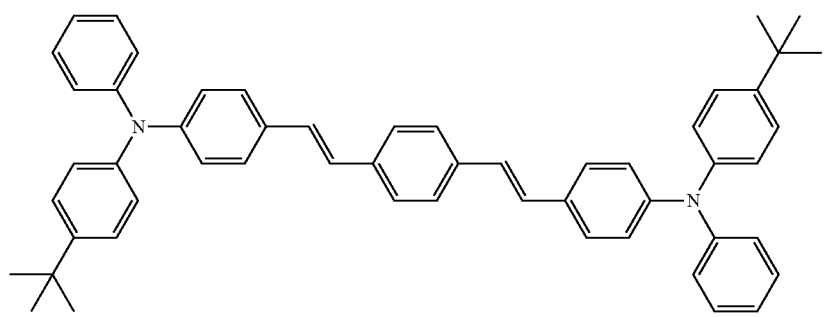
(5)
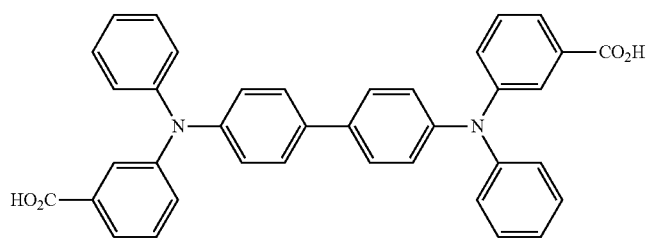
(6)

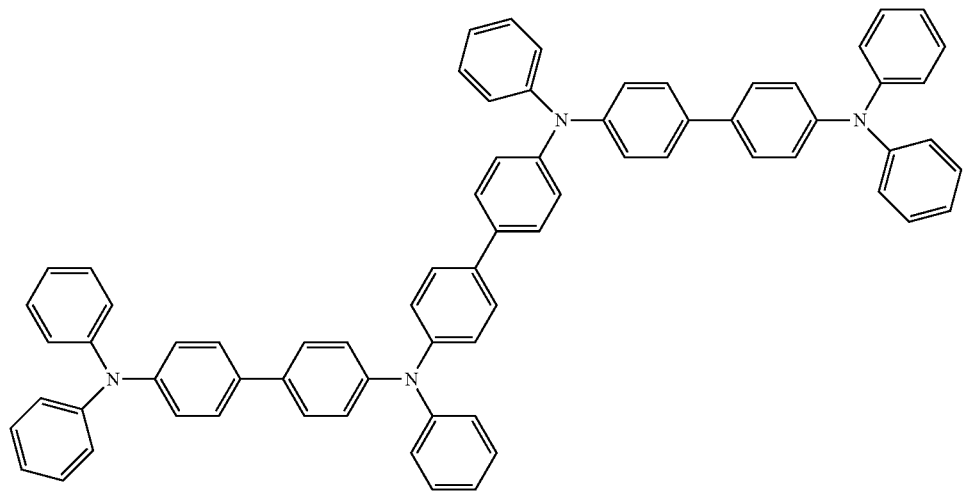
(7)
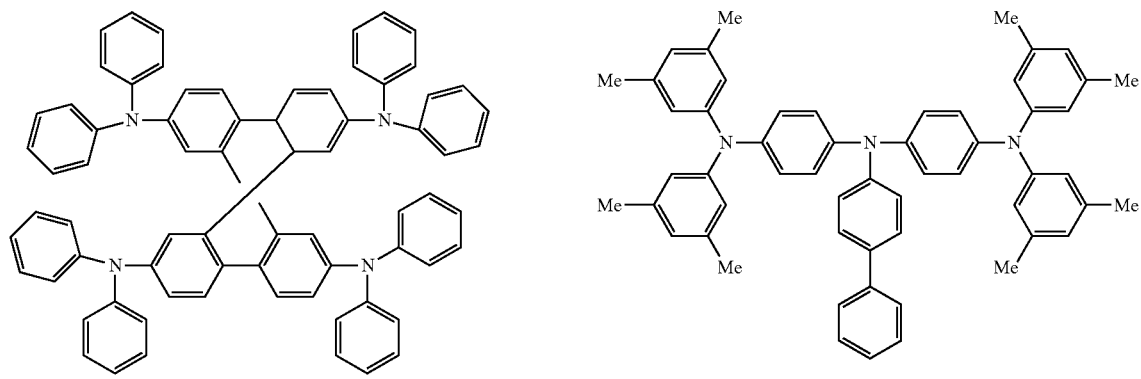
(8) (9)
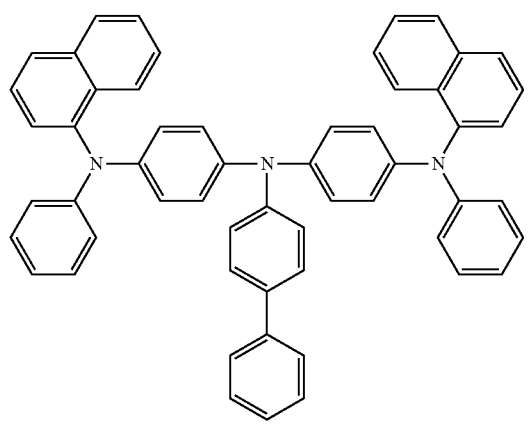
(10)

(11)
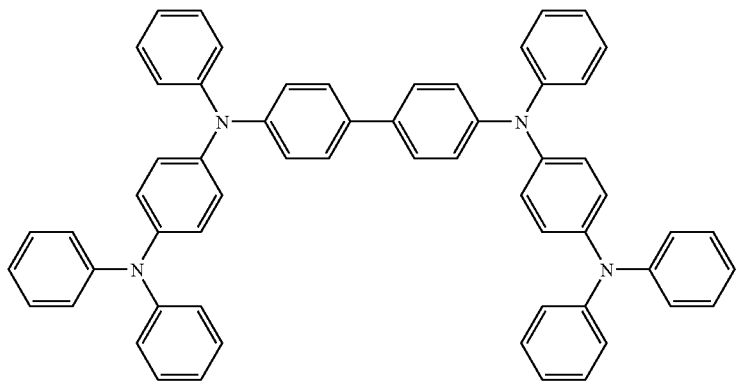
(12)
(13)
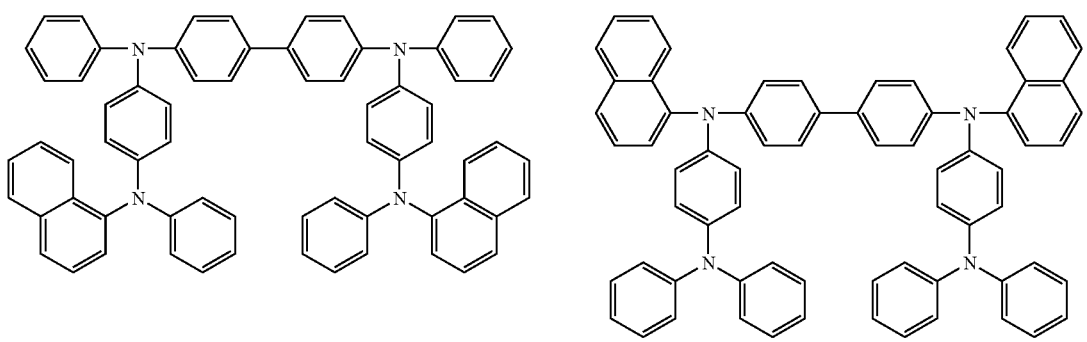
(14)
(15)
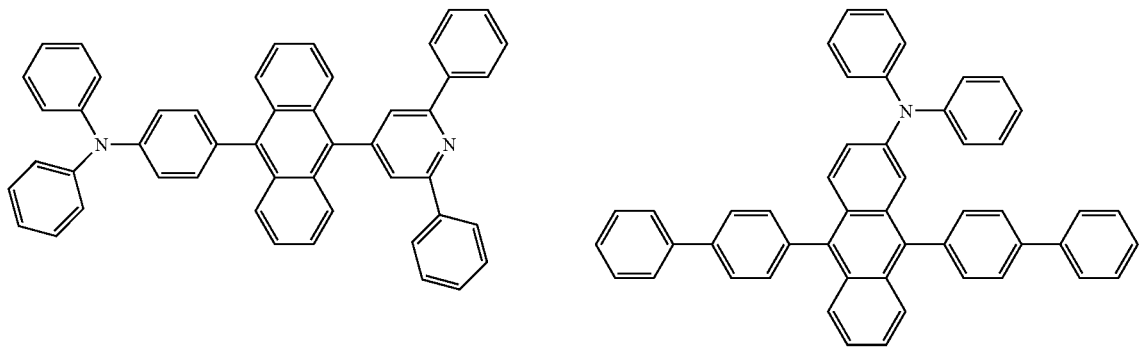
(16)
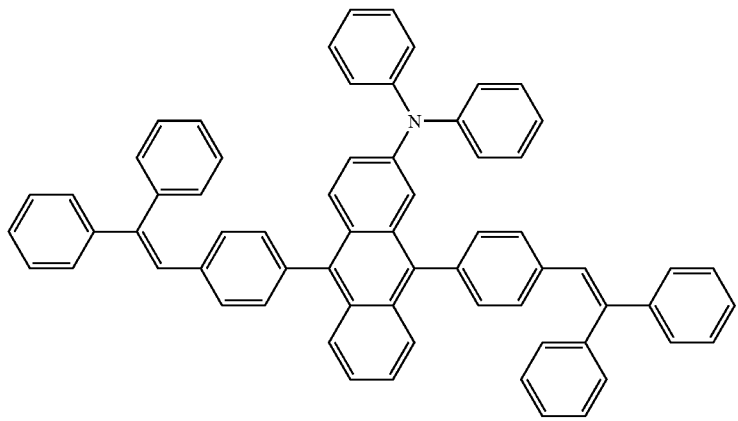

(17)
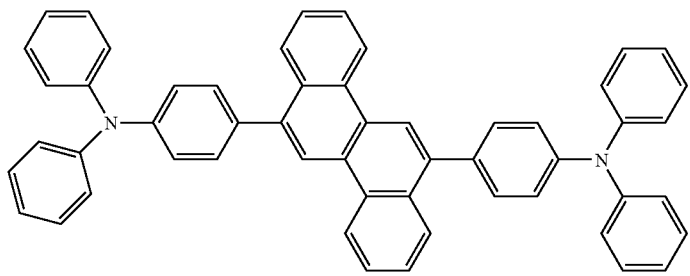
(18)
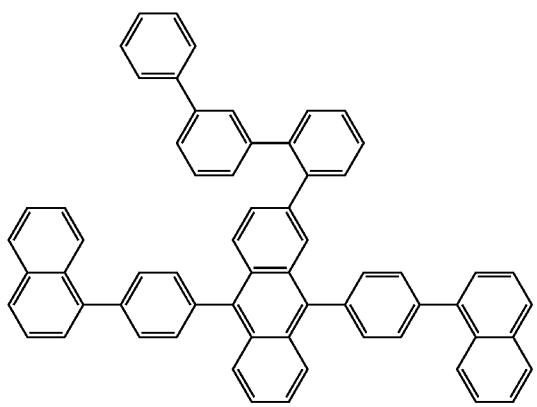
(19)
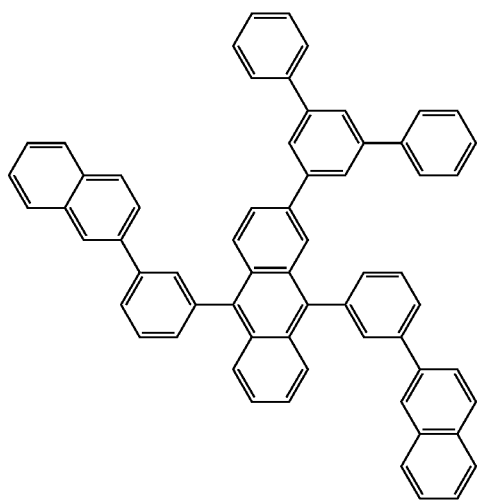
(20)
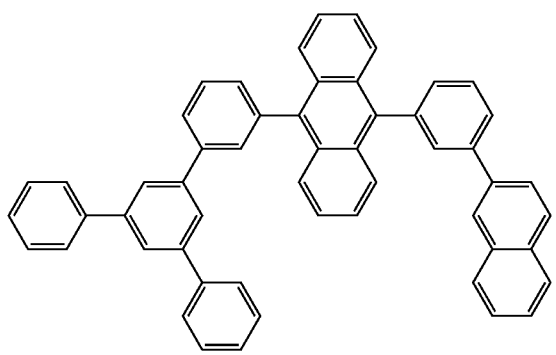
(21)
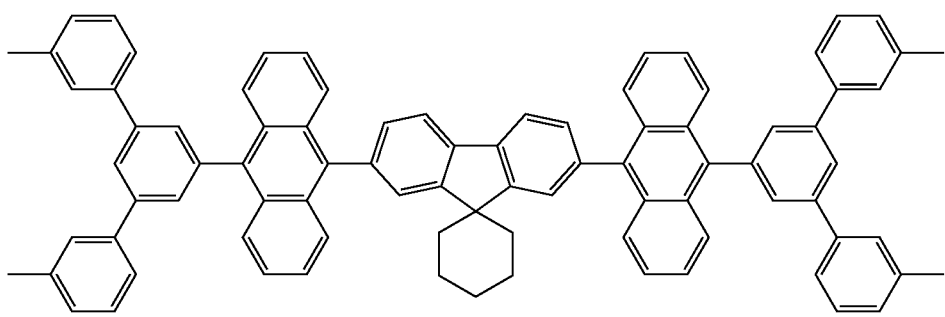

-continued
(22)
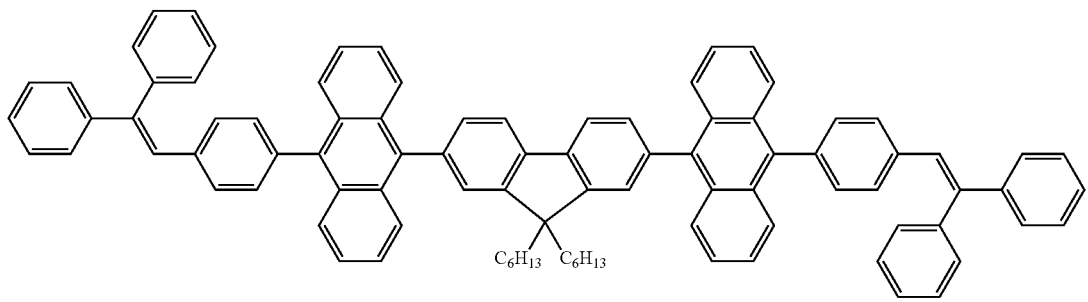
(23)
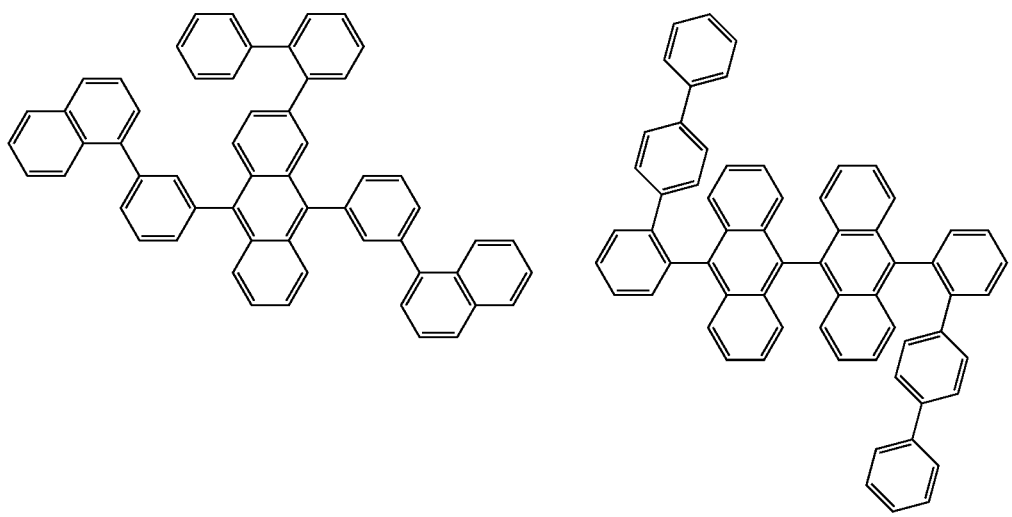
(24)
(25)
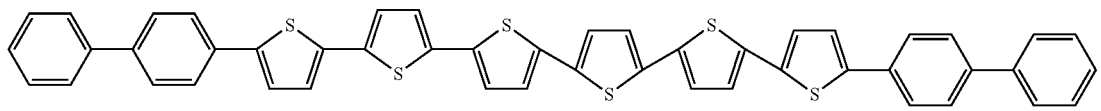
(26)
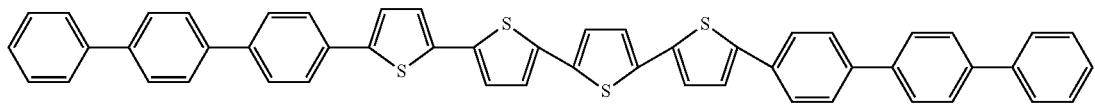
(27)
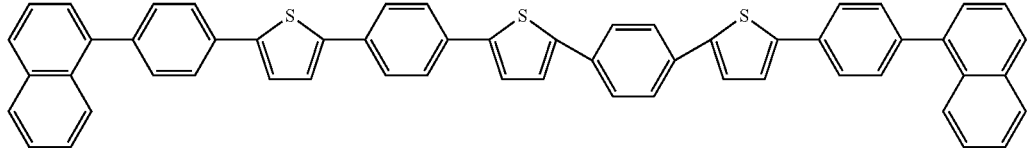
(28)
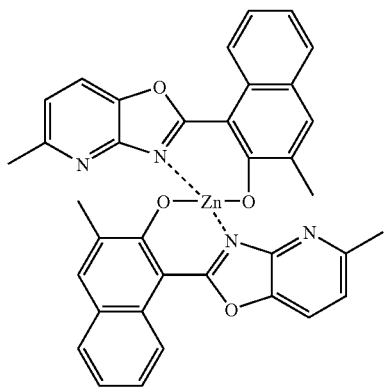

The above-enumerated compounds are classified into the following four types.

(1) Amino Group-Containing Organic Compound:

For the purpose of attaining an ionization potential (Ip) of not more than 5.8 eV, an aromatic amine compound is preferable. In general, aromatic amine compounds are known as a compound having a small Ip and used as a hole transport material of an organic EL. Among aromatic amine compounds, compounds in which an aromatic group thereof has a residue of a condensed aromatic compound such as naphthalene, anthracene, phenanthrene, and chrysene, or a residue of biphenyl or has a spiro bond are preferable because a high Tg is obtained.

(2) Condensed Aromatic Hydrocarbon Compound:

Examples of a condensed aromatic group include residues of naphthalene, anthracene, etc. Also, condensed aromatic hydrocarbon compounds having a residue of biphenyl or terphenyl or a spiro bond are preferably exemplified.

(3) Terminal-modified thiophene oligomer:

Though thiophene oligomers are representative, too as a compound having a small Ip, they are in general crystalline. Then, in order to make them amorphous, those in which a terminal thereof is substituted with an aromatic hydrocarbon group are preferable.

(4) Metal complex having a specified structure:

Metal complexes such as Compound (28) are exemplified.

(Amorphous Compound to be Used for the Second Organic TFT)

Preferred examples of the amorphous compound which is used for the channel control layer in the second organic TFT of the present invention are enumerated below, but it should not be construed that the present invention is limited thereto.

As the amorphous compound which is used for the channel control layer, an amino group-containing organic compound or a condensed aromatic ring-containing hydrocarbon compound is preferable. For the purpose of attaining not more than 5.8 eV, an aromatic amine compound is preferable as the amino group-containing organic compound. In general, aromatic amine compounds are known as a compound having a small ionization potential (Ip) and used as a hole transport material of an organic EL. Among aromatic amine compounds, compounds in which an aromatic group thereof has a residue of a condensed aromatic compound such as naphthalene, anthracene, phenanthrene, and chrysene, or a residue of biphenyl or has a spiro bond are preferable. Representative examples thereof are given below.

As the amorphous compound which is used in the second organic TFT of the present invention, those represented by the following general formula (A) can be used.

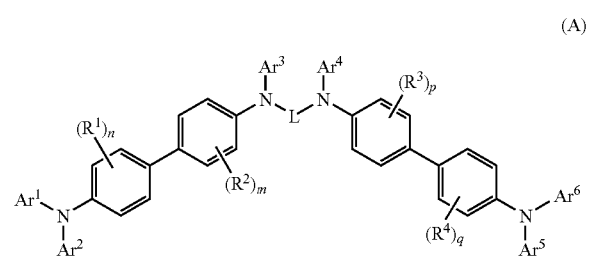

(A)

(In the formula, each of $Ar^1$ to $Ar^6$ independently represents a substituted or unsubstituted aryl group having from 6 to 40 ring carbon atoms forming a ring or a substituted or unsubstituted heteroaryl group having from 3 to 40 ring carbon atoms, and $Ar^1$ and $Ar^2$, and $Ar^5$ and $Ar^6$, may be each independently connected to each other via a single bond to form a carbazolyl group;

each of $R^1$ to $R^4$ independently represents a halogen atom, a carboxyl group, an amino group, a hydroxyl group, a substituted or unsubstituted alkyl group having from 1 to 40 carbon atoms, a substituted or unsubstituted alkenyl group having from 2 to 40 carbon atoms, a substituted or unsubstituted alkynyl group having from 2 to 40 carbon atoms or a substituted or unsubstituted alkoxy group having from 1 to 40 carbon atoms;

each of n, m, p and q represents an integer of from 0 to 4; and

L represents a divalent connecting group represented by the following general formula (B) or (C).)

(B)

(In the formula, each of $Ar_7$ to $Ar_9$ independently represents a substituted or unsubstituted divalent aryl group having from 6 to 40 ring carbon atoms or a substituted or unsubstituted divalent heteroaryl group having from 3 to 40 ring carbon atoms; and each of a, b and c independently represents an integer of from 1 to 3.)

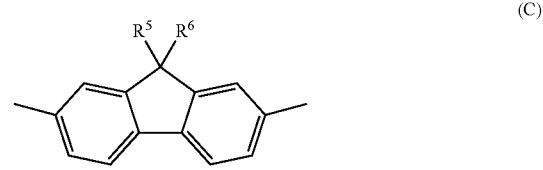
(C)

(In the formula, each of $R^5$ and $R^6$ independently represents a halogen atom, a carboxyl group, an amino group, a hydroxyl group, a substituted or unsubstituted alkyl group having from 1 to 40 carbon atoms, a substituted or unsubstituted alkenyl group having from 2 to 40 carbon atoms, a substituted or unsubstituted alkynyl group having from 2 to 40 carbon atoms or a substituted or unsubstituted alkoxy group having from 1 to 40 carbon atoms, and $R^5$ and $R^6$ may be connected to each other to form a cyclic structure.)

In the foregoing general formula (A), specific examples of the aryl group having from 6 to 40 ring carbon atoms include those having, as a substituent, benzene, naphthalene, anthracene, tetracene, pentacene, phenanthrene, chrysene, triphenylene, corannulene, coronene, hexabenzotriphenylene, hexabenzocoronene, sumanene, etc. Also, specific examples of the heteroaryl group having from 3 to 40 ring carbon atoms include pyridine, pyrazine, quinoline, naphthylidine, quinoxaline, phenazine, diazaanthracene, pyridoquinoline, pyrimidoquinazoline, pyrazinoquinoxaline, phenanthroline, carbazole, 6,12-dihydro-6,12-diazaindenofluorene, dibenzothiophene, dithiaindacene, dithiaindenoindene, thienothiophene, dithienothiophene, dibenzofuran, benzodifuran, dibenzoselenophene, diselenaindacene, diselenaindenoindene, dibenzosilole, etc.

Examples of the foregoing halogen atom include fluorine, chlorine, bromine and iodine atoms.

Specific examples of the foregoing alkyl group having from 1 to 40 carbon atoms include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, etc.

The foregoing alkenyl group having from 2 to 40 carbon atoms includes both linear and branched alkenyl groups, and those having from 2 to 15 carbon atoms are preferable.

The foregoing alkynyl group having from 2 to 40 carbon atoms includes both linear and branched alkynyl groups, and those having from 2 to 15 carbon atoms are preferable.

The foregoing alkoxyl group is a group represented by —$OX^1$, and specific examples of $X^1$ are the same as those described for the foregoing alkyl group.

Specific examples of the foregoing cyclic structure include cycloalkanes having from 4 to 12 carbon atoms, such as cyclobutane, cyclopentane, cyclohexane, adamantane, and norbornane; cycloalkenes having from 4 to 12 carbon atoms, such as cyclobutene, cyclopentene, cyclohexene, cycloheptene, and cyclooctene; cycloalkadienes having from 6 to 12 carbon atoms, such as cyclohexadiene, cycloheptadiene, and cyclooctadiene; aromatic rings having from 6 to 50 carbon atoms, such as benzene, naphthalene, phenanthrene, anthracene, pyrene, chrysene, and acenaphthylene; and heterocyclic rings such as pyrrolidine, and piperidine.

Specific examples of the amorphous organic compound represented by the foregoing general formula (A) include the following compounds.

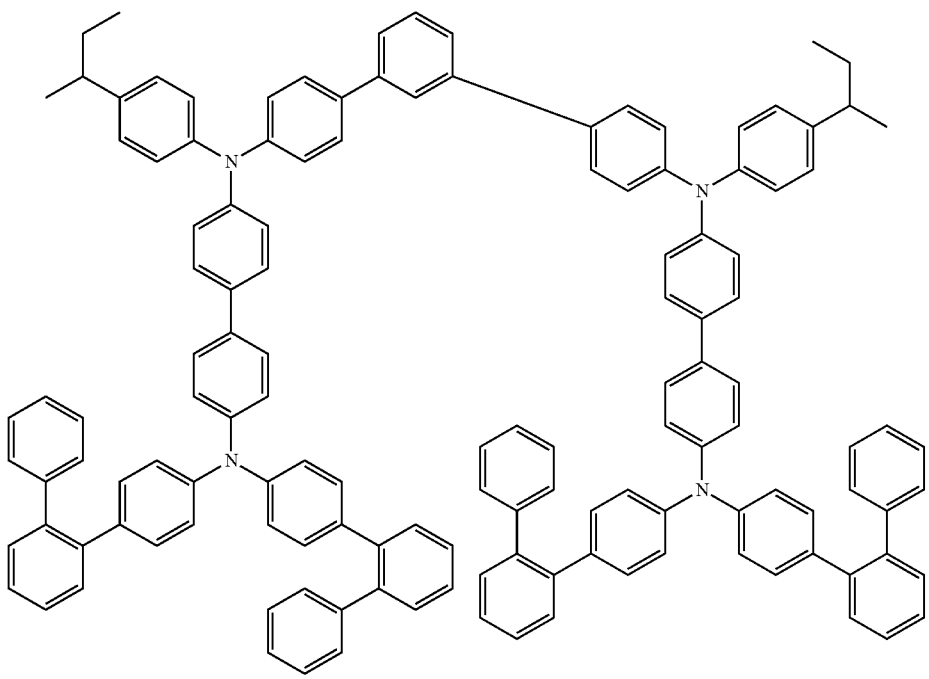

21
22
-continued
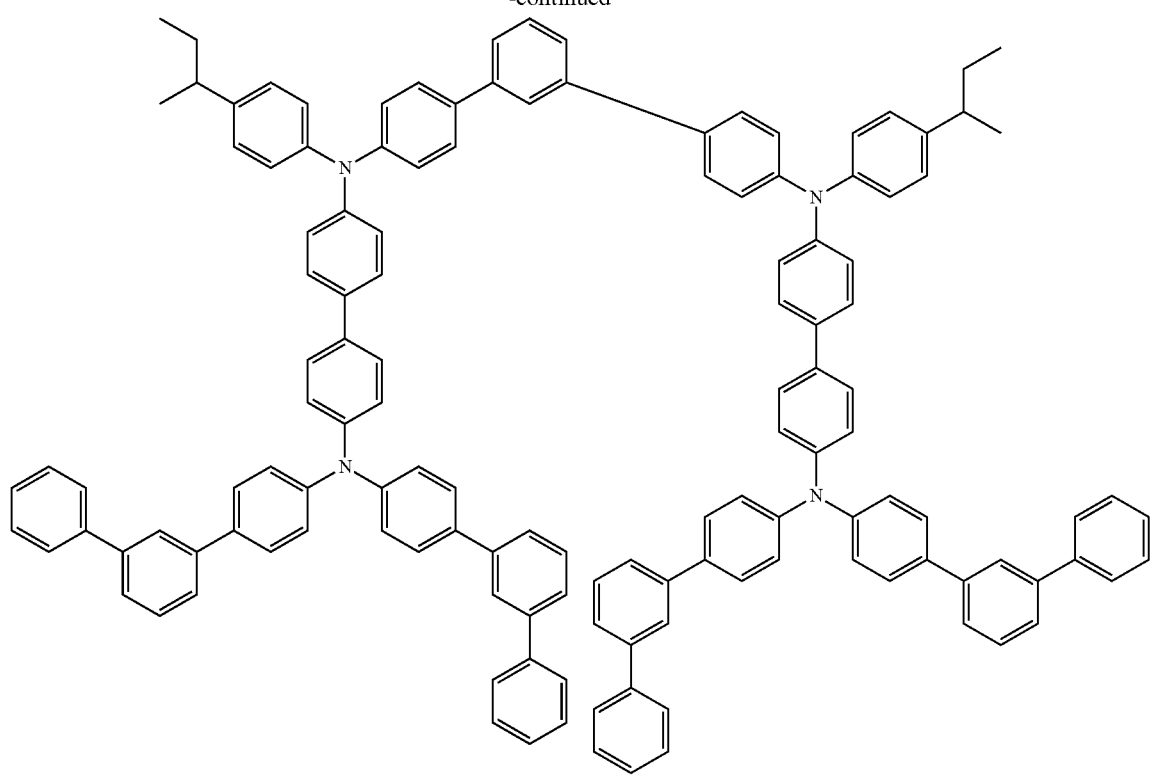
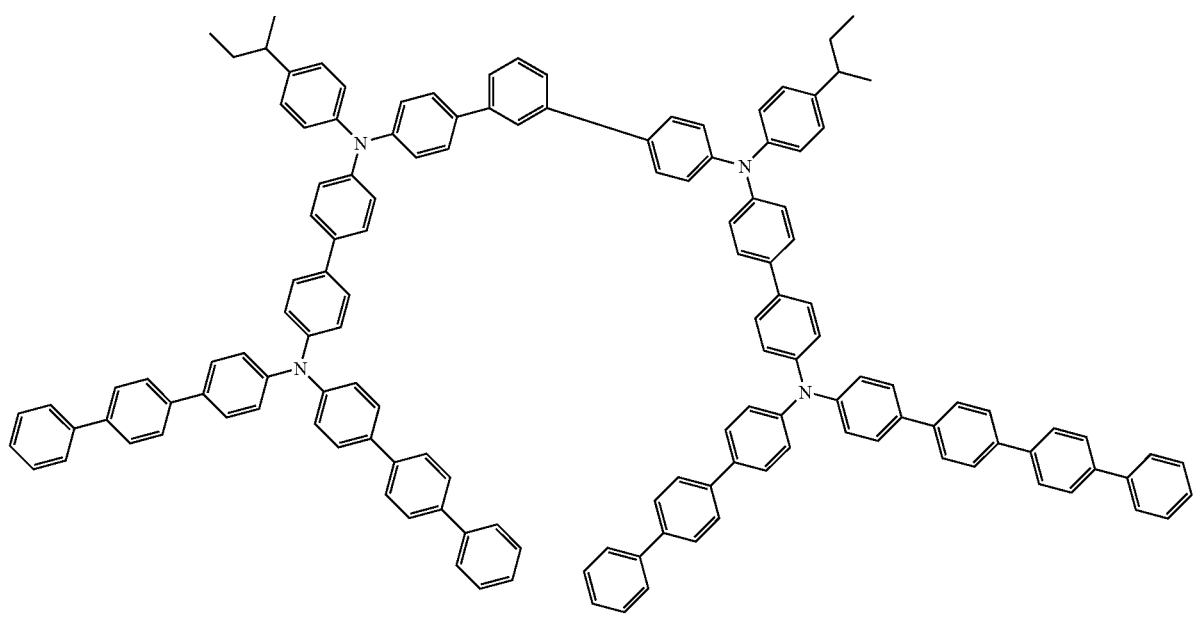

-continued
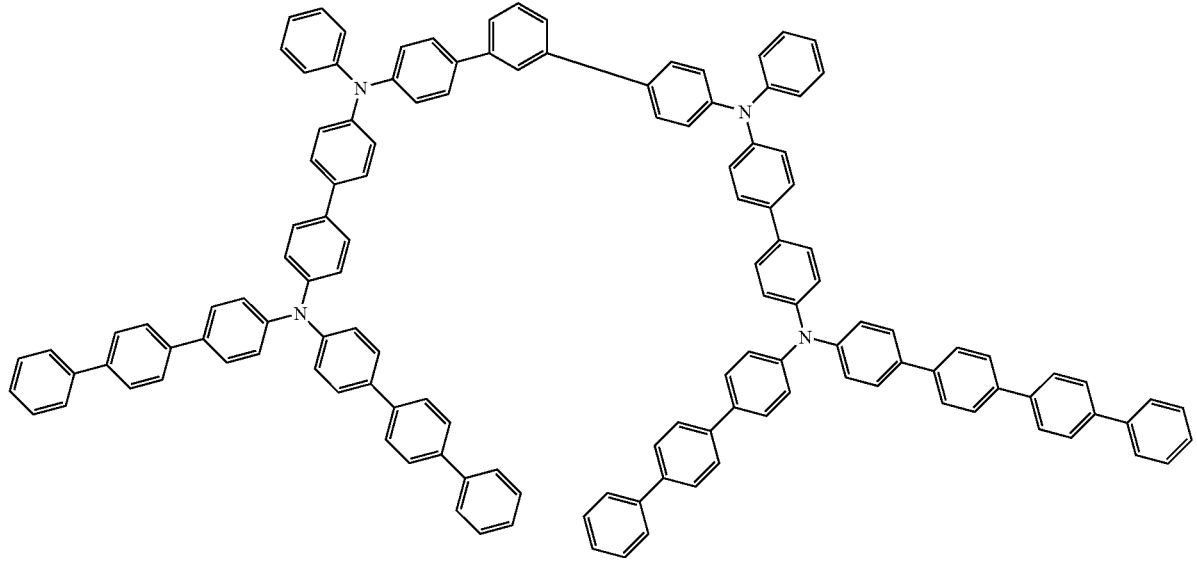
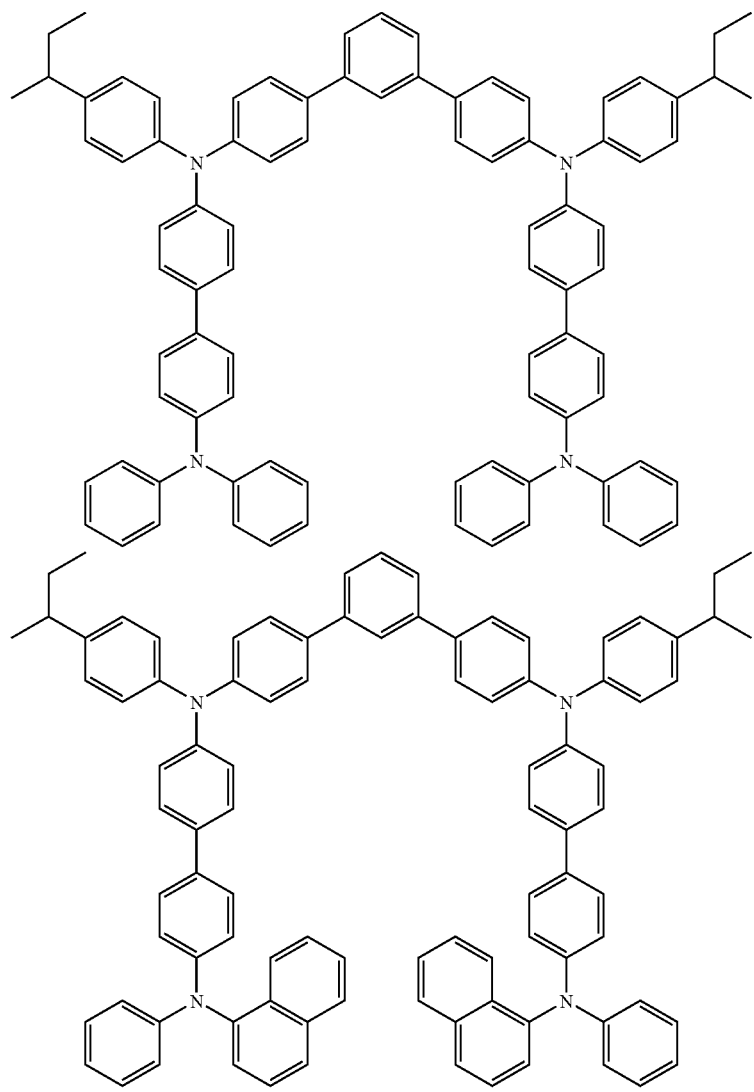

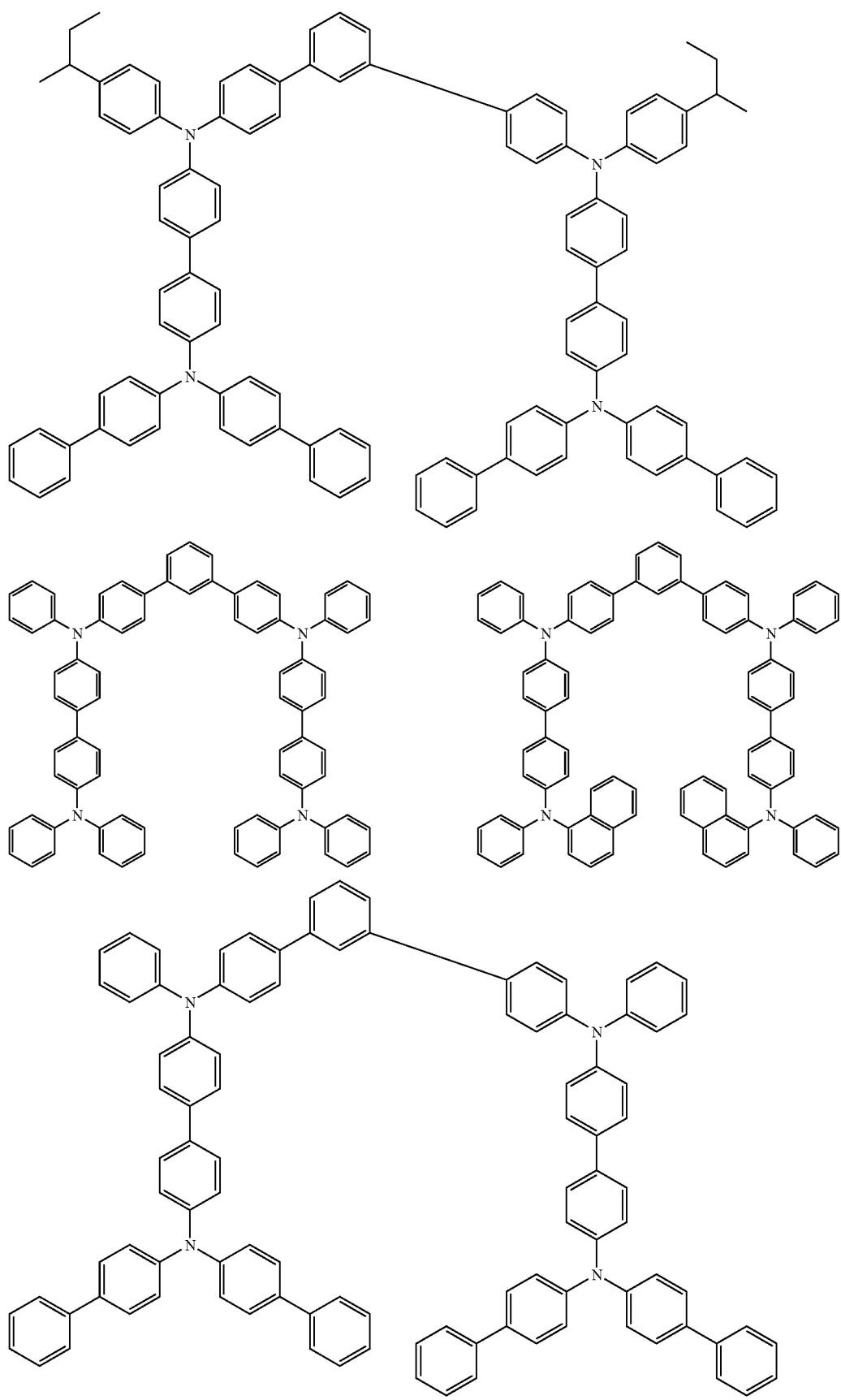

-continued
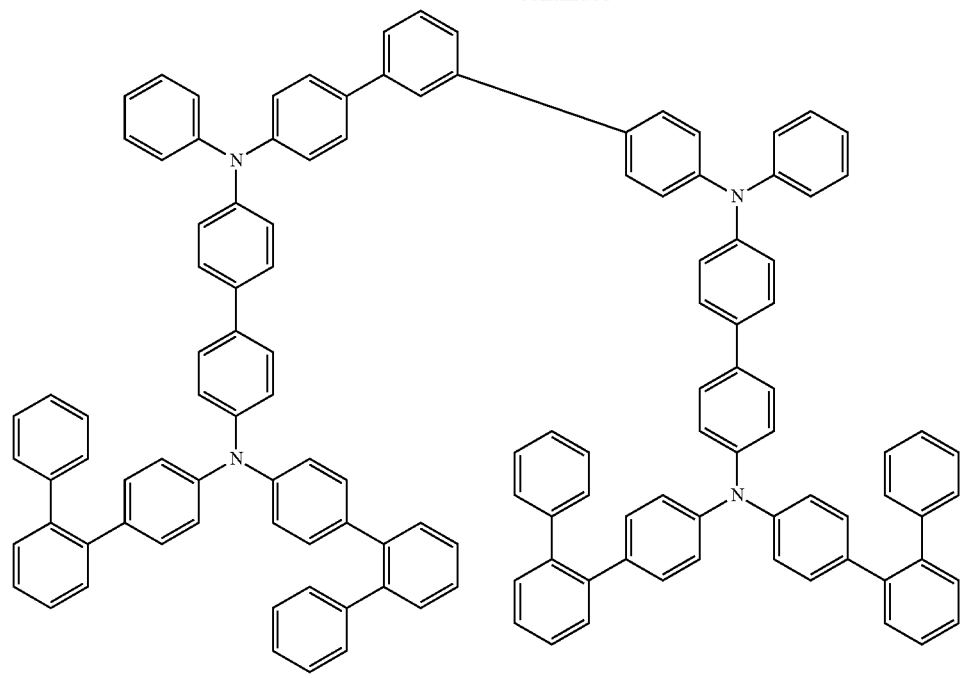
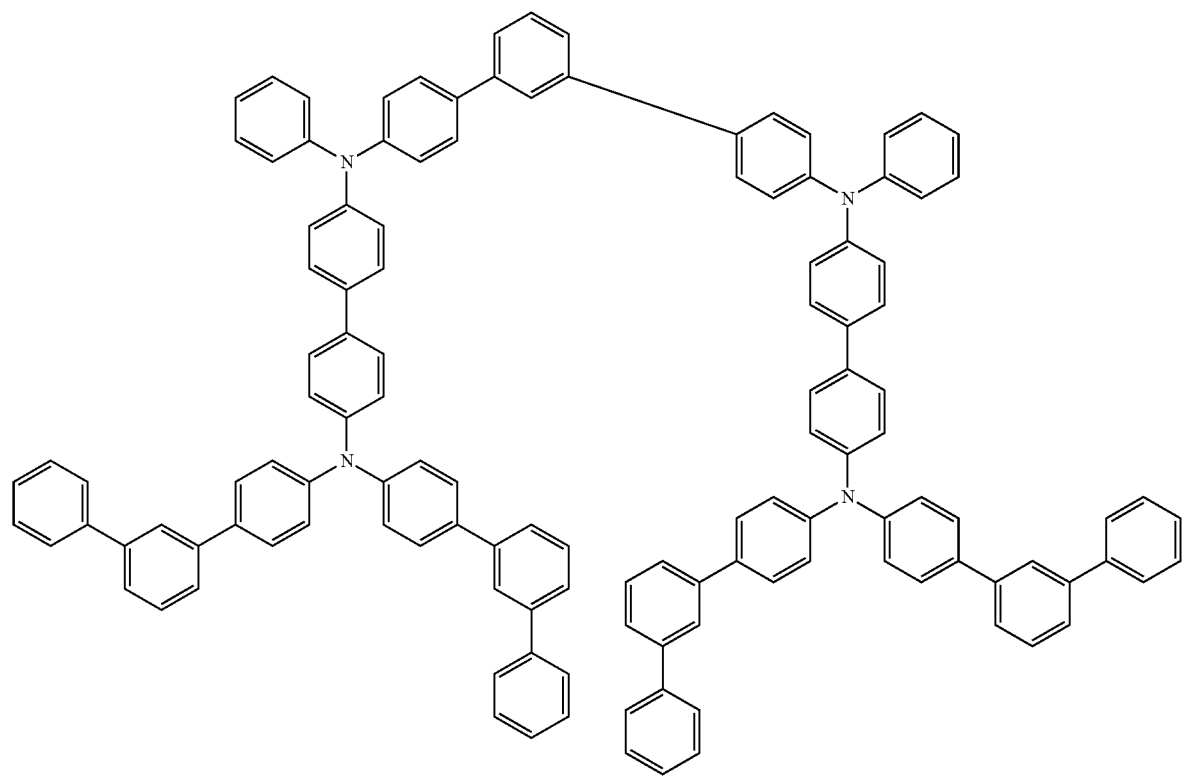

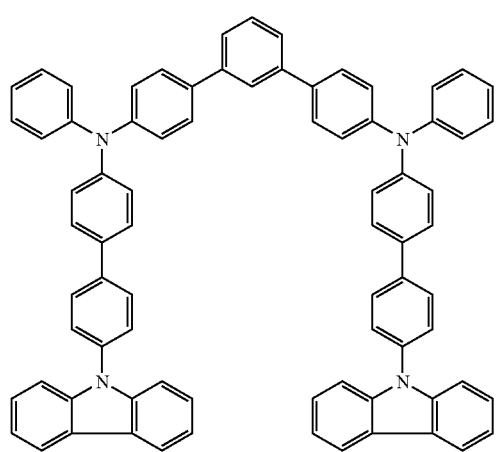
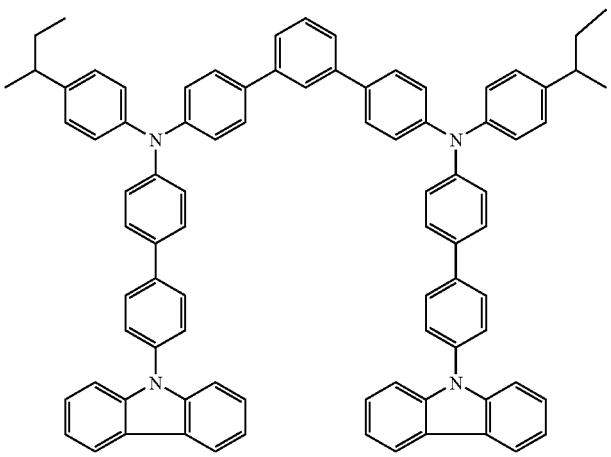
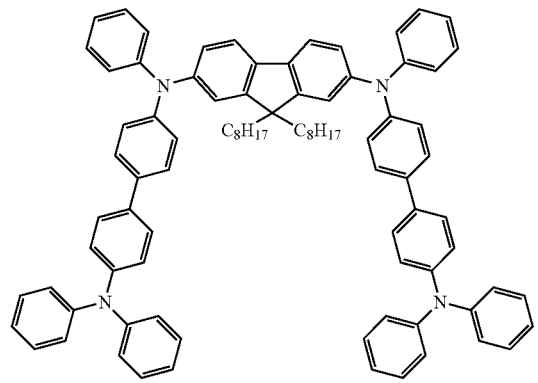
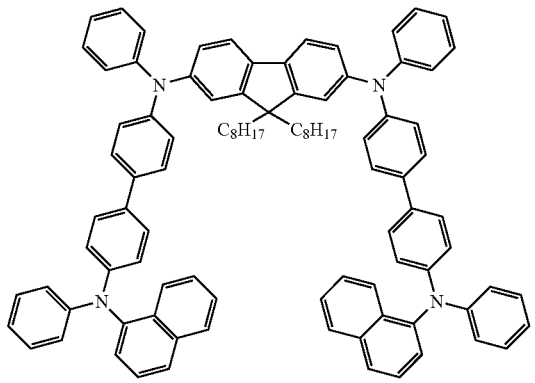
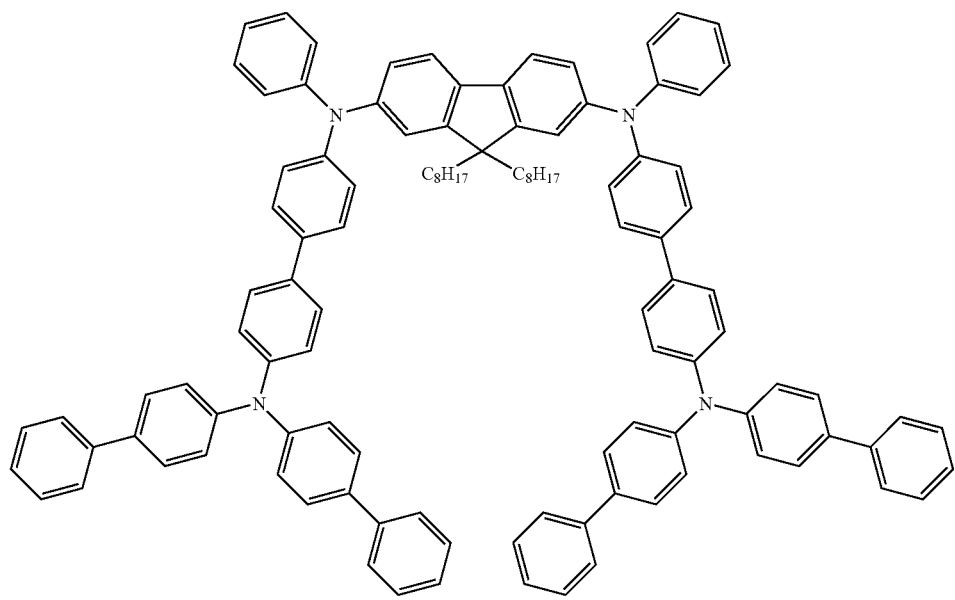

-continued
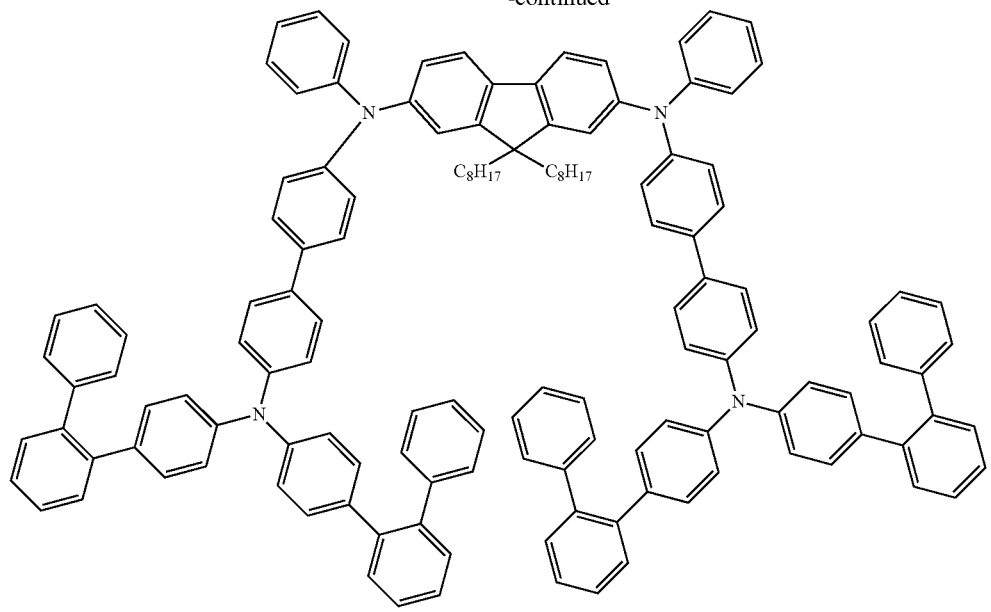
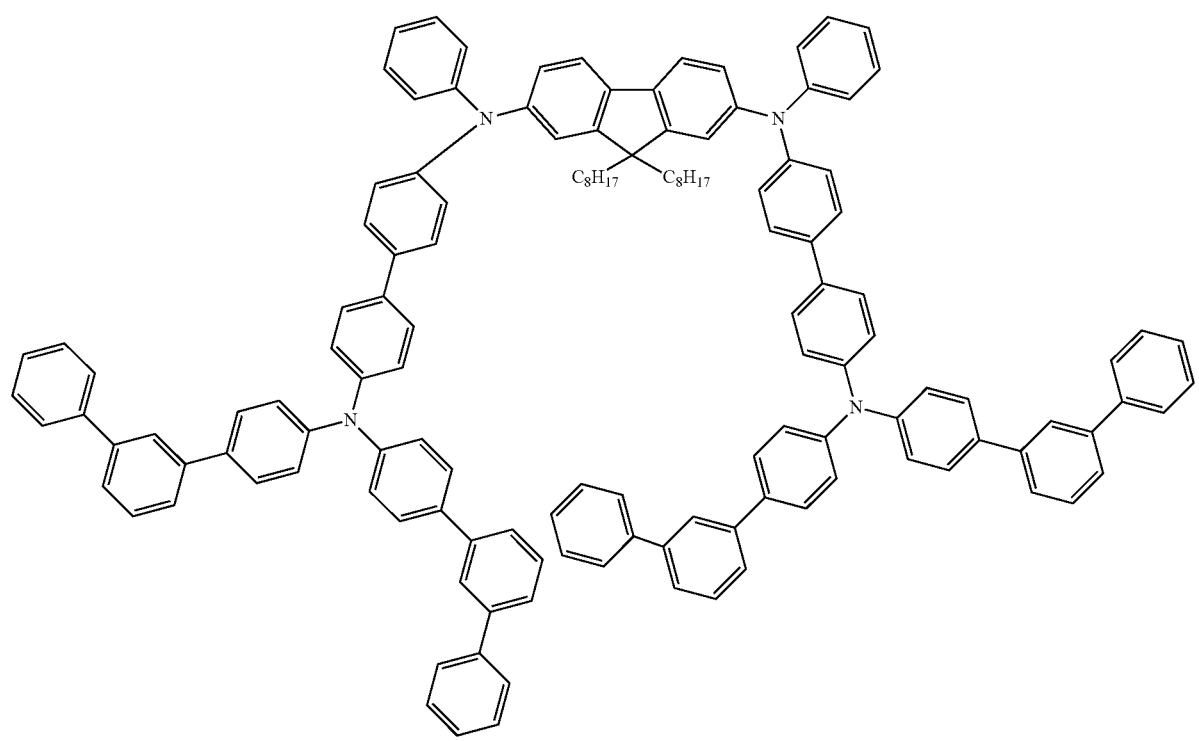

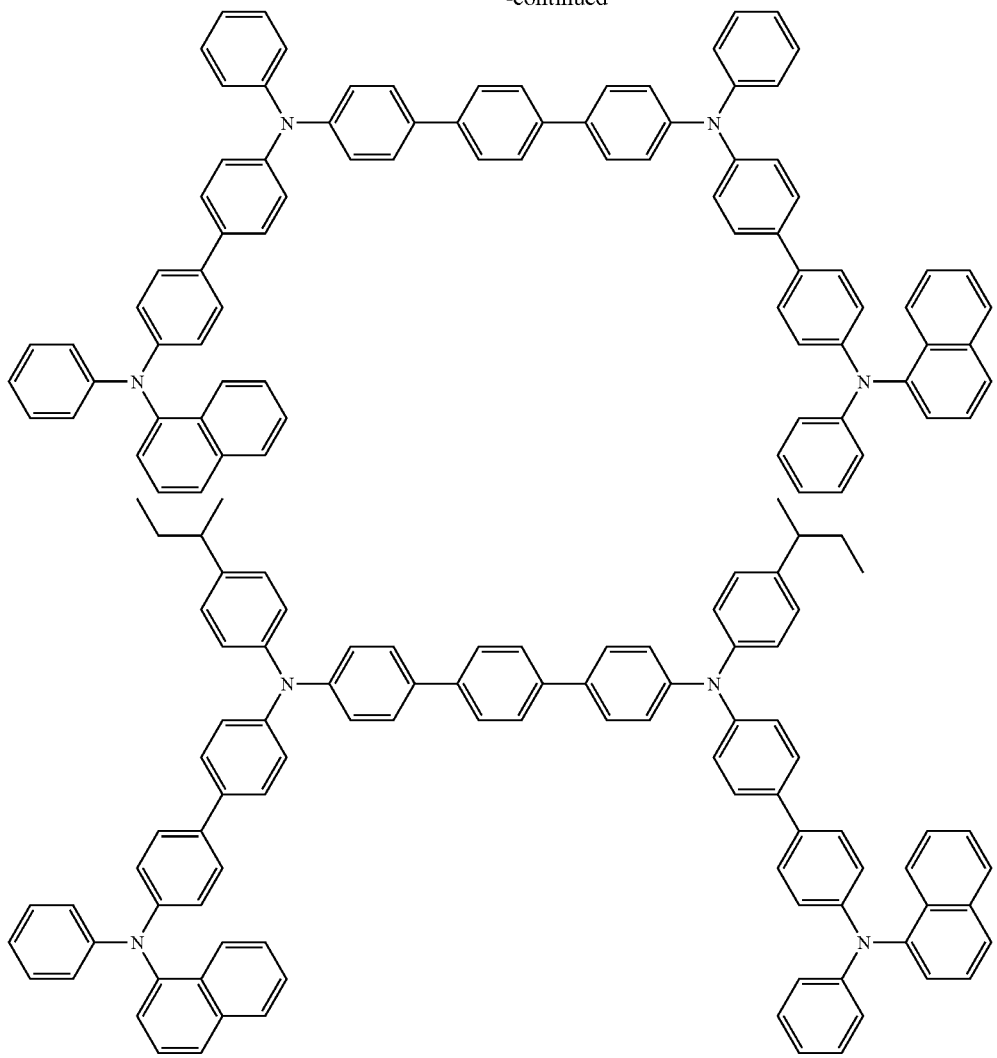
The amorphous organic compound which is used in the second organic TFT of the present invention is not limited to those represented by the foregoing general formula (A). It may be an amino group-containing oligomer having a molecular weight of 1,000 or more, and examples thereof include the following compounds.
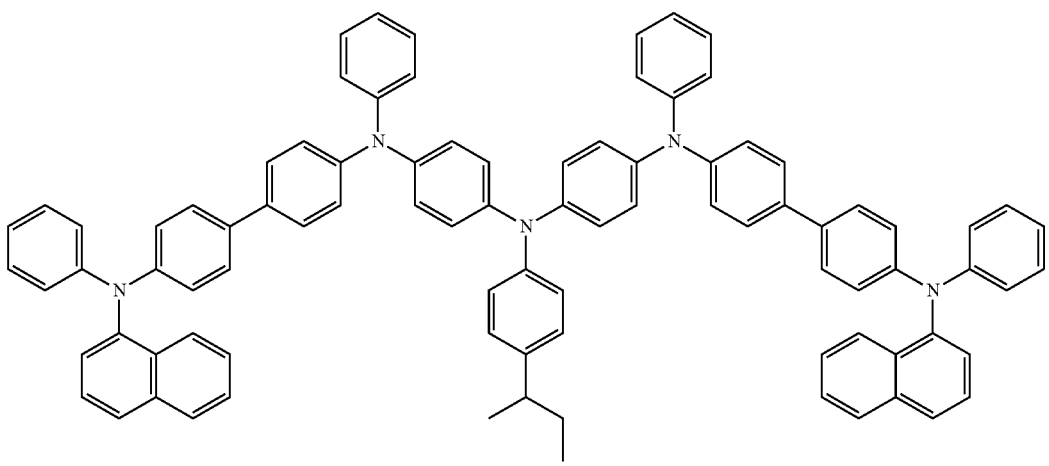

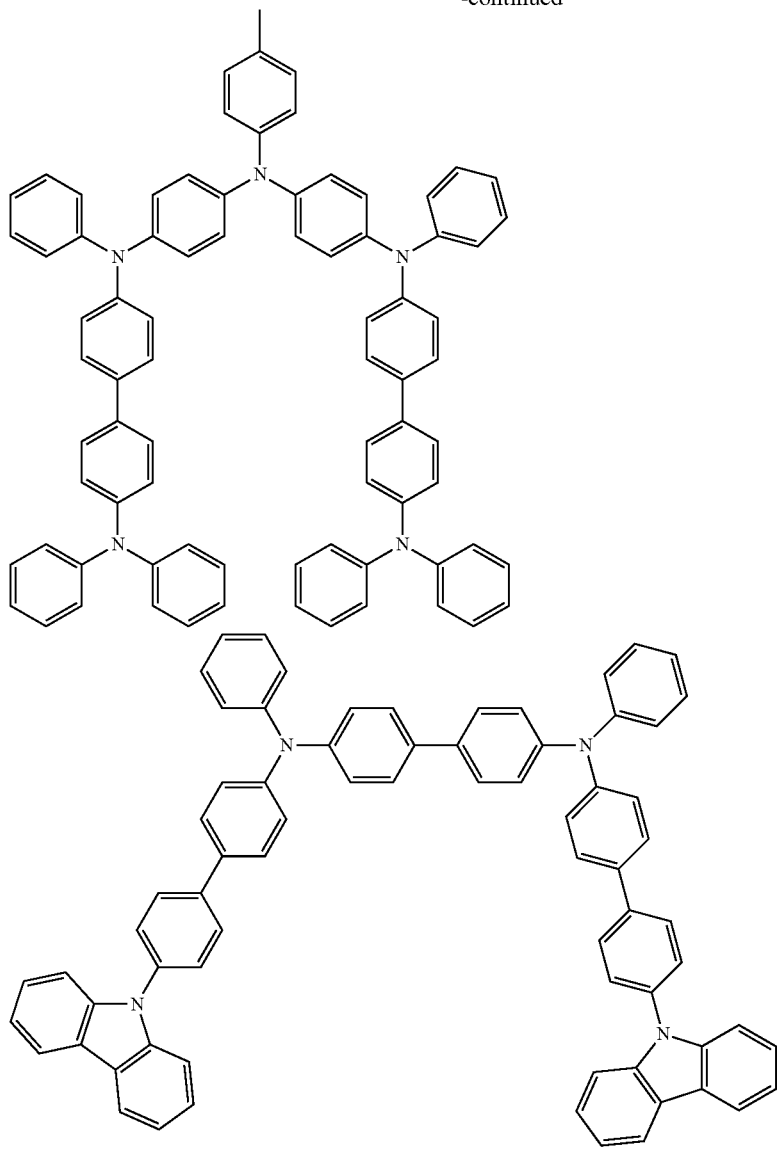

Also, the foregoing amorphous organic compound may be an amino group-containing polymer compound having a repeating unit represented by the following general formula (D) or (E).

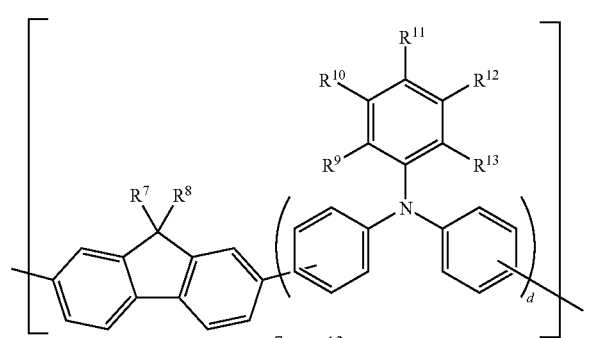

(In the formula, each of $R^7$ to $R^{13}$ independently represents a hydrogen atom, a halogen atom, an alkyl group having from 1 to 20 carbon atoms, an alkenyl group having from 1 to 20 carbon atoms, an alkynyl group having from 1 to 20 carbon atoms, a haloalkyl group having from 1 to 20 carbon atoms, an alkoxyl group having from 1 to 30 carbon atoms or a group having a carbonyl group having from 1 to 20 carbon atoms, and adjacent groups in $R^9$ to $R^{13}$ may form a saturated or unsaturated cyclic structure each other; and d is 1 or 2.)

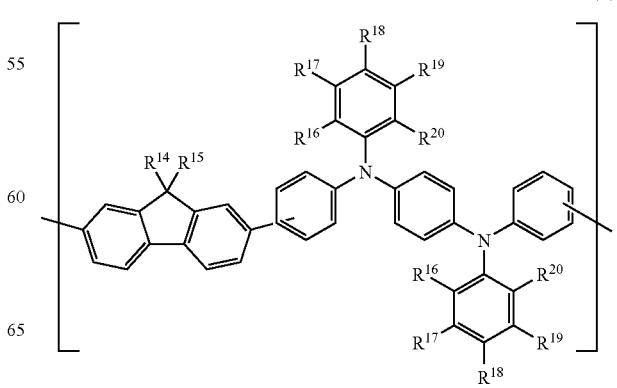

(In the formula, each of $R^{14}$ to $R^{20}$ independently represents a hydrogen atom, a halogen atom, an alkyl group having from 1 to 20 carbon atoms, an alkenyl group having from 1 to 20 carbon atoms, an alkynyl group having from 1 to 20 carbon atoms, a haloalkyl group having from 1 to 20 carbon atoms, an alkoxyl group having from 1 to 30 carbon atoms or a group having a carbonyl group having from 1 to 20 carbon atoms, and adjacent groups in $R^{16}$ to $R^{20}$ may form a saturated or unsaturated cyclic structure each other.)

In the foregoing general formulae (D) and (E), examples of the halogen atom include fluorine, chlorine, bromine and iodine atoms.

Specific examples of the foregoing alkyl group having from 1 to 20 carbon atoms include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, etc.

The foregoing alkenyl group having from 1 to 20 carbon atoms includes both linear and branched alkenyl groups, and those having from 2 to 15 carbon atoms are preferable.

The foregoing alkynyl group having from 1 to 20 carbon atoms includes both linear and branched alkynyl groups, and those having from 2 to 15 carbon atoms are preferable.

Examples of the foregoing haloalkyl group having from to 20 carbon atoms include a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, a fluoromethyl group, a a 1-fluoroethyl group, a 2-fluoroethyl group a 2-fluoroisobutyl group, a 1,2-difluoroethyl group, a difluoromethyl group, a trifluoromethyl group, a pentafluoroethyl group, a perfluoroisopropyl group, a perfluorobutyl group, a perfluorocyclohexyl group, etc.

The foregoing alkoxyl group having from 1 to 30 carbon atoms is a group represented by $-OX^1$, and specific examples of $X^1$ are the same as those described for the foregoing alkyl group.

Specific examples of the foregoing group having a carbonyl group having from 1 to 20 carbon atoms include a formyl group, an acetyl group, a propanoyl group, a methoxycarbonyl group, etc.

Examples of the foregoing saturated or unsaturated cyclic structure include cycloalkanes having from 4 to 12 carbon atoms, such as cyclobutane, cyclopentane, cyclohexane, adamantane, and norbornane; cycloalkenes having from 4 to 12 carbon atoms, such as cyclobutene, cyclopentene, cyclohexene, cycloheptene, and cyclooctene; cycloalkadienes having from 6 to 12 carbon atoms, such as cyclohexadiene, cycloheptadiene, and cyclooctadiene; aromatic rings having from 6 to 50 carbon atoms, such as benzene, naphthalene, phenanthrene, anthracene, pyrene, chrysene, and acenaphthylene; and so on.

Specific examples of the repeating unit represented by the foregoing general formula (D) or (E) include the following units.

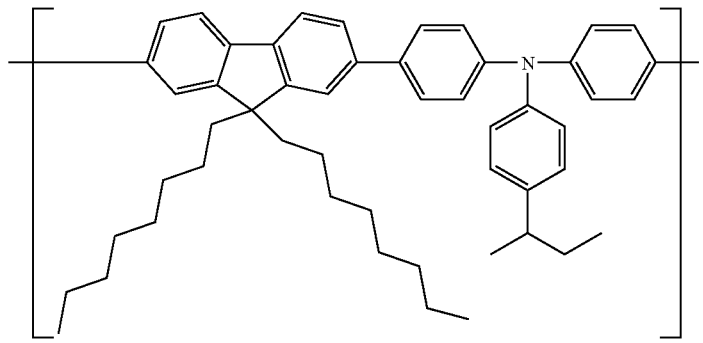

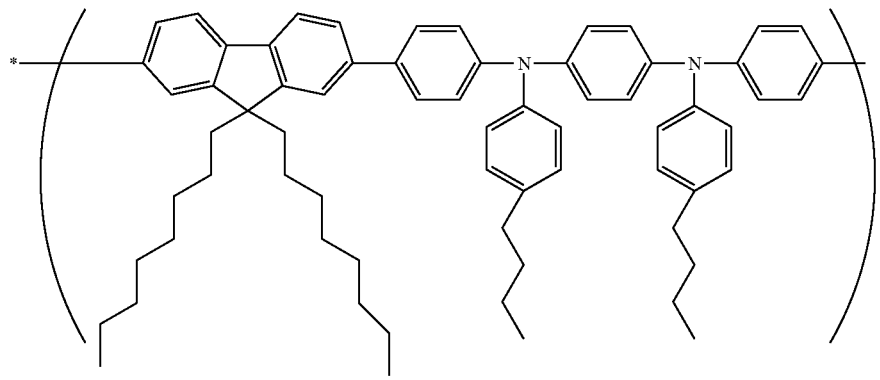

-continued
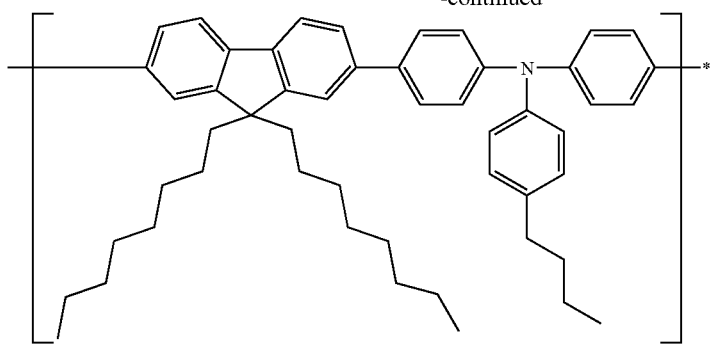
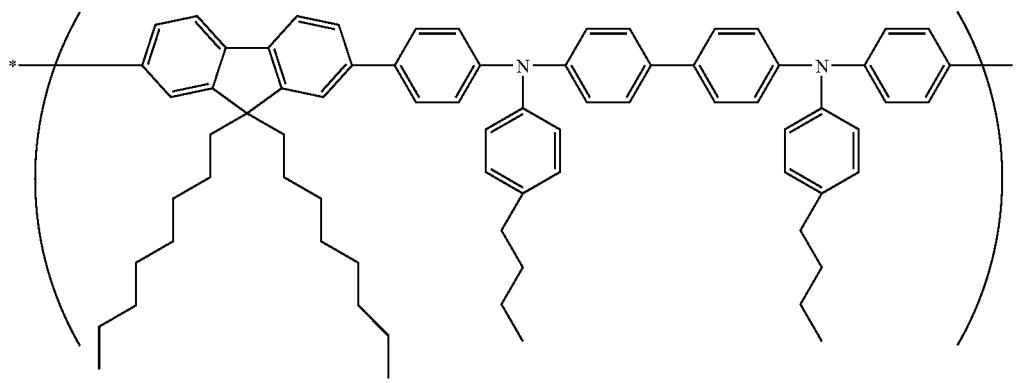
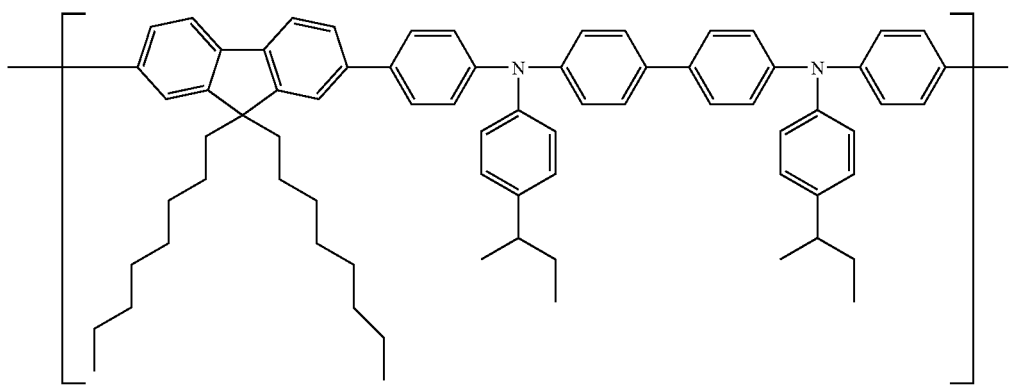
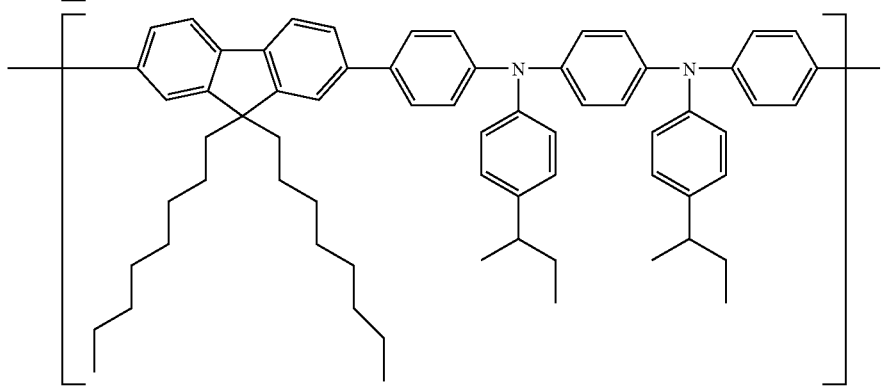

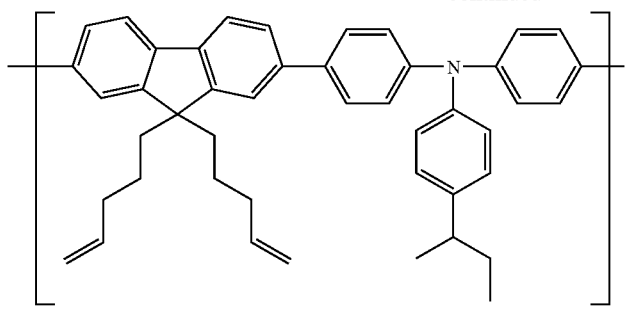
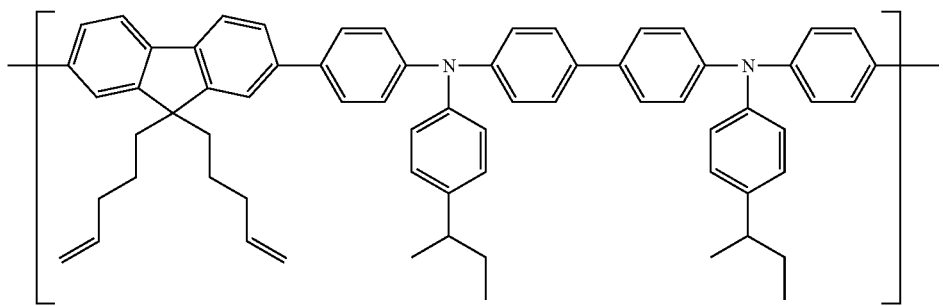
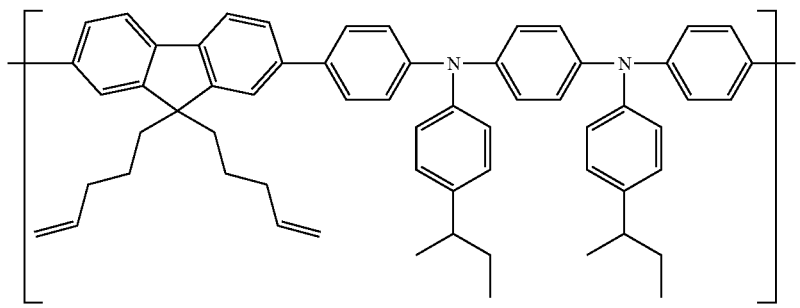
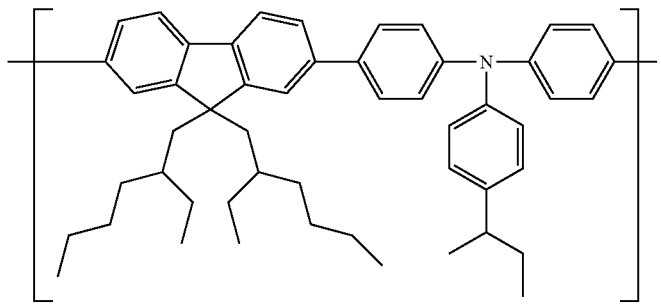
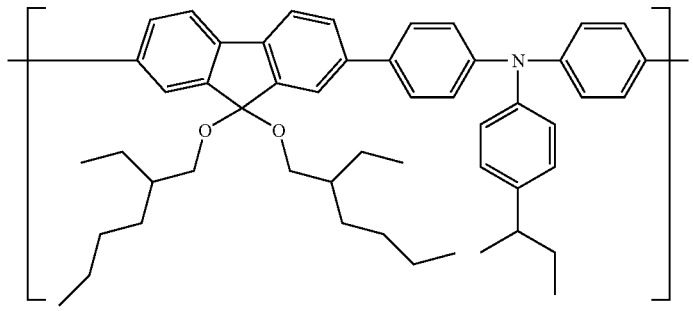

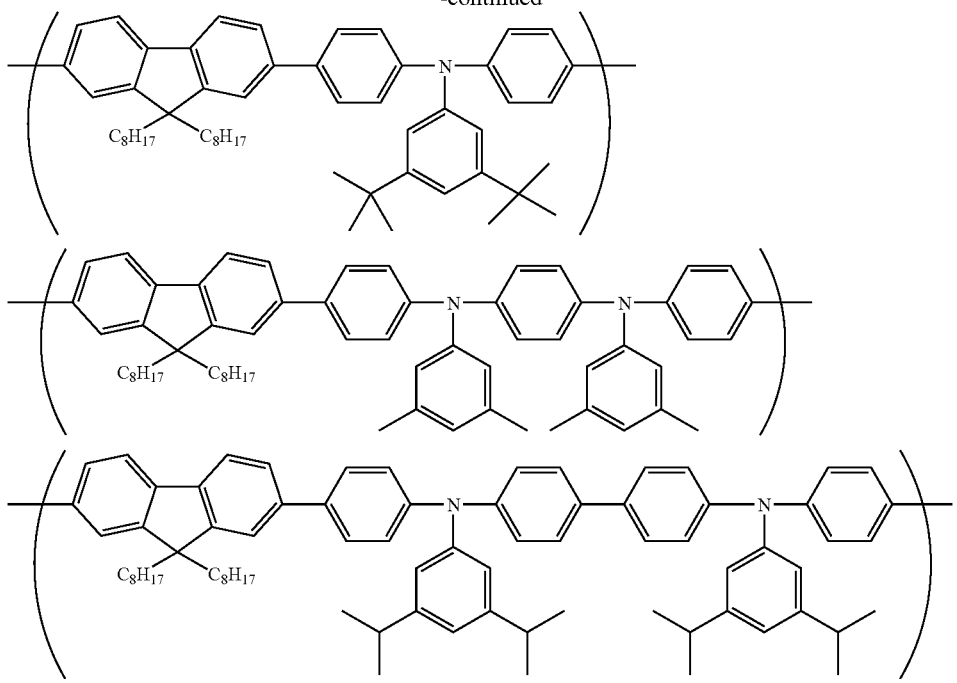

Furthermore, the amorphous organic compound which is used in the second organic TFT of the present invention is also preferably a compound obtained by crosslinking an amino group-containing low-molecular weight compound having a crosslinking site, and more preferably a compound in which the crosslinking site of the foregoing amino group-containing low-molecular weight compound is a group represented by any one of the following general formulae (1) to (4). Also, the foregoing amorphous organic compound is further preferably a crosslinked material obtained by crosslinking the amino group-containing low-molecular weight compound by the addition of at least one onium compound. Specifically, a thin film obtained by previously providing an amino group-containing low-molecular weight compound with a crosslinking site represented by any one of the following (1) to (4), depositing it as a thin film and then modifying it so as to have a high molecular weight upon being crosslinked with heat or light is especially preferable because it has excellent heat stability and resistance to an organic solvent.

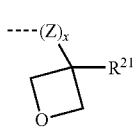 (1)

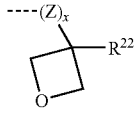 (2)

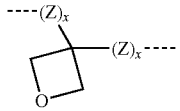 (3)

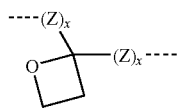 (4)

(In the formulae, each $R^{21}$ is the same or different at every appearance and represents a hydrogen atom, a linear, branched or cyclic alkyl group, alkoxyalkyl group, alkoxy group or thioalkoxy group each having from 1 to 20 carbon atoms, an aryl group or a heteroaryl group each having from 4 to 18 aromatic ring atoms or an alkenyl group having from 2 to 10 carbon atoms, wherein one or more hydrogen atoms may be substituted with a halogen or CN, and one or more non-adjacent carbon atoms may be substituted with —O—, —S—, —CO—, —COO— or —O—CO—; each $R^{22}$ is the same or different at every appearance and represents a hydrogen atom, a linear, branched or cyclic alkyl group or alkoxyalkyl group each having from 1 to 20 carbon atoms, an aryl group or a heteroaryl group each having from 4 to 18 aromatic ring atoms or an alkenyl group having from 2 to 10 carbon atoms, wherein one or more hydrogen atoms may be substituted with a halogen or CN, and one or more non-adjacent carbon atoms may be substituted with —O—, —S—, —CO—, —COO— or —O—CO—; each Z is the same or different at every appearance and represents a divalent group —$(CR^{23}R^{24})_r$— (wherein one or more non-adjacent carbon atoms may be substituted with —O—, —S—, —CO—, —COO— or —O—CO—) or a divalent aryl group or N-, S- and/or O-heteroaryl group each having from 4 to 40 carbon atoms (this may be substituted with one or more $R^{23}$ groups); each of $R^{23}$ and $R^{24}$ is the same or different at every appearance and represents a hydrogen atom, a linear, branched or cyclic alkyl group, alkoxy group, alkoxyalkyl group or thioalkoxy group each having from 1 to 20 carbon atoms, an aryl group or a heteroaryl group each having from 4 to 20 aromatic ring atoms or an alkenyl group having from 2 to 10 carbon atoms, wherein one or more hydrogen atoms may be substituted with a halogen or CN; the $R^{23}$ or $R^{24}$ group may form a cyclic structure each other or together with $R^{21}$ or $R^{22}$;

each r is the same or different at every appearance and represents an integer of from 0 to 30; and each x is the same or different at every appearance and represents an integer of from 0 to 5.

Each broken line represents a bond to the foregoing amorphous organic compound.)

The foregoing low-molecular weight compound is especially preferably an amino group-containing organic compound in which at least one hydrogen atom is substituted with the group of the formula (1).

In the foregoing general formulae (1) to (4), specific examples of the alkyl group having from 1 to 20 carbon atoms include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, etc.

The foregoing alkoxy group is a group represented by —$OX^1$, and specific examples of $X^1$ are the same as those described for the foregoing alkyl group.

The foregoing thioalkoxy group is a group represented by —$SX^2$, and examples of $X^2$ are the same as those described for the foregoing alkyl group.

Specific examples of the foregoing aryl group having from 4 to 18 aromatic ring atoms include those exemplified as the specific examples of the aryl group having from 6 to 40 ring carbon atoms in the foregoing general formula (A), which, however, have from 4 to 18 aromatic ring atoms.

Specific examples of the foregoing heteroaryl group include those exemplified as the specific examples of the heteroaryl group having from 3 to 40 ring carbon atoms in the foregoing general formula (A), which, however, have from 4 to 18 aromatic ring atoms.

Examples of the foregoing halogen atom include fluorine, chlorine, bromine and iodine atoms.

Examples of the foregoing divalent aryl group or N-, S- and/or O-heteroaryl group each having from 4 to 40 carbon atoms include those exemplified as the specific examples of the aryl group having from 6 to 40 ring carbon atoms or heteroaryl group having from 3 to 40 ring carbon atoms, which, however, meet the requirements.

Specific examples of the foregoing cyclic structure include cycloalkanes having from 4 to 12 carbon atoms, such as cyclobutane, cyclopentane, cyclohexane, adamantane, and norbornane; cycloalkenes having from 4 to 12 carbon atoms, such as cyclobutene, cyclopentene, cyclohexene, cycloheptene, and cyclooctene; cycloalkadienes having from 6 to 12 carbon atoms, such as cyclohexadiene, cycloheptadiene, and cyclooctadiene; aromatic rings having from 6 to 50 carbon atoms, such as benzene, naphthalene, phenanthrene, anthracene, pyrene, chrysene, and acenaphthylene; and heterocyclic rings such as pyrrolidine, and piperidine.

It is preferable that the crosslinking reaction is initiated upon irradiation with light. The onium compound is preferably a diaryl iodonium salt, a diaryl bromonium salt, a diaryl chloronium salt or a triaryl sulfonium salt, with a diaryl iodonium salt, a diaryl bromonium salt and a diaryl chloronium salt being especially preferable. Here, though an anion can be varied, in general, a weak nucleophilic anion, for example, $PF_6^-$, $SbF_6^-$, $SbC_{16}^-$, $BF_4^-$, $B(C_6F_5)_4^-$, etc., is selected. Though a proportion of the onium compound in the mixture or layer can be varied over a wide range, it is preferable to keep the proportion as low as possible such that a reaction product of the decomposition reaction does not affect the functions of the organic thin film transistor as far as possible. On the contrary, it is necessary to secure this proportion sufficiently for the purpose of sufficiently initiating the crosslinking as far as possible. A proportion of an initiator (onium compound) is individually optimized regarding each of the amino group-containing organic compounds and each of the onium compounds. In general, it has been found that the proportion of the onium compound in the mixture is preferably selected from the range of from 0.001 to 5% by mass, especially preferably from 0.01 to 3% by mass, and in particular, from 0.1 to 2% by mass. These values are especially applicable to the diaryl iodonium compound, and with respect to other compounds, there is a high possibility that such a value is deviated from this range. It has been found in the case where the amino group-containing organic compound is not readily oxidized, the onium compound in a very low proportion, and preferably the onium compound in the range of from 0.01 to 0.5% by mass is adequate for favorable crosslinking; whereas in the case of a very electron-rich, readily oxidizable semiconductor, the onium compound in a higher proportion, and preferably the onium compound in the range of from 1 to 2% by mass is required for favorable crosslinking.

What a conditioning treatment as described below is applied to the channel control layer formed by achieving a crosslinking reaction as described previously is preferable because a degree of crosslinking can be increased. After completion of the foregoing irradiation with light, the conditioning treatment can be applied preferably in a temperature range of from 50 to 250° C., and more preferably in a temperature range of from 80 to 150° C. preferably for from 0.1 to 30 minutes, and more preferably from 1 to 5 minutes. However, the foregoing temperature range varies depending upon the amorphous organic compound to be used and so on. According to this conditioning treatment, the mobility of a reactive oxetane unit in the channel control layer increases, the degree of crosslinking increases, and a polymer network is obtained. The thus obtained channel control layer is substantially insoluble in a general organic solvent such as THF.

Also, a cleaning treatment can be further applied to the channel control layer formed by achieving a crosslinking reaction as described previously, or the channel control layer formed by achieving a crosslinking reaction as described previously and then applying a conditioning treatment. The cleaning treatment of the channel control layer can be carried out using a general solvent such as THF. Additives, etc. in the channel control layer can be removed by the cleaning treatment. Examples of the additive include reducing agents such as $LiAlH_4$, MBDQ free radical anion=2,6-dimethyl 2',6'-di-tert-butyldiquinone free radical anion, hydrazine, and hydrazine derivatives; weak bases/nucleophilic reagents of tetrabutylammonium acetate or bromide, etc.; and so on. A concentration of such an additive is low, preferably less than $10^{-4}$ moles/liter, and especially preferably less than $10^{-5}$ moles/liter.

As to the present crosslinking reaction which proceeds in the presence of an onium compound and is initiated upon irradiation, it is preferable that the irradiation is not carried out in an absorption band of the onium compound; it is more preferable that the irradiation is carried out in a wavelength of at least 80 nm longer than the absorption maximum of the onium compound; and it is especially preferable that the irradiation is carried out in a wavelength of 100 nm longer than the absorption maximum of the onium compound. These numerical values are corresponding to separation of the maximum of absorption and release. This means that the onium compound cannot act directly as a photoacid generator, namely the onium compound cannot directly liberate a proton. However, it has been found that the crosslinking of the oxetane group takes place very efficiently and quickly and that in fact, in the case where the irradiation is carried out in an absorption band of the amino group-containing organic compound but not in an absorption band of the onium compound under the same condition regarding other points, the crosslinked layer is more durable. It may be considered that the oxetane-functionized organic compound plays a role as a photosensitizer for the reaction.

When the irradiation is carried out preferably in an absorption band of the amino group-containing organic compound especially in a wavelength within the range of ±50 nm of the absorption maximum of the individual absorption band, a very short time can be selected for the irradiation time, and very favorable crosslinking results are also obtainable. The irradiation is preferably carried out for from 0.01 to 10 seconds, and especially preferably from 0.1 to 3 seconds. Such a time is corresponding to the quantity of light of less than 1 mW/cm$^2$. In an adequate case, a shorter exposure time may be sufficient in a higher quantity of light.

The crosslinking does not proceed in the absence of an oxetane functional group. Accordingly, the present invention is further characterized in that the irradiation is carried out outside the absorption band of the photoacid generator preferably in a wavelength of at least 80 nm, and especially preferably in a wavelength of at least 100 nm longer than the absorption maximum of the onium compound.

Another method of the crosslinking is concerned with direct oxidative initiation of a crosslinking reaction by the addition of an oxidizing agent. The adequate oxidizing agent is, for example, a nitrosonium salt or a salt of a triarylammonium free radical cation, or other oxidizing agent capable of easily removing a reaction product thereof from the film after crosslinking, for example, volatile compounds or easily soluble compounds; or an oxidizing agent, a reaction product of which is inert and which does not adversely affect the film during the operation of the organic thin film transistor. An NO compound which can be easily handled is, for example, NO(BF$_4$) or NO(SbF$_6$). A tris(4-bromophenylammonium) salt is an example of the stable free radical cation. The oxidizing agent to be added makes it possible to initiate the crosslinking of the oxetane group. The crosslinking does not proceed in the absence of an oxetane functional group.

The foregoing crosslinking method brings the following advantages relative to crosslinking which is light-induced according to the conventional technology (the irradiation is carried out in the absorption band of a photoacid generator).

(1) The crosslinking can be carried out under a milder condition than a condition under which the crosslinking is possible according to the conventional technology. For the purposes of liberating a proton and initiating the crosslinking, in the case of a photoacid generator, higher UV radiation is necessary, whereas the reaction in the case of the method according to the present invention can be initiated with light of significantly lower energy (namely, in a longer wavelength). Especially, with respect to the amino group-containing organic compound which is photochemically instable (this is also applicable to almost all of amino group-containing organic compounds in the case of UV radiation which has been considered to be necessary up to date), the foregoing crosslinking method brings explicit advantages because a side reaction and decomposition in the layer due to high-energy UV radiation are substantially avoided.

(2) The crosslinking proceeds quickly and efficiently as compared with the case according to the conventional technology. According to this, the crosslinking can be carried out for a shorter time as compared with that up to date; and because of a shorter exposure time, the material is protected, and the side reaction is reduced. In addition to the above, a shorter crosslinking time is explicitly advantageous in an industrial manufacturing method. Accordingly, structurization of the device is very efficient and can be similarly achieved for a shorter time as compared with that up to date.

(3) The layer crosslinked by the method according to the present invention, which is accompanied by the addition of a smaller amount of the photoacid generator, has still favorable resistance to a solvent. Accordingly, on the one hand, the structurization is achieved more favorably; on the other hand, the application of plural layers to be successively superimposed is also improved at the same time.

Specific structural formulae of the foregoing amino group-containing low-molecular weight compound are enumerated below, but it should not be construed that the present invention is limited thereto.

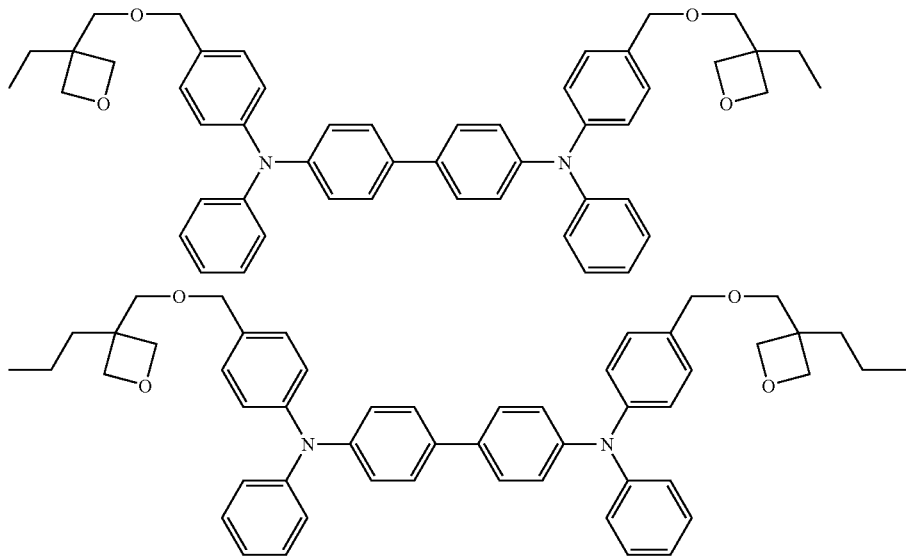

-continued
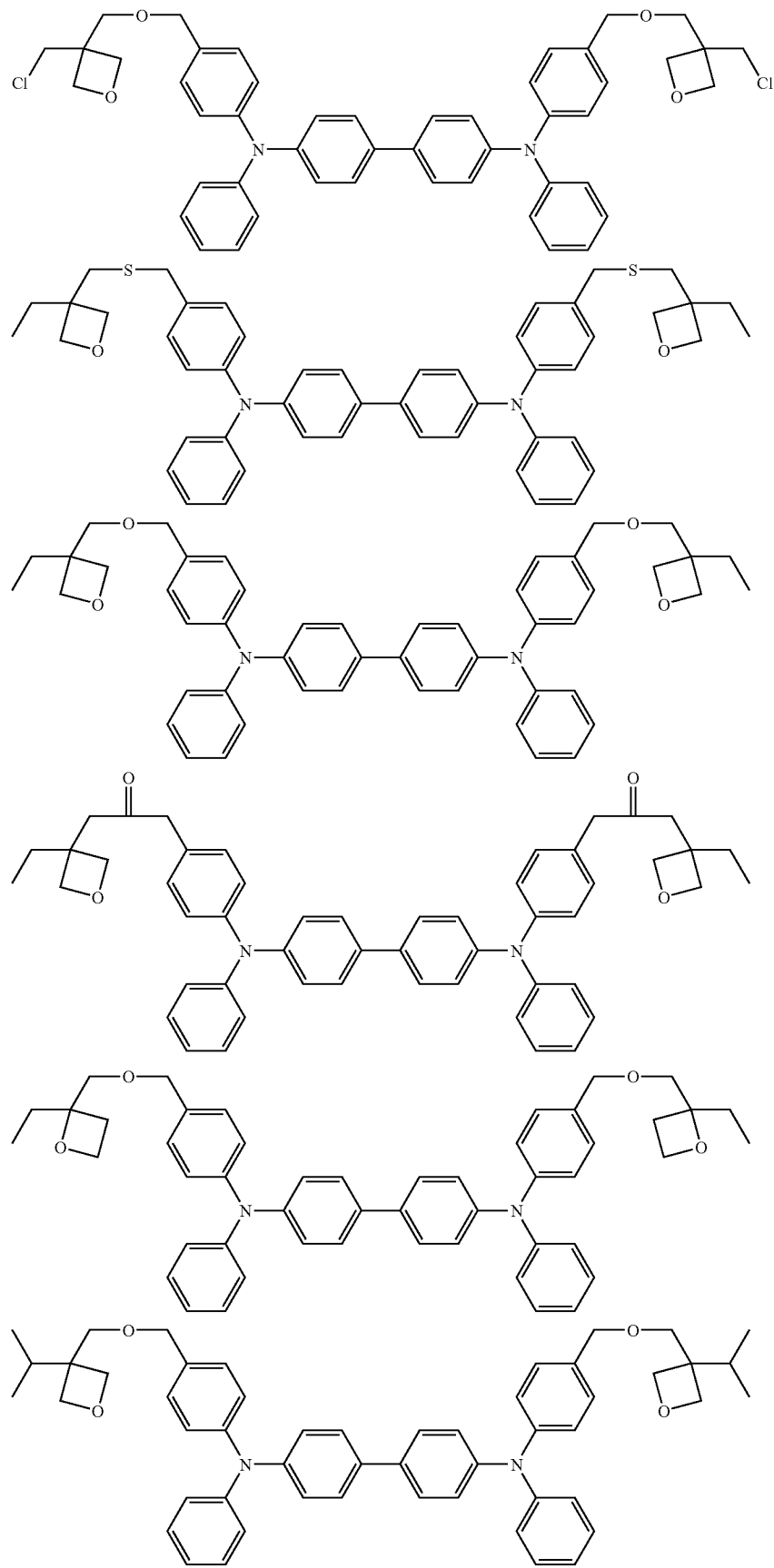

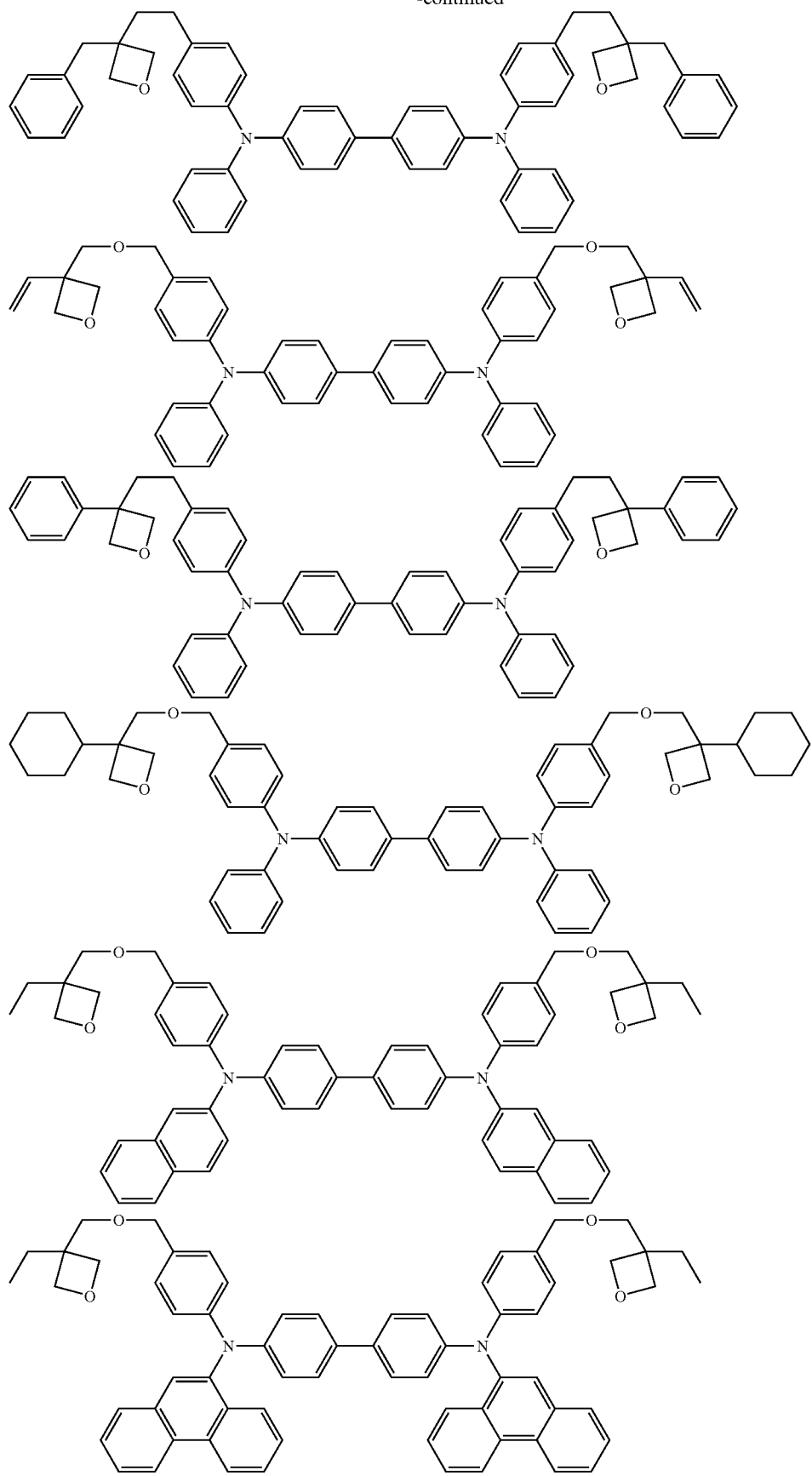

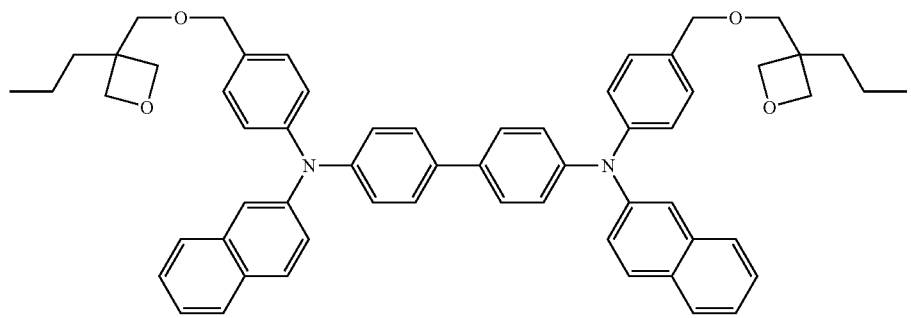
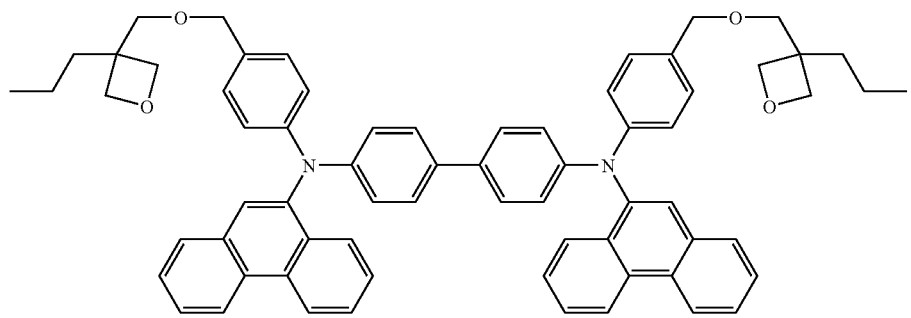
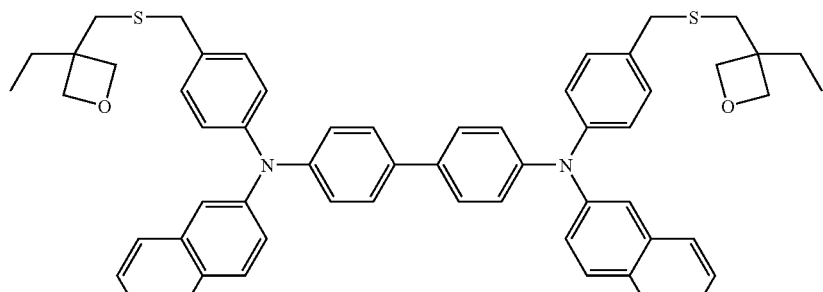
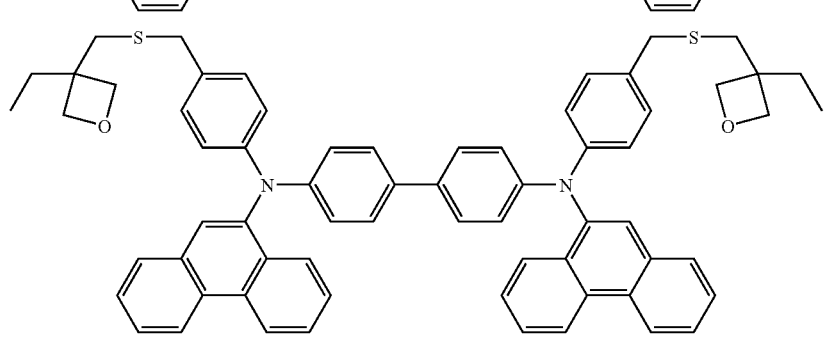
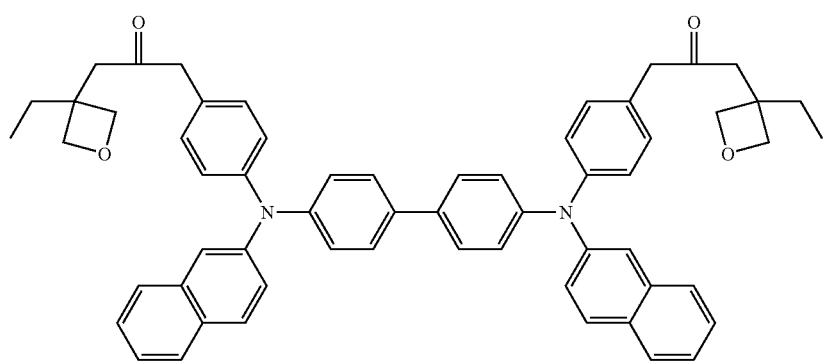

-continued
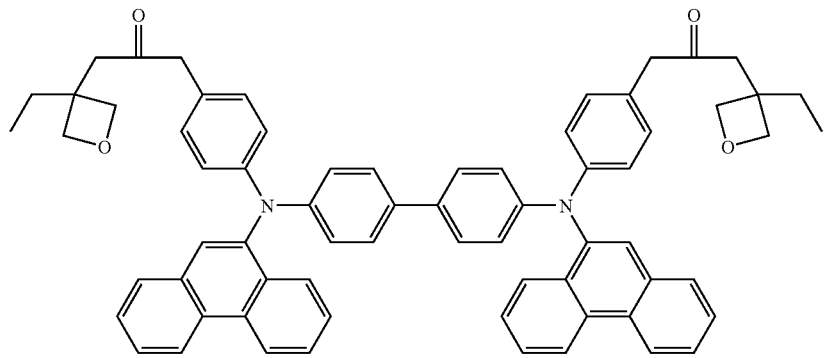
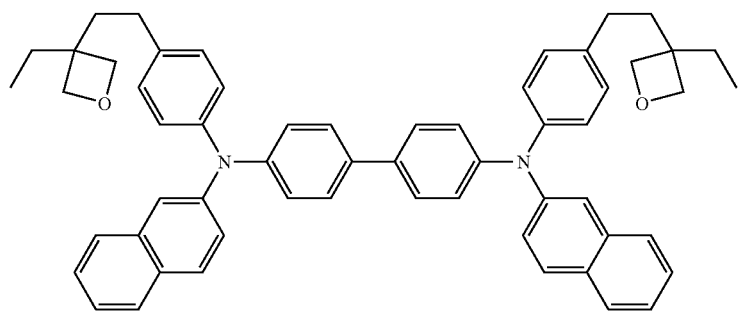
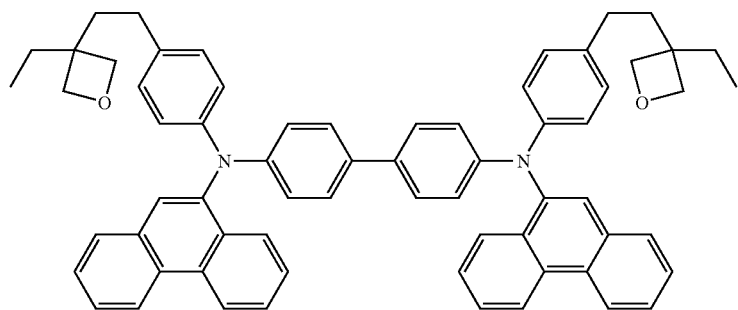
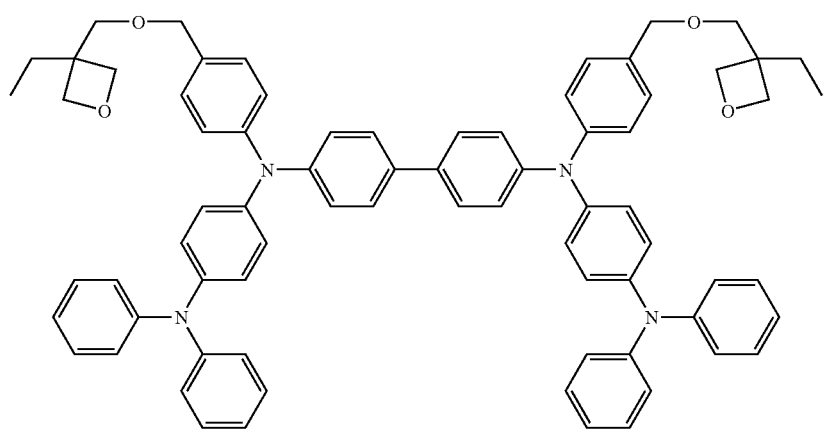

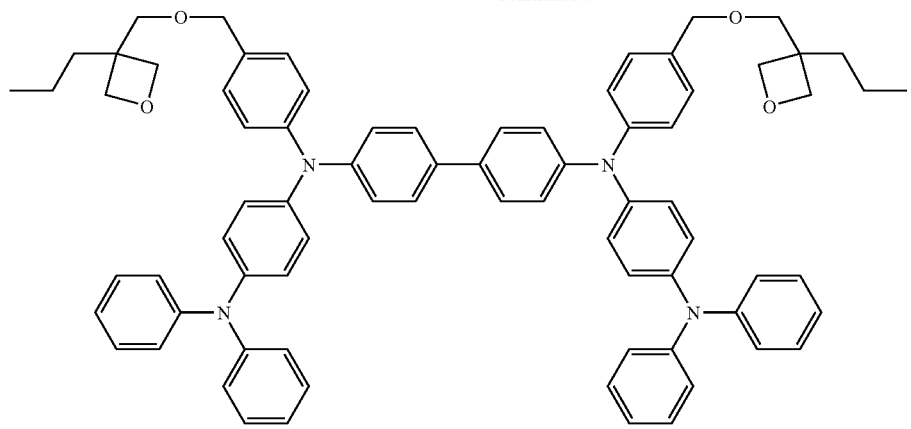
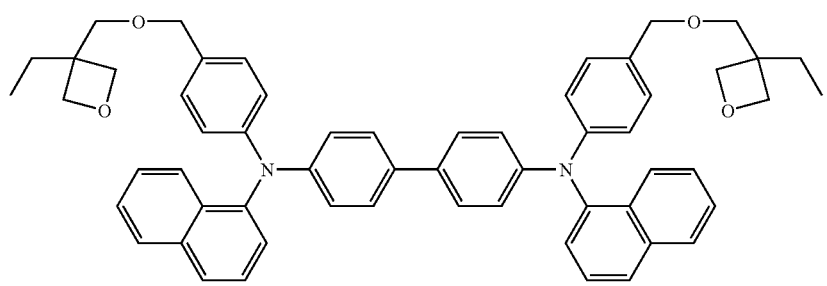
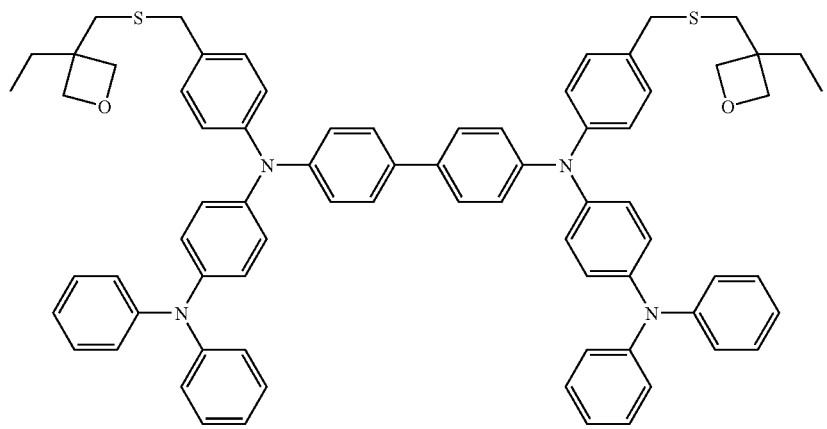
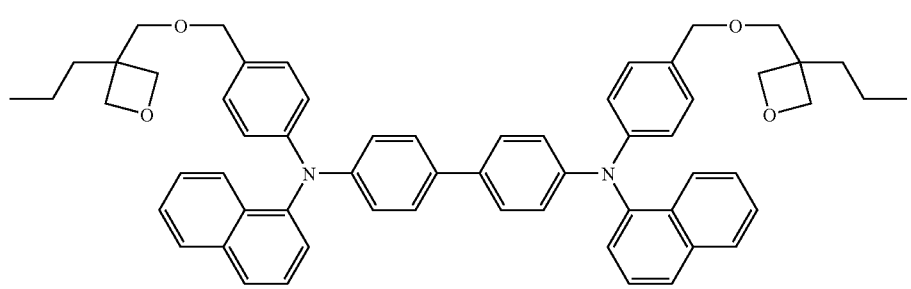

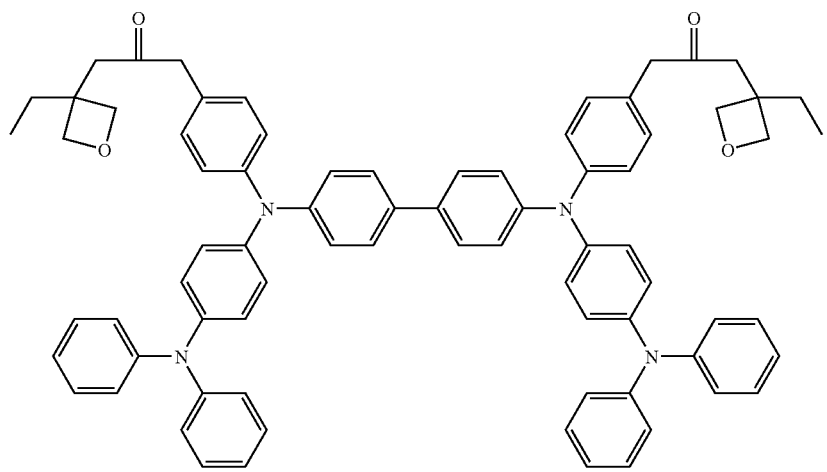
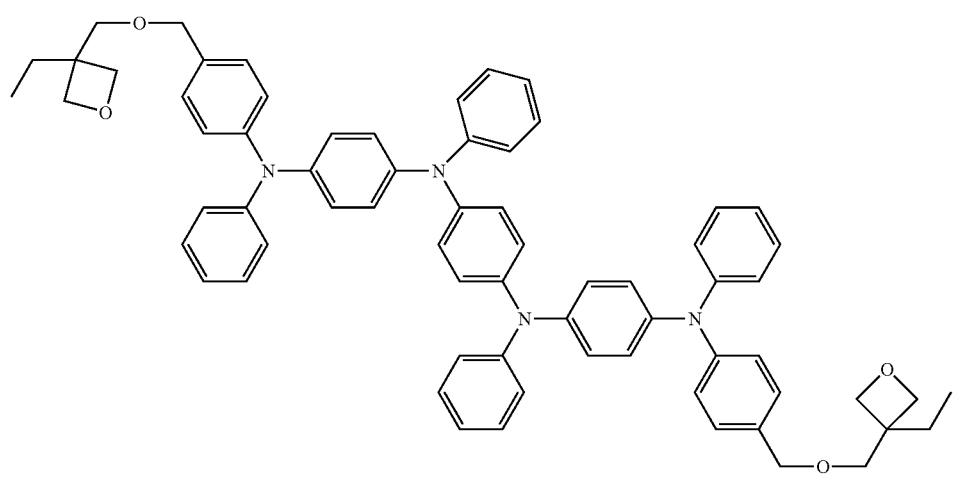
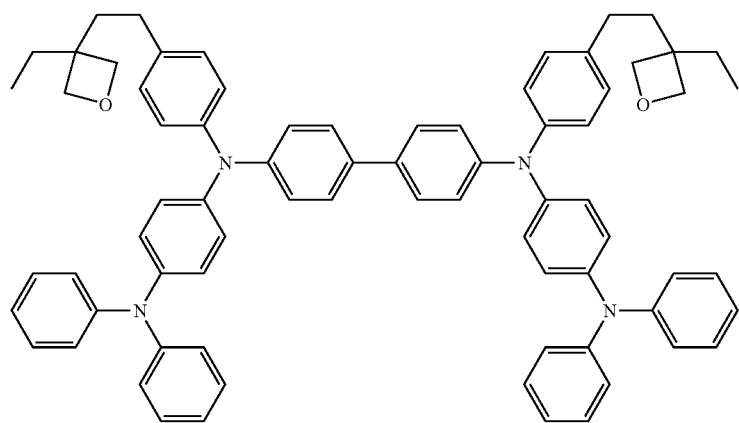

-continued
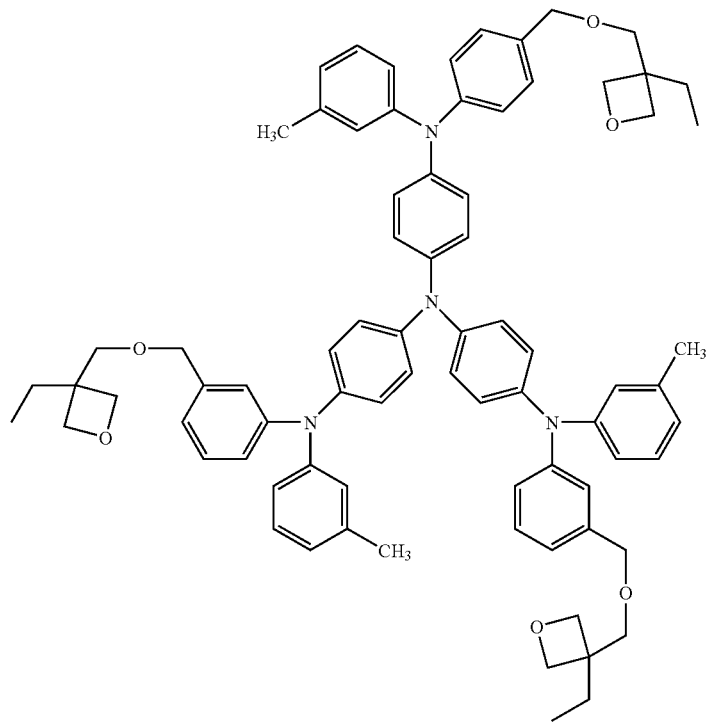
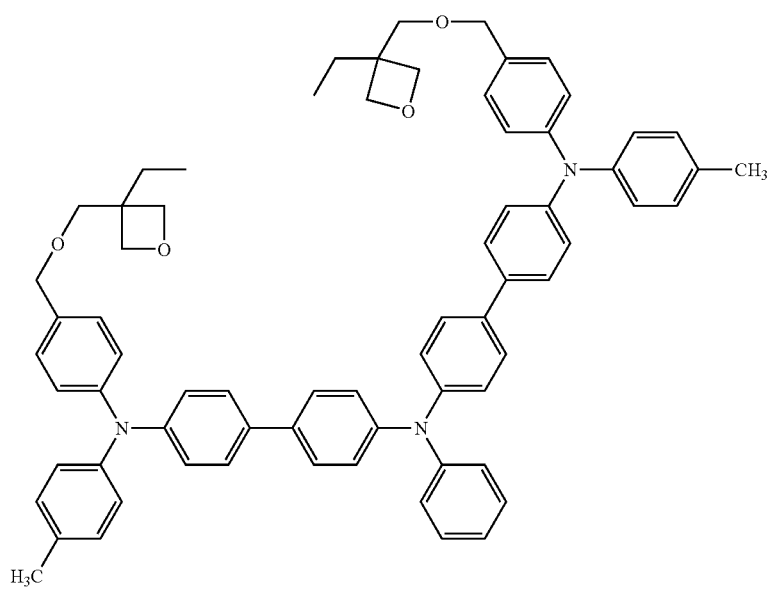

-continued
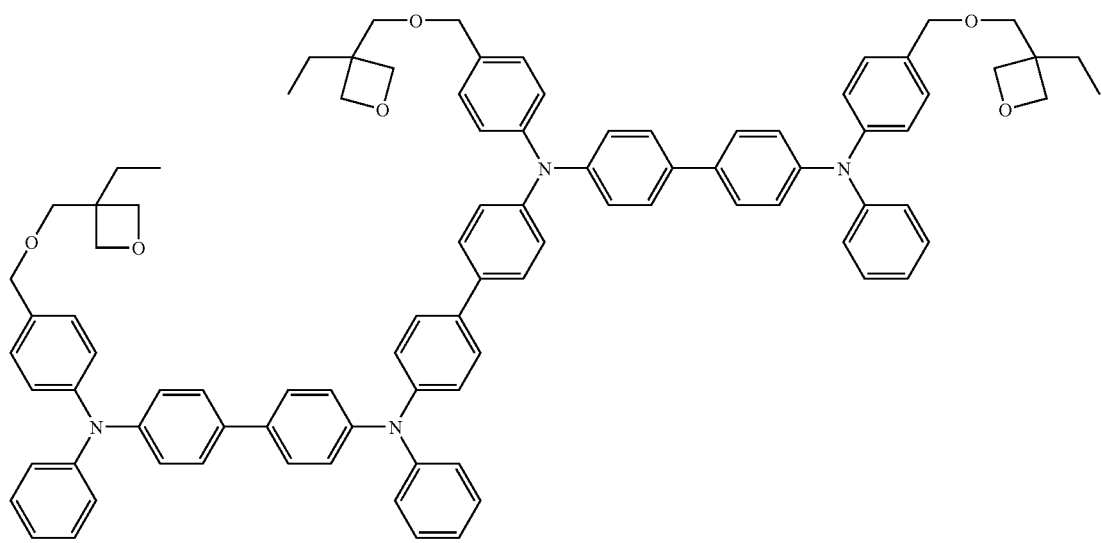
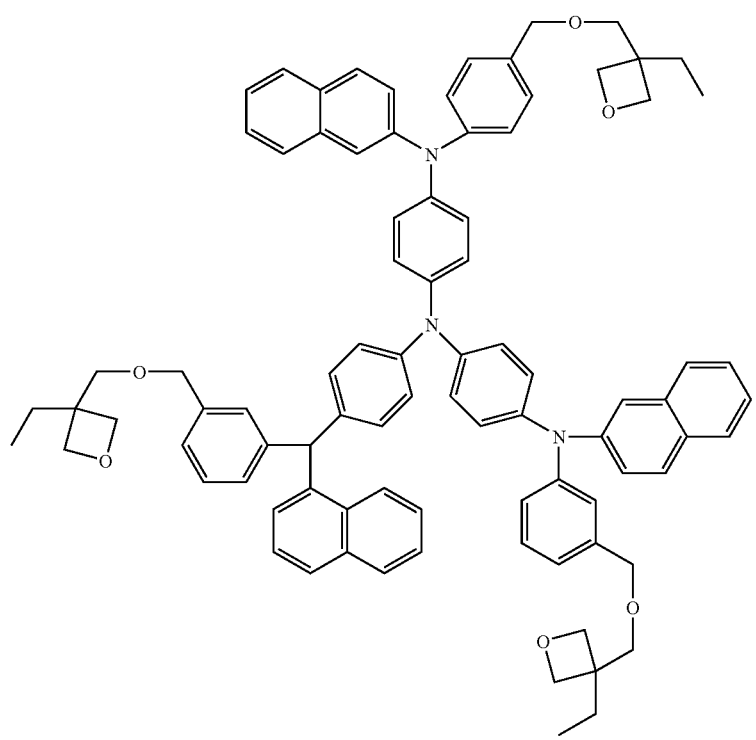

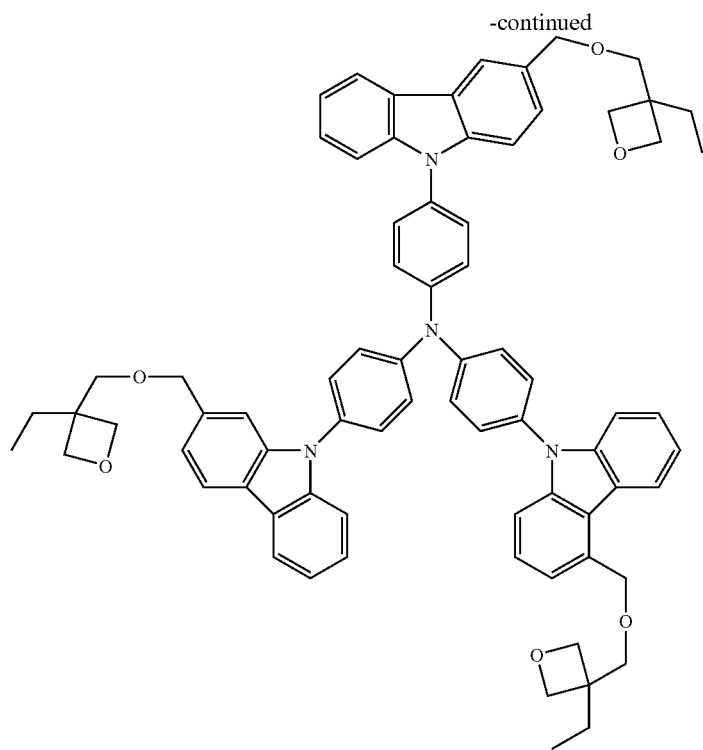
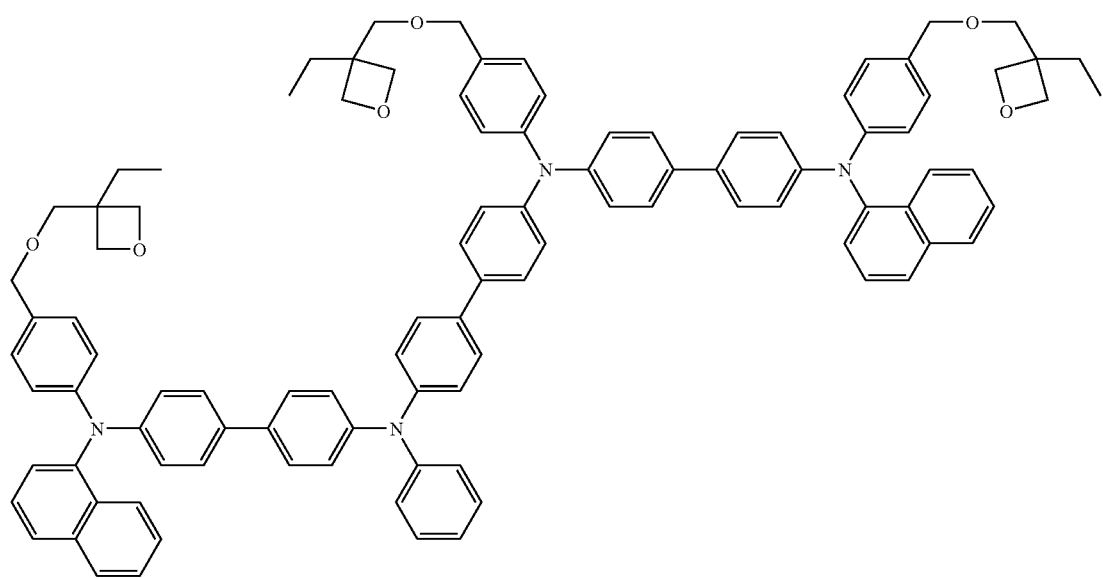

-continued

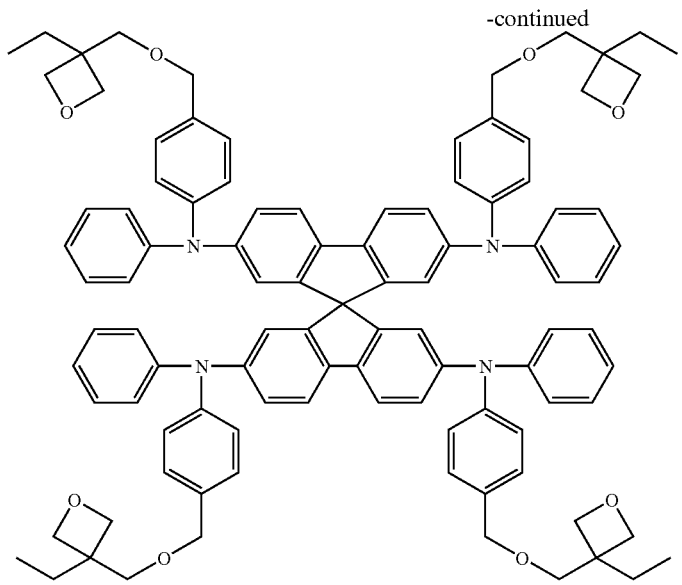

As seen in, for example, a non-patent document, C. W. Tang and S. A. VanSlyke, *Appl. Phys. Lett.*, 51, 913 (1987), there may be the case where amine based organic compounds exemplified as preferred examples of the amorphous organic compound which such a channel control layer contains are used for a hole injection layer or a hole transport layer of an organic EL device. In the organic EL, a current flows through a layer of the amine compound, whereas in the organic TFT of the present invention, a current flows through an organic semiconductor layer along the channel control layer, and therefore, the organic TFT of the present invention is a quite different device. In fact, it is well known that in the case where such an amine compound is used for an organic semiconductor layer, the field-effect mobility is an extremely small value as in, for example, a non-patent document, T. P. I. Saragi, T. Fuhrmann-Lieker and J. Salbeck, "Comparison of Charge Transport in Thin Films of Spiro-Linked Compounds and Their Corresponding Parent Compounds", *Advanced Functional Materials*, 16, 966 (2006), etc.

(Lamination of Channel Control Layer)

The channel control layer may be composed of only one layer containing the foregoing crosslinked or non-crosslinked, amorphous organic compound having an ionization potential of less than 5.8 eV, or may be composed of a plurality of such layers. Especially preferably, at least one layer contains an amorphous organic compound obtained upon being crosslinked.

(Thickness of Channel Control Layer)

A thickness of the channel control layer in the organic TFT of the present invention is not particularly limited, and a thickness necessary for smoothing an interface between the channel control layer and the organic semiconductor layer may be enough. The thickness of the channel control layer is preferably from 1 nm to 100 nm, and more preferably from 5 nm to 50 nm. This is because when the thickness is too thick, an effect for accumulating a carrier becomes small due to the gate voltage, whereas when it is too thin, the smoothness of the interface with the organic semiconductor is insufficient so that there is a concern that carrier traps are formed within the channel.

(Formation Method of Channel Control Layer)

A method for forming the channel control layer is not particularly limited, and methods which are known as a method for forming an organic semiconductor layer are applicable. For example, the channel control layer is formed by a molecular beam epitaxy method (MBE method), a vacuum vapor deposition method, chemical vapor deposition, a printing or coating method of a solution having a material dissolved in a solvent, such as a dipping method, a spin coating method, a casting method, a bar coating method, and a roller coating method, baking, electro-polymerization, self-assembling from a solution, or a method of a combination of those measures.

Here, it is necessary to consider that amorphous properties of the material are kept. As a deposition method which is especially preferable in the second organic TFT of the present invention, since the molecular weight of the channel control layer is large as 1,000 or more, a solution process, namely a printing or coating method such as a dipping method, a spin coating method, a casting method, a bar coating method, a roller coating method, inkjetting, gravure printing, relief printing, planographic printing, and intaglio printing, is preferable. By adopting such a method, a thin film with high smoothness can be obtained. Also, it is preferable that after mixing a crosslinking agent or a polymerization initiator in the solution, crosslinking or polymerization with light or heat is carried out as the need arises.

(Organic Semiconductor Layer)

The organic semiconductor which is used in the present invention is not particularly limited. Generally disclosed organic semiconductors which are used in an organic TFT can be used.

Specific examples thereof are enumerated below.

(Material to be Used for the Organic Semiconductor Layer)

In general, a crystalline material is used because a high mobility is obtained. Specifically, the following materials can be exemplified.

(1) Optionally substituted acenes such as naphthalene, anthracene, tetracene, pentacene, hexacene, and heptacene; compounds having a styryl structure represented by $C_6H_5$—CH=CH—$C_6H_5$, such as 1,4-bisstyrylbenzene, 1,4-bis(2-methylstyryl)benzene, 1,4-bis(3-methylstyryl)benzene (4MSB), 1,4-bis(4-methylstyryl)benzene, and polyphenylene vinylene; and oligomers or polymers of these compounds.

(2) Compounds including a thiophene ring as described below:
(a) Optionally substituted thiophene oligomers such as derivatives of α-4T, α-5T, α-6T, α-7T and α-8T.
(b) Thiophene based polymers such as thiophene based polymers such as polyhexylthiophene, and poly(9,9-dioctylfluorenyl-2,7-diyl-co-bithiophene).
(c) Bisbenzothiophene derivatives, α,α'-bis(dithieno[3,2-b:2',3'-d]thiophene), a cooligomer of dithienothiophene-thiophene and condensed oligothiophenes such as pentathienoacene, with compounds having a thienobenzene skeleton or a dithienobenzene skeleton and dibenzothienobenzothiophene derivatives being especially preferable.

(3) Also, a selenophene oligomer, non-metallic phthalocyanine, copper phthalocyanine, lead phthalocyanine, titanyl phthalocyanine, porphyrins such as platinum porphyrin, porphyrin, and benzoporphyrin, tetrathiafulvalene (TTF) and derivatives thereof, rubrene and derivatives thereof and so on are exemplified.

(Organic Semiconductor Constituting an N-Type Organic TFT)

In the case of the organic TFT of the present invention, when it is an n-type organic TFT, an especially large mobility and excellent high-temperature stability are obtained. As the organic semiconductor which is used for the n-type organic TFT, an organic semiconductor having n-channel driving capability is preferable, and specifically, the following compounds can be exemplified.

(1) Ampholytic transporting compounds such as acenes, non-metallic phthalocyanine, copper phthalocyanine, fluorinated copper phthalocyanine, lead phthalocyanine, and titanyl phthalocyanine, porphyrins such as platinum porphyrin, porphyrin, benzoporphyrin, rubrene, and polyphenylene vinylene.

(2) Compounds having, as a mother skeleton, the following p-type semiconductor and having fluorine or a fluoroalkyl group (for example, F, $CF_3$, $C_2F_5$, etc.) added thereto.

Optionally substituted acenes such as naphthalene, anthracene, tetracene, pentacene, hexacene, and heptacene, oligomers or polymers having a styryl structure represented by $C_6H_5$—CH=CH—$C_6H_5$, such as 1,4-bisstyrylbenzene, 1,4-bis(2-methylstyryl)benzene, 1,4-bis(3-methylstyryl) benzene (4MSB), 1,4-bis(4-methylstyryl)benzene, and polyphenylene vinylene, optionally substituted thiophene oligomers such as derivatives of α-4T, α-5T, α-6T, α-7T and α-8T, thiophene based polymers such as thiophene based polymers such as polyhexylthiophene, and poly(9,9-dioctylfluorenyl-2,7-diyl-co-biothine), bisbenzothiophene derivatives, α,α'-bis(dithieno[3,2-b:2',3'-d]thiophene), a cooligomer of dithienothiophene-thiophene, condensed oligothiophenes such as pentathienoacene, especially compounds having a thienobenzene skeleton or a dithienobenzene skeleton and dibenzothienobenzothiophene derivatives, a selenophene oligomer, non-metallic phthalocyanine, copper phthalocyanine, fluorinated copper phthalocyanine, lead phthalocyanine, titanyl phthalocyanine, porphyrins such as platinum porphyrin, porphyrin, and benzoporphyrin, tetrathiafulvalene (TTF) and derivatives thereof.

(3) Compounds which are known singly as an n-type semiconductor, for example, quinoide oligomers such as tetracyanoquinodimethane (TCNQ), and 11,11,12,12-tetracyanonaphtho-2,6-quinodimethane (TCNNQ); fullerenes such as C60, C70, PCBM, etc.; and tetracarboxylic acids such as N,N'-diphenyl-3,4,9,10-perylenetetracarboxylic acid diimide, N,N-dioctyl-3,4,9,10-perylenetetracarboxylic acid diimide (C8-PTCDI), NTCDA, and 1,4,5,8-naphthalenetetracarboxyl diimide (NTCDI).

(Thickness and Deposition Method of Organic Semiconductor Layer)

Though the thickness of the organic semiconductor layer in the organic TFT of the present invention is not particularly limited, it is usually from 0.5 nm to 1 μm, and preferably from 2 nm to 250 nm. When the thickness of the organic semiconductor layer falls within this range, a large mobility and excellent stability under a high-temperature condition are obtained.

A method for forming the organic semiconductor layer is not particularly limited, and a known method is applicable. For example, the organic semiconductor layer is formed from the foregoing material of the organic semiconductor layer by a molecular beam epitaxy method (MBE method), a vacuum vapor deposition method, chemical vapor deposition, a printing or coating method of a solution having a material dissolved in a solvent, such as a dipping method, a spin coating method, a casting method, a bar coating method, and a roller coating method, baking, electro-polymerization, molecular beam vapor deposition, self-assembling from a solution, or a method of a combination of those measures. By enhancing the crystallinity of the organic semiconductor layer, the field-effect mobility is enhanced. Therefore, in the case of adopting deposition (for example, vapor deposition, sputtering, etc.) from a vapor phase, a method of keeping the temperature of the substrate during the deposition at a high temperature can be adopted. The temperature is preferably from 50 to 250° C., and more preferably from 70 to 150° C. Also, regardless of the deposition method, when annealing is carried out after the deposition, it is possible to contrive to enhance the performance of the device. With respect to the annealing, the temperature is preferably from 50 to 200° C., and more preferably from 70 to 200° C.; and the time is preferably from 10 minutes to 12 hours, and more preferably from 1 to 10 hours. However, it is necessary to adopt an annealing condition under which the amorphous properties of the channel control layer are kept.

(Purity of the Organic Compound Used in Each of the Channel Control Layer and the Organic Semiconductor Layer)

Also, in the organic thin film transistor of the present invention, by using a high-purity material as the amorphous organic compound which is used for the foregoing channel control layer or the organic semiconductor which is used for the organic semiconductor layer, it is possible to contrive to enhance the field-effect mobility and the ON/OFF ratio. Accordingly, it is desirable to apply purification by a technique such as column chromatography, recrystallization, distillation, and sublimation thereto, as the need arises. Preferably, it is possible to more enhance the purity by repeatedly adopting such a purification method or combining plural methods. Furthermore, it is desirable to repeat sublimation and purification as a final step of the purification at least two times or more. By using such a technique, it is preferable to use a material having a purity, as measured by HPLC, of 90% or more. When a material having a purity of more preferably 95% or more, and especially preferably 99% or more is used, the field-effect mobility and the ON/OFF ratio of the organic TFT can be increased, thereby revealing the performance which the material originally possesses.

(Substrate)

The substrate in the organic TFT of the present invention bears a role of supporting the structure of the organic TFT. Besides glasses, inorganic compounds such as metal oxides and nitrides, plastic films (for example, PET, PES or PC), metal substrates, composites or laminates thereof and so on can also be used as the material. Also, in the case where the structure of the organic TFT can be sufficiently supported by a constitutional element other than the substrate, there is a possibility that the substrate is not used. Also, a silicon (Si) wafer is frequently used as the material of the substrate. In that case, Si itself can be used as the substrate which also serves as a gate electrode. Also, it is possible to oxidize the surface of Si to form $SiO_2$, thereby applying it as an insulating layer. In that case, there may be the case where a metal layer such as Au is deposited as an electrode for connecting a lead wire on the Si substrate of the gate electrode which also serves as a substrate.

(Electrode)

In the organic TFT of the present invention, materials of the gate electrode, the source electrode and the drain electrode are not particularly limited so far as they are a conductive material. Platinum, gold, silver, nickel, chromium, copper, iron, tin, antimony, lead, tantalum, indium, palladium, tellurium, rhenium, iridium, aluminum, ruthenium, germanium, molybdenum, tungsten, antimony tin oxide, indium tin oxide (ITO), fluorine-doped zinc oxide, zinc, carbon, graphite, glassy carbon, a silver paste and a carbon paste, lithium, beryllium, sodium, magnesium, potassium, calcium, scandium, titanium, manganese, zirconium, gallium, niobium, a sodium-potassium alloy, a magnesium/copper mixture, a magnesium/silver mixture, a magnesium/aluminum mixture, a magnesium/indium mixture, an aluminum/aluminum oxide mixture, a lithium/aluminum mixture, etc. are useful.

With respect to a method for forming the foregoing electrode, the electrode is formed by a measure, for example, vapor deposition, electron beam vapor deposition, sputtering, an atmospheric pressure plasma method, ion plating, chemical vapor phase vapor deposition, electrodeposition, electroless plating, spin coating, printing, inkjetting, etc. Also, with respect to a patterning method of a conductive thin film formed by adopting the foregoing method, which is carried out as the need arises, there are a method for forming an electrode by adopting a known photo lithographic method or a liftoff method; and a method of forming a resist by means of heat transfer, inkjetting, etc. onto a metal foil such as aluminum, and copper, and etching it. A thickness of the thus formed electrode is not particularly limited so far as the electrode is electrically conductive. The thickness of the electrode is preferably in the range of from 0.2 nm to 10 μm, and more preferably from 4 nm to 300 nm. When the thickness of the electrode falls within this preferred range, the resistance is high because of the fact that the thickness is thin, whereby any voltage drop is not caused. Also, since the thickness of the electrode is not excessively thick, it does not take a long period of time to form a film, and in the case of laminating other layers such as a protective layer, and an organic semiconductor layer, a laminated film can be made smooth without causing a difference in level.

In the organic TFT of the present invention, with respect to a source electrode, a drain electrode or a gate electrode, which is different from the foregoing, and a method for forming the same, a method for forming such an electrode using a fluidic electrode material including the foregoing conductive material, such as a solution, a paste, an ink, and a dispersion can be adopted. In that case, it is preferable to use a fluidic electrode material including a conductive polymer or a metal fine particle containing platinum, gold, silver or copper. Also, for the purpose of suppressing adverse influences against the organic semiconductor, the solvent or dispersion medium is preferably a solvent or a dispersion medium each containing 60% by mass or more, and preferably 90% by mass or more of water. As a dispersion containing a metal fine particle, for example, a known conductive paste or the like may be used. In general, it is preferable that the dispersion is a dispersion containing a metal fine particle having a particle size of from 0.5 nm to 50 nm, and preferably from 1 nm to 10 nm. As a material of this metal fine particle, for example, platinum, gold, silver, nickel, chromium, copper, iron, tin, antimony, lead, tantalum, indium, palladium, tellurium, rhenium, iridium, aluminum, ruthenium, germanium, molybdenum, tungsten, zinc, etc. can be used. It is preferable that an electrode is formed using a dispersion having such a metal fine particle dispersed in water or a dispersion medium as an arbitrary organic solvent by using a dispersion stabilizer composed mainly of an organic material. Examples of a method for manufacturing a dispersion of such a metal fine particle include a physical formation method such as a gas evaporation method, a sputtering method, and a metal vapor synthesis method; and a chemical formation method for reducing a metal ion in a liquid phase to form a metal fine particle, such as a colloid method, and a coprecipitation method. Dispersions of a metal fine particle manufactured by a colloid method disclosed in JP-A-11-76800, JP-A-11-80647, JP-A-11-319538, JP-A-2000-239853, etc., or a gas evaporation method disclosed in JP-A-2001-254185, JP-A-2001-53028, JP-A-2001-35255, JP-A-2000-124157, JP-A-2000-123634, etc. are preferable.

The electrode may be formed by means of patterning using such a metal fine particle dispersion directly by an inkjetting method or may be formed from a coated film by means of lithography, laser abrasion, etc. Also, a method for achieving patterning by a printing method such as relief printing, intaglio printing, planographic printing, and screen printing can be adopted. The foregoing electrode is molded; the solvent is dried; and thereafter, the molded article is heated in a shape form at a temperature in the range of from 100° C. to 300° C., and preferably from 150° C. to 200° C. as the need arises, thereby thermally fusing the metal fine particle. There is thus formed an electrode pattern having a desired shape.

Furthermore, a known conductive polymer whose conductivity has been enhanced by means of doping or the like can be used as each of materials of the gate electrode, the source electrode and the drain electrode different from the foregoing. For example, conductive polyanilines, conductive polypyrroles, conductive polythiophenes (for example, a complex of polyethylene dioxythiophene and polystyrene sulfonic acid, etc.), and so on can be suitably used. These materials are able to reduce the contact resistance of each of the source electrode and the drain electrode with the organic semiconductor layer. The electrode may also be formed by means of patterning by an inkjetting method or may be formed from a coated film by means lithography, laser abrasion, etc. Also, a method for achieving patterning by a printing method such as relief printing, intaglio printing, planographic printing, and screen printing can be adopted.

In particular, among the foregoing examples, those materials having small electric resistance through the contact surface with the organic semiconductor layer are preferable with respect to the material for forming each of the source electrode and the drain electrode. On that occasion, namely, when a current control device is prepared, the electric resistance is corresponding to the field-effect mobility, and it is necessary that the resistance is as small as possible for the purpose of obtaining a large mobility. In general, this is determined by a large and small relation between a work function of the electrode material and an energy level of the organic semiconductor layer.

When a work function (W) of the electrode material is defined as "a", an ionization potential (Ip) of the organic semiconductor layer is defined as "b", and an electron affinity (Af) of the organic semiconductor layer is defined as "c", it is preferable that they meet the following relational expression. Here, each of a, b and c is a positive value on the basis of a vacuum level.

In the case of a p-type organic TFT, (b−a)<1.5 eV (expression (I)) is preferable; and (b−a)<1.0 eV is more preferable. In the relation with the organic semiconductor layer, when the foregoing relation can be maintained, a device with high performance can be obtained. In particular, it is preferable to select an electrode material having a large work function as far as possible. The work function is preferably 4.0 eV or more, and the work function is more preferably 4.2 eV or more.

A value of the work function of the metal may be selected from the list of effective metals having a work function of 4.0 eV or more, which is described in, for example, *Kagaku Binran Kiso-hen II* (Handbook of Chemistry, Fundamentals II), page 493 (Third Edition, edited by the Chemical Society of Japan and published by Maruzen Co., Ltd., 1983). A metal having a high work function is mainly Ag (4.26, 4.52, 4.64, 4.74 eV), Al (4.06, 4.24, 4.41 eV), Au (5.1, 5.37, 5.47 eV), Be (4.98 eV), Bi (4.34 eV), Cd (4.08 eV), Co (5.0 eV), Cu (4.65 eV), Fe (4.5, 4.67, 4.81 eV), Ga (4.3 eV), Hg (4.4 eV), Ir (5.42, 5.76 eV), Mn (4.1 eV), Mo (4.53, 4.55, 4.95 eV), Nb (4.02, 4.36, 4.87 eV), Ni (5.04, 5.22, 5.35 eV), Os (5.93 eV), Pb (4.25 eV), Pt (5.64 eV), Pd (5.55 eV), Re (4.72 eV), Ru (4.71 eV), Sb (4.55, 4.7 eV), Sn (4.42 eV), Ta (4.0, 4.15, 4.8 eV), Ti (4.33 eV), V (4.3 eV), W (4.47, 4.63, 5.25 eV) or Zr (4.05 eV). Of these, noble metals (for example, Ag, Au, Cu or Pt), Ni, Co, Os, Fe, Ga, Ir, Mn, Mo, Pd, Re, Ru, V and W are preferable. Besides the metals, ITO, conductive polymers such as polyanilines and PEDOT:PSS and carbon are preferable. Even when one kind or plural kinds of such a material having a high work function are included as the electrode material, so far as the work function meets the foregoing expression (I), there are no particular limitations.

In the case of an n-type organic TFT, (a−c)<1.5 eV (expression (II)) is preferable; and (a−c)<1.0 eV is more preferable. In the relation with the organic semiconductor layer, when the foregoing relation can be maintained, a device with high performance can be obtained. In particular, it is preferable to select an electrode material having a small work function as far as possible. The work function is preferably not more than 4.3 eV or more, and the work function is more preferably not more than 3.7 eV.

A value of the work function of the metal having a low work function may be selected from the list of effective metals having a work function of 4.3 eV or less, which is described in, for example, *Kagaku Binran Kiso-hen II* (Handbook of Chemistry, Fundamentals II), page 493 (Third Edition, edited by the Chemical Society of Japan and published by Maruzen Co., Ltd., 1983). Examples thereof include Ag (4.26 eV), Al (4.06, 4.28 eV), Ba (2.52 eV), Ca (2.9 eV), Ce (2.9 eV), Cs (1.95 eV), Er (2.97 eV), Eu (2.5 eV), Gd (3.1 eV), Hf (3.9 eV), In (4.09 eV), K (2.28 eV), La (3.5 eV), Li (2.93 eV), Mg (3.66 eV), Na (2.36 eV), Nd (3.2 eV), Rb (4.25 eV), Sc (3.5 eV), Sm (2.7 eV), Ta (4.0, 4.15 eV), Y (3.1 eV), Yb (2.6 eV), Zn (3.63 eV), etc. Of these, Ba, Ca, Cs, Er, Eu, Gd, Hf, K, La, Li, Mg, Na, Nd, Rb, Y, Yb and Zn are preferable.

Even when one kind or plural kinds of such a material having a low work function are included as the electrode material, so far as the work function meets the foregoing expression (II), there are no particular limitations. In the n-type organic TFT, Au can be used, too.

However, it is desirable that the metal having a low work function is capped by a metal which is stable in air, such as Ag and Au, as the need arises because when it comes into contact with moisture or oxygen in the air, it is readily deteriorated. A thickness necessary for achieving coating is required to be 10 nm or more, and as the thickness becomes thick, the metal can be protected from oxygen or water. However, it is desirable that the thickness is not more than 1 μm for the reasons of practical use, an increase of productivity, etc.

(Buffer Layer)

Also, in the organic thin film transistor of the present embodiment, for example, for the purpose of enhancing injection efficiency of a carrier, a buffer layer may be provided between the organic semiconductor layer and each of the source electrode and the drain electrode. With respect to the buffer layer, a compound having an alkali metal or alkaline earth metal ionic bond, which is used for a negative electrode of an organic EL device, such as LiF, Li$_2$O, CsF, Na$_2$CO$_3$, KCl, MgF$_2$, and CaCO$_3$, is desirable for the n-type organic thin film transistor. Also, a compound which is used as an electron injection layer or an electron transport layer in the organic EL, such as Alq, may be inserted.

FeCl$_3$; cyano compounds such as TCNQ, F$_4$-TCNQ, and HAT; CF$_x$; oxides of a metal other than alkali metals or alkaline earth metals, such as GeO$_2$, SiO$_2$, MoO$_3$, V$_2$O$_5$, VO$_2$, V$_2$O$_3$, MnO, Mn$_3$O$_4$, ZrO$_2$, WO$_3$, TiO$_2$, In$_2$O$_3$, ZnO, NiO, HfO$_2$, Ta$_2$O$_5$, ReO$_3$, and PbO$_2$; and inorganic compounds such as ZnS, and ZnSe are desirable for the p-type organic thin film transistor. In many cases, the most of these oxides cause oxygen deficiency, and this is suitable for hole injection. Furthermore, compounds which are used for a hole injection layer or a hole transport layer in the organic EL device, such as amine based compounds, for example, TPD, NPD, etc., CuPc, may be used. Also, a combination of two or more kinds of the foregoing compounds is desirable.

The buffer layer decreases a threshold voltage upon lowering an injection barrier of a carrier, thereby bringing an effect for driving an organic TFT at a low voltage. Also, there is brought an effect for enhancing the mobility. It would be better that the buffer layer exists thinly between the electrode and the organic semiconductor layer, and its thickness is from 0.1 nm to 30 nm, and preferably from 0.3 nm to 20 nm.

(Insulator Layer)

A material of the insulator layer in the organic TFT of the present invention is not particularly limited so far as it is electrically insulative and can be formed as a thin film. Materials having an electric resistivity of 10 Ωcm or more at room temperature, such as metal oxides (including an oxide of silicon), metal nitrides (including a nitride of silicon), polymers, and organic low-molecular weight compounds, can be used; and inorganic oxide films having a high relative dielectric constant are especially preferable.

Examples of the inorganic oxide include silicon oxide, aluminum oxide, tantalum oxide, titanium oxide, tin oxide, vanadium oxide, barium strontium titanate, zirconic acid barium titanate, zirconic acid lead titanate, lanthanum lead titanate, strontium titanate, barium titanate, lanthanum oxide, fluorine oxide, magnesium oxide, bismuth oxide, bismuth titanate, niobium oxide, bismuth strontium titanate, bismuth strontium tantalate, tantalum pentoxide, tantalic acid bismuth niobate, trioxide yttrium and combinations thereof, with silicon oxide, aluminum oxide, tantalum oxide and titanium oxide being preferable.

Also, inorganic nitrides such as silicon nitrides (for example, $Si_3N_4$ or $Si_xN_y$ (x, y>0)), and aluminum nitride can be suitably used.

Furthermore, the insulator layer may be formed of a precursor including a metal alkoxide. For example, the insulator layer is formed by coating a solution of this precursor on a substrate and subjecting this to a chemical solution treatment including a heat treatment.

The metal of the foregoing metal alkoxide is, for example, selected among transition metals, lanthanoids or main group elements. Specific examples thereof include barium (Ba), strontium (Sr), titanium (Ti), bismuth (Bi), tantalum (Ta), zirconium (Zr), iron (Fe), nickel (Ni), manganese (Mn), lead (Pb), lanthanum (La), lithium (Li), sodium (Na), potassium (K), rubidium (Rb), cesium (Cs), francium (Fr), beryllium (Be), magnesium (Mg), calcium (Ca), niobium (Nb), thallium (Tl), mercury (Hg), copper (Cu), cobalt (Co), rhodium (Rh), scandium (Sc), yttrium (Y), etc. Also, examples of the alkoxide in the foregoing metal alkoxide include those derived from alcohols, for example, methanol, ethanol, propanol, isopropanol, butanol, isobutanol, etc.; alkoxy alcohols, for example, methoxyethanol, ethoxyethanol, propoxyethanol, butoxyethanol, pentoxyethanol, heptoxyethanol, methoxypropanol, ethoxypropanol, propoxypropanol, butoxypropanol, pentoxypropanol, heptoxypropanol, etc.; and so on.

In the present invention, when the insulator layer is constituted of the foregoing material, polarization is easily generated in the insulator layer, whereby the threshold voltage of the organic TFT operation can be reduced. Also, in particular, when the insulator layer is formed of a silicon nitride such as $Si_3N_4$, $Si_xN_y$, and $SiON_x$ (x, y>0) among the foregoing materials, the polarization is more easily generated, whereby the threshold voltage can be more reduced.

With respect to the insulator layer using an organic compound, polyimides, polyamides, polyesters, polyacrylates, photo radical polymerization based or photo cationic polymerization based photocurable resins, copolymers containing an acrylonitrile component, polyvinyl phenol, polyvinyl alcohol, novolak resins, cyanoethyl pullulan, etc. can also be used. Besides, in addition to waxes, polyethylene, polychloroprene, polyethylene terephthalate, polyoxymethylene, polyvinyl chloride, polyvinylidene fluoride, polysulfone, polycarbonate, polyimide cyanoethyl pullulan, poly(vinyl phenol) (PVP), poly(methyl methacrylate) (PMMA), polycarbonate (PC), polystyrene (PS), polyolefins, polyacrylamide, poly(acrylic acid), novolak resins, resol resins, polyimides, polyxylylene and epoxy resins, polymer materials having a high dielectric constant, such as pullulan, can be used.

With respect to the material of the insulator layer, organic compounds having water repellency are especially preferable. When the material has water repellency, an interaction between the insulator layer and the channel control layer is suppressed, and the amorphous properties which the channel control layer originally possesses can be kept; and therefore, the device performance can be enhanced while revealing the function of the channel control layer. Examples thereof include polyparaxylylene derivatives described in Yasuda, et al., *Jpn. J. Appl. Phys.*, Vol. 42 (2003), pages 6614 to 6618; and those described in Janos Veres, et al., *Chem. Mater.*, Vol. 16 (2004), pages 4543 to 4555.

Figure 1:
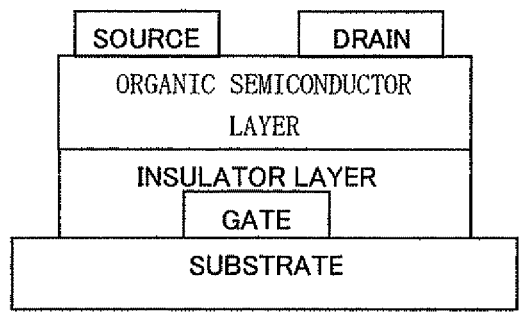
FIG. 1 is a view showing an embodiment of a device configuration of a general organic TFT.
Figure 2:
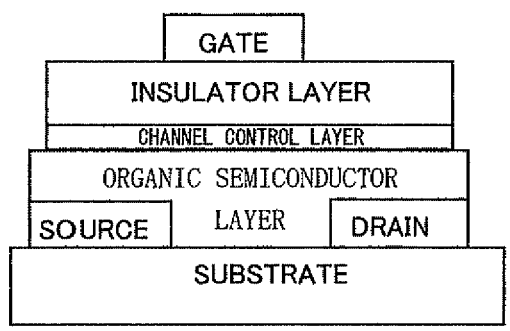
FIG. 2 is a view showing an embodiment of a device configuration of an organic TFT of the present invention.
Figure 3:
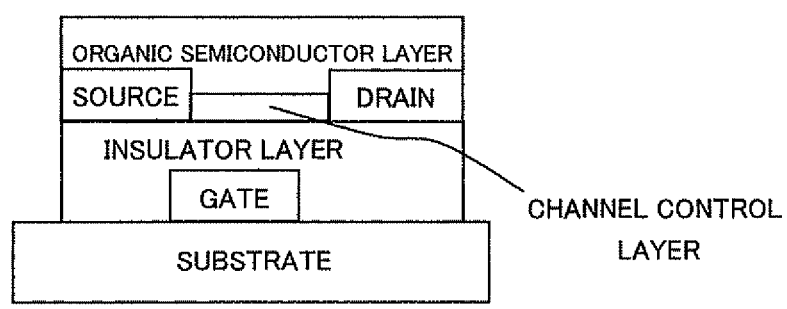
FIG. 3 is a view showing an embodiment of a device configuration of an organic TFT of the present invention.
Figure 5:
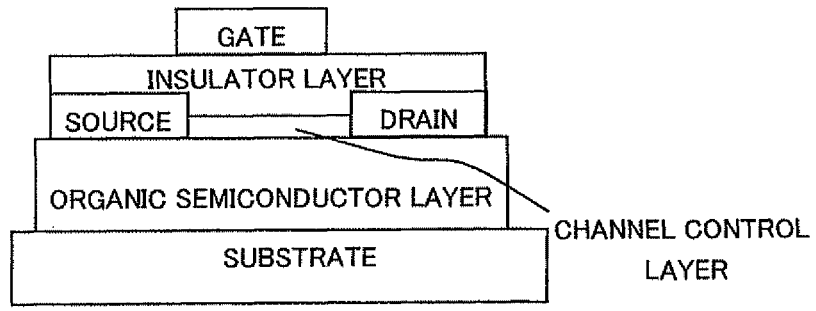
FIG. 5 is a view showing an embodiment of a device configuration of an organic TFT of the present invention.

Also, when a top gate structure as shown in FIGS. 2 and 5 is used, the use of such an organic compound as the material of the insulator layer is an effective method because the deposition can be carried out while minimizing the damage given to the organic semiconductor layer.

The foregoing insulator layer may be a mixed layer using a plurality of the foregoing inorganic or organic'compound materials or may be of a laminated structure thereof. In that case, the performance of the device can be controlled by mixing a material having a high dielectric constant and a material having water repellency or laminating the both as the need arises.

Also, the foregoing insulator layer may be an anodic oxide film or may include the instant anodic oxide film as a constituent. It is preferable that the anodic oxide film is subjected to a sealing treatment. The anodic oxide film is formed by anodically oxidizing an anodic oxidizable metal by a known method. Examples of the anodic oxidizable metal include aluminum and tantalum. The method of the anodic oxidation treatment is not particularly limited, and known methods can be adopted. By carrying out the anodic oxidation treatment, an oxide film is formed. As an electrolytic solution which is used for the anodic oxidation treatment, any material can be used so far as it is able to form a porous oxide film. In general, sulfuric acid, phosphoric acid, oxalic acid, chromic acid, boric acid, sulfamic acid, benzenesulfonic acid, etc., or mixed acids composed of a combination of two or more kinds of those acids or salts thereof are useful. The treatment condition of the anodic oxidation variously varies depending upon the electrolytic solution to be used and cannot be unequivocally specified. However, in general, it is appropriate that a concentration of the electrolytic solution is in the range of from 1 to 80% by mass; that the temperature of the electrolytic solution is in the range of from 5 to 70° C.; that a current density is in the range of from 0.5 to 60 $A/cm^2$; that a voltage is in the range of from 1 to 100 volts; and that an electrolysis time is in the range of from 10 seconds to 5 minutes. A preferred anodic oxidation treatment is a method for carrying out the treatment with a direct current by using, as the electrolytic solution, an aqueous solution of sulfuric acid, phosphoric acid or boric acid; however, an alternating current can also be applied. A concentration of such an acid is preferably from 5 to 45% by mass; and it is preferable that the electrolysis treatment is carried out at a temperature of the electrolytic solution of from 20 to 50° C. and a current density of from 0.5 to 20 $A/cm^2$ for from 20 to 250 seconds.

With respect to a thickness of the insulator layer, when the thickness of the layer is thin, an effective voltage which is applied to the organic semiconductor becomes large, and therefore, it is possible to lower a driving voltage and a threshold voltage of the device itself. However, on the contrary, a leak current between the source and the gate becomes large. Therefore, it is necessary to select an appropriate thickness of the film. The thickness of the film is usually from 10 nm to 5 μm, preferably from 50 nm to 2 μm, and more preferably from 100 nm to 1 μm.

Examples of the method for forming the foregoing insulator layer include dry processes such as a vacuum vapor deposition method, a molecular beam epitaxial growth method, an ion cluster beam method, a low energy ion beam method, an ion plating method, a CVD method, a sputtering method, an atmospheric pressure plasma method disclosed in JP-A-11-61406, JP-A-11-133205, JP-A-2000-121804, JP-A-2000-147209 and JP-A-2000-185362; and wet processes such as methods by coating, for example, a spray coating method, a spin coating method, a blade coating method, a dip coating method, a casting method, a roller coating method, a bar coating method, a die coating method, etc., and methods by patterning, for example, printing, inkjetting, etc. These processes can be adopted depending upon the material. As the wet process, a method of coating a solution prepared by dispersing fine particles of an inorganic oxide in an arbitrary organic solvent or water while optionally using a dispersing agent such as a surfactant and drying it; and a so-called sol-gel method of coating a solution of an oxide precursor, for example, an alkoxide and drying it are useful.

(Formation Process of Organic TFT)

A method for forming the organic TFT of the present invention is not particularly limited but may be carried out in accordance with a known method. It is preferable that the formation is carried out in accordance with a desired device configuration through a series of device preparation steps including charging a substrate, forming a gate electrode, forming an insulator layer, forming a channel control layer, forming an organic semiconductor layer, forming a source electrode and forming a drain electrode without utterly coming into contact with the air because the hindrance of a device performance to be caused due to the moisture or oxygen or the like in the air upon contact with the air can be prevented. When it is unable to evade the contact with the air once, it is preferable that steps after the deposition of the organic semiconductor layer are a step in which the organic semiconductor layer is not brought into contact with the air at all; and that just before the deposition of the organic semiconductor layer, the surface on which the organic semiconductor layer is laminated (for example, in the case of the device B, the surface of the insulating layer on which are partially laminated the source electrode and the drain electrode) is cleaned and activated by means of irradiation with ultraviolet rays, irradiation with ultraviolet rays/ozone, oxygen plasma, argon plasma, etc., and the organic semiconductor layer is then laminated. Also, among the p-type TFT materials, there is a material whose performance is enhanced upon being once brought into contact with the air to adsorb oxygen, etc., and therefore, the material is properly brought into contact with the air depending upon its kind.

Furthermore, for example, taking into consideration influences of oxygen, water, etc. contained in the air against the organic semiconductor layer, a gas barrier layer may be formed entirely or partially on the peripheral surface of the organic transistor device. As a material for forming the gas barrier layer, those which are commonly used in this field can be used, and examples thereof include polyvinyl alcohol, an ethylene-vinyl alcohol copolymer, polyvinyl chloride, polyvinylidene chloride, polychlorotrifluoroethylene, etc. Furthermore, the inorganic materials having insulating properties, which are exemplified in the foregoing insulator layer, can be used, too.

EXAMPLES

Example 1-1

Manufacture Of First Organic TFT

An organic thin film transistor was prepared according to the following procedures. First of all, the surface of an Si substrate (p-type also serving as a gate electrode, specific resistivity: 1 Ωcm) was oxidized by a thermal oxidation method to prepare a 300 nm-thick thermally oxidized film on the substrate, thereby forming an insulator layer. Furthermore, after completely removing the $SiO_2$ film deposited on one surface of the substrate by means of dry etching, chromium was deposited in a thickness of 20 nm thereon by a sputtering method; and gold (Au) was further deposited in a thickness of 100 nm thereon by means of sputtering, thereby forming a lead-out electrode. This substrate was ultrasonically cleaned with a neutral detergent, pure water, acetone and ethanol each for 30 minutes and further subjected to cleaning with ozone.

Figure 6:
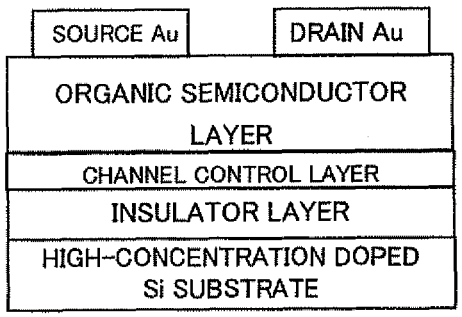
FIG. 6 is a view showing an embodiment of a device configuration of an organic TFT in the Examples of the present invention.

Subsequently, the foregoing substrate was placed in a vacuum vapor deposition apparatus (EX-400, manufactured by ULVAC, Inc.), and the foregoing Compound (2) (Ip=5.44 eV, Tg=126° C.) exemplified as a compound to be used for the first organic TFT was deposited in a thickness of 10 nm as a channel control layer on the insulator layer at a vapor deposition rate of 0.05 nm/s. Subsequently, PTCDI-C13 (shown below) was deposited in a thickness of 50 nm as an organic semiconductor layer at a vapor deposition rate of 0.05 nm/s. Finally, gold was deposited in a thickness of 50 nm through a metal mask, thereby forming a source electrode and a drain electrode which did not come into contact with each other at an interval (channel length L) of 75 μm. At that time, the deposition was carried out such that a width (channel width W) between the source electrode and the drain electrode was 5 mm, thereby preparing an organic thin film transistor (see FIG. 6).

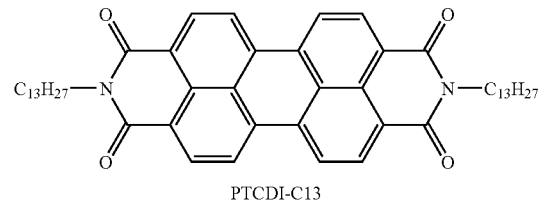

PTCDI-C13

A gate voltage of from 0 to 100 V was applied to the gate electrode of the obtained organic thin film transistor, and a voltage was applied between the source and the drain, thereby allowing a current to flow therethrough. In that case, electrons are induced in a channel region (between the source and the drain) of the organic semiconductor layer, whereby the organic thin film transistor works as an n-type transistor. As a result, an ON/OFF ratio of the current between the source and drain electrodes in a current saturation region was $3 \times 10^5$. Also, an field-effect mobility μ of the electron was calculated in accordance with the following expression (A). As a result, it was found to be $8.3 \times 10^{-2}$ cm$^2$/Vs.

$$I_D = (W/2L) \cdot C\mu \cdot (V_G - V_T)^2 \quad (A)$$

In the expression, $I_D$ represents a current between the source and the drain; W represents a channel width; L represents a channel length; C represents an electric capacitance per unit area of the gate insulator layer; $V_T$ represents a gate threshold voltage; and $V_G$ represents a gate voltage.

Furthermore, this organic TFT was stored in vacuo at 100° C. for 500 hours. As a result, the mobility still kept a high value as $4.3 \times 10^{-2}$ cm$^2$/Vs

Example 1-2

Manufacture of First Organic TFT

A device was prepared in exactly the same manner as in Example 1-1, except that Compound (24) (5.69 eV, Tg=157° C.) was used as the material of the organic semiconductor layer for the channel control layer in place of the Compound (2).

Example 1-3

Manufacture of First Organic TFT

A device was prepared in exactly the same manner as in Example 1-1, except that C60 (fullerene) was used as the organic semiconductor in place of the PTCDI-C13. This organic semiconductor is used as an n-type. Transistor characteristics are shown in Table 1.

Comparative Example 1-1

Manufacture of Organic TFT

An organic TFT was prepared in exactly the same manner as in Example 1-1, except that the channel control layer was not used. Results are shown in Table 1.

Comparative Example 1-2

Manufacture of Organic TFT

An organic TFT was prepared in exactly the same manner as in Example 1-1, except that TCTA (shown below, Ip=5.80 eV, Tg=151° C.) was used in place of the Compound (2). Results are shown in Table 1.

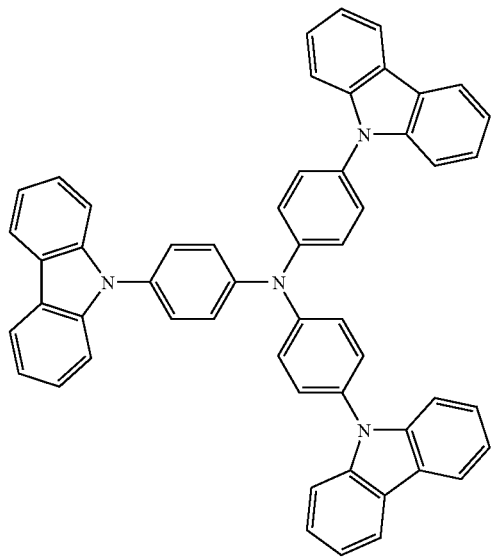

TCTA

Comparative Example 1-3

Manufacture of Organic TFT

An organic TFT was prepared in exactly the same manner as in Example 1-1, except that NPD (shown below, Ip=5.45 eV, Tg=95° C.) was used in place of the Compound (2). Results are shown in Table 1.

TABLE 1

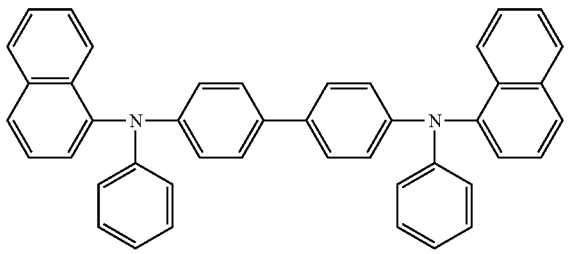 [SMILES: c1ccc(N(c2ccc(-c3ccc(N(c4ccccc4)c4cccc5ccccc45)cc3)cc2)c2cccc3ccccc23)cc1]

| | Channel control layer | | | | Mobility immediately | Mobility after a lapse |
| | Amorphous organic compound | Ip (eV) | Tg (° C.) | Organic semiconductor | after the preparation (cm$^2$/Vs) | of 500 hours (cm$^2$/Vs) |
| --- | --- | --- | --- | --- | --- | --- |
| Example 1-1 | Compound (2) | 5.44 | 126 | PTCDI-C13 | 0.2 | $4.3 \times 10^{-2}$ |
| Example 1-2 | Compound (24) | 5.69 | 157 | PTCDI-C13 | 0.11 | $6.3 \times 10^{-2}$ |
| Example 1-3 | Compound (2) | 5.44 | 126 | C60 | 1.5 | 0.3 |
| Comparative Example 1-1 | None | — | — | PTCDI-C13 | $1.8 \times 10^{-2}$ | $6.2 \times 10^{-3}$ |
| Comparative Example 1-2 | TCTA | 5.80 | 151 | PTCDI-C13 | $6.0 \times 10^{-3}$ | $2.5 \times 10^{-3}$ |
| Comparative Example 1-3 | NPD | 5.45 | 95 | PTCDI-C13 | 0.13 | $2.5 \times 10^{-6}$ |

From Table 1, it has become clear that in the devices provided with a channel control layer having an Ip of less than 5.8, the mobility is enhanced, and in particular, when Tg is 100° C. or higher, the storage stability at high-temperature storage at 100° C. is enhanced. In Comparative Example 1-3, though the mobility was high in the initial state, it was significantly lowered at high-temperature storage.

Example 2-1

Manufacture of Second Organic TFT

An organic thin film transistor was prepared according to the following procedures. First of all, the surface of an Si substrate (p-type also serving as a gate electrode, specific resistivity: 1 Ωcm) was oxidized by a thermal oxidation method to prepare a 300 nm-thick thermally oxidized film on the substrate, thereby forming an insulator layer. Furthermore, after completely removing the SiO$_2$ film deposited on one surface of the substrate by means of dry etching, chromium was deposited in a thickness of 20 nm thereon by a sputtering method; and gold (Au) was further deposited in a thickness of 100 nm thereon by means of sputtering, thereby forming a lead-out electrode. This substrate was ultrasonically cleaned with a neutral detergent, pure water, acetone and ethanol each for 30 minutes and further subjected to cleaning with ozone.

Subsequently, a solution of 0.6% by mass of a polymer amorphous organic compound having a repeating unit represented by the following formula (TFB, ionization potential (Ip)=5.31 eV, weight average molecular weight: 30,000) dissolved in xylene was deposited on the insulator layer using a spin coater at a number of revolutions of 1,500 rpm for 30 seconds and then dried at 180° C. for 30 minutes, thereby depositing a 20 nm-thick channel control layer.

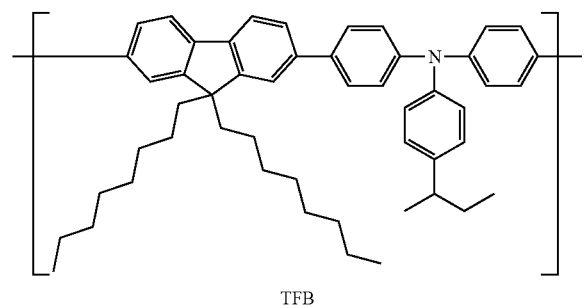

TFB

Subsequently, the foregoing substrate having TFB deposited thereon was placed in a vacuum vapor deposition apparatus (EX-400, manufactured by ULVAC, Inc.), and PTCDI-C13 represented by the following formula was deposited in a thickness of 50 nm as an organic semiconductor layer at a vapor deposition rate of 0.05 nm/s. Finally, gold was deposited in a thickness of 50 nm through a metal mask, thereby forming a source electrode and a drain electrode which did not come into contact with each other at an interval (channel length L) of 75 μm. At that time, the deposition was carried out such that a width (channel width W) between the source electrode and the drain electrode was 5 mm, thereby preparing an organic thin film transistor (see FIG. 6).

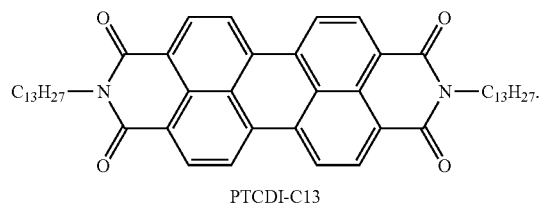

PTCDI-C13

A gate voltage of from 0 to 100 V was applied to the gate electrode of the obtained organic thin film transistor, and a voltage was applied between the source and the drain, thereby allowing a current to flow therethrough. In that case, electrons are induced in a channel region (between the source and the drain) of the organic semiconductor layer, whereby the organic thin film transistor works as an n-type transistor. As a result, an ON/OFF ratio of the current between the source and drain electrodes in a current saturation region was $5 \times 10^5$. Also, an field-effect mobility μ of the electron was calculated in accordance with the following expression (A). As a result, it was found to be $8.3 \times 10^{-2}$ cm$^2$/Vs.

$$I_D = (W/2L) \cdot C\mu \cdot (V_G - V_T)^2 \quad (A)$$

In the expression, $I_D$ represents a current between the source and the drain; W represents a channel width; L represents a channel length; C represents an electric capacitance per unit area of the gate insulator layer; $V_T$ represents a gate threshold voltage; and $V_G$ represents a gate voltage. Furthermore, this organic TFT was stored at 50° C. for 200 hours. As a result, the mobility still kept a high value as $4.3 \times 10^{-2}$ cm$^2$/Vs.

Example 2-2

Manufacture of Second Organic TFT

An organic thin film transistor was prepared in exactly the same manner as in Example 2-1, except that PCBM represented by the following formula was used as the material of the organic semiconductor layer in place of the PTCDI-C13.

With respect to the PCBM layer, PCBM was dissolved in a concentration of 10 mg/mL in chloroform; and the solution was deposited using a spin coater at a number of revolutions of 2,000 rpm for 60 seconds and then dried at 120° C. for 0 minute, thereby depositing a 100 nm-thick organic semiconductor layer. Results are shown in Table 2.

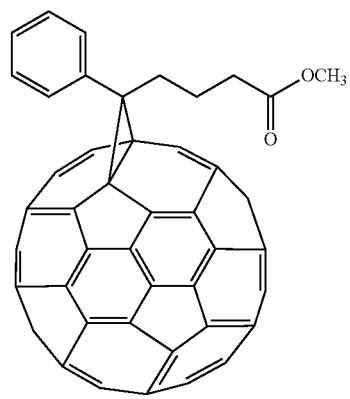

PCBM

Example 2-3

Manufacture of Second Organic TFT

An organic thin film transistor was prepared in exactly the same manner as in Example 2-1, except that C60 was used as the material of the organic semiconductor layer in place of the PTCDI-C13 and that an amorphous organic compound represented by the following formula (i) (Ip=5.29 eV, molecular weight: 1,355.71) was used for the channel control layer in place of the TFB. Results are shown in Table 2.

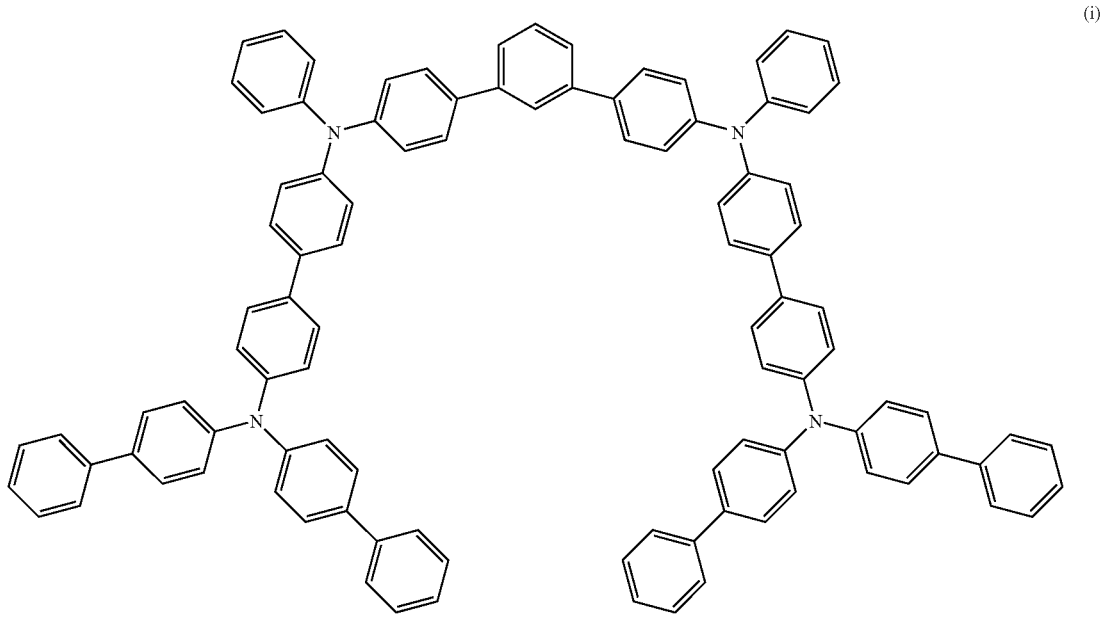 [SMILES: c1ccc(-c2ccc(N(c3ccc(-c4ccccc4)cc3)c3ccc(-c4ccc(N(c5ccccc5)c5ccc(-c6cccc(-c7ccc(N(c8ccccc8)c8ccc(-c9ccc(N(c%10ccc(-c%11ccccc%11)cc%10)c%10ccc(-c%11ccccc%11)cc%10)cc9)cc8)cc7)c6)cc5)cc4)cc3)cc2)cc1]

(i)

Example 2-4

Manufacture of Second Organic TFT

A device prepared in exactly the same manner as in Example 2-1, except that C60 was used as the material of the organic semiconductor layer in place of the PTCDI-C13 and that an amorphous organic compound represented by the following formula (ii) (Ip=5.16 eV, molecular weight: 1,820.43) was used for the channel control layer in place of the TFB.

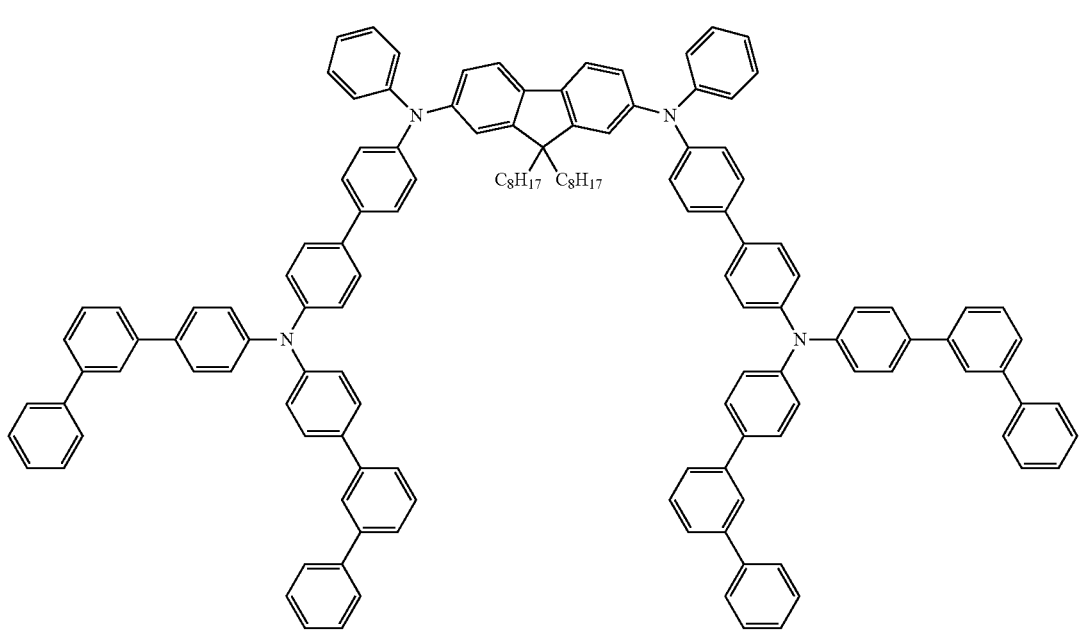

(ii)

Example 2-5

Manufacture of Second Organic TFT

A device prepared in exactly the same manner as in Example 2-1, except that a photo-crosslinked material of a low-molecular weight compound represented by the following formula (iii) (Ip=5.45 eV, weight average molecular weight: 100,000) was used in place of the TFB and that PCBM was used as the organic semiconductor in place of the PTCDI-C13. The deposition method of PCBM is the same as in Example 2-2.

Example 2-6

Manufacture of Second Organic TFT

A device was prepared in exactly the same manner as in Example 2-1, except that an oxidizing agent-crosslinked material of the low-molecular weight compound represented by the foregoing formula (iii) (Ip=5.45 eV, weight average molecular weight: 80,000) was used in place of the TFB. The oxidizing agent-crosslinking of the low-molecular weight compound represented by the foregoing formula (iii) was carried out in the following manner. 2 g of a THF solution (4%

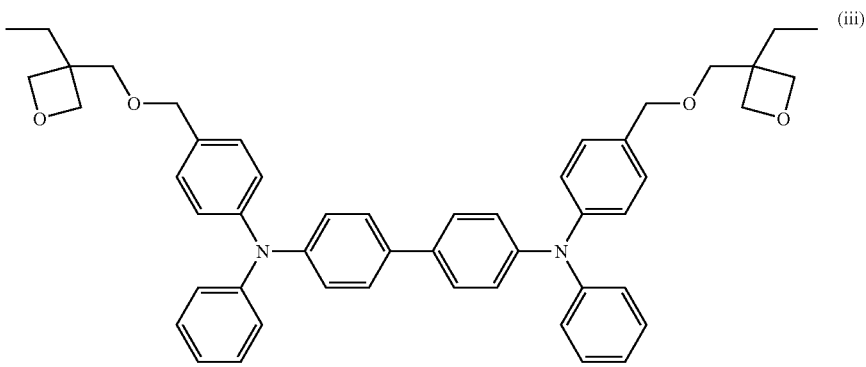 [SMILES: CCC1(COCc2ccc(N(c3ccccc3)c3ccc(-c4ccc(N(c5ccccc5)c5ccc(COCC6(CC)COC6)cc5)cc4)cc3)cc2)COC1]

(iii)

The photo-crosslinking of the low-molecular weight compound represented by the foregoing formula (iii) was carried out in the following manner. 2 g of a THF solution (4% by mass) of the low-molecular weight compound represented by the foregoing formula (iii) and 2 g of a chloroform solution (0.1% by mass) of, as an initiator, {4-[(2-hydroxytetradecyl)oxy]phenyl}phenyl iodonium hexafluoroanitimonate were mixed, and a proper amount of the mixture was dropped and deposited using a spin coater at a number of revolutions of 1,500 rpm for 30 seconds. Thereafter, the film was exposed for 3 seconds using a standard UV hand lamp having a 4-W tube (UV-A, 365 nm) while setting up an interval between the substrate and the exposure source at 5 cm. In order to complete the crosslinking process, the film was conditioned at 100° C. for about one minute. Thereafter, THF was dropped on the film using a spin coater by means of dripping of an adequate solvent amount, and the film was subjected to a rinse treatment twice by a spin coater at 1,500 rpm for 30 seconds, followed by drying at 80° C. for 15 minutes. This process step was carried out under an inert gas. Transistor characteristics are shown in Table 2.

by mass) of the low-molecular weight compound and 2 g of a chloroform solution (0.012% by mass) of nitrosonium hexafluoroantimonate ($NO^+SbF_6^-$) were mixed, and a proper amount of the mixture was dropped and deposited using a spin coater at a number of revolutions of 1,500 rpm for 30 seconds, followed by drying at 100° C. for 30 minutes. Thereafter, chloroform was dropped on the film, and the film was subjected to a rinse treatment twice by a spin coater at 1,500 rpm for 30 seconds, followed by drying at 80° C. for 15 minutes.

This process step was carried out under an inert gas. Transistor characteristics are shown in Table 2.

Example 2-7

A device was prepared in exactly the same manner as in Example 2-1, except that a polymer compound having a repeating unit represented by the foregoing formula (iv) (Ip=5.50 eV, weight average molecular weight: 120,000) was used in place of the TFB. Transistor characteristics are shown in Table 2.

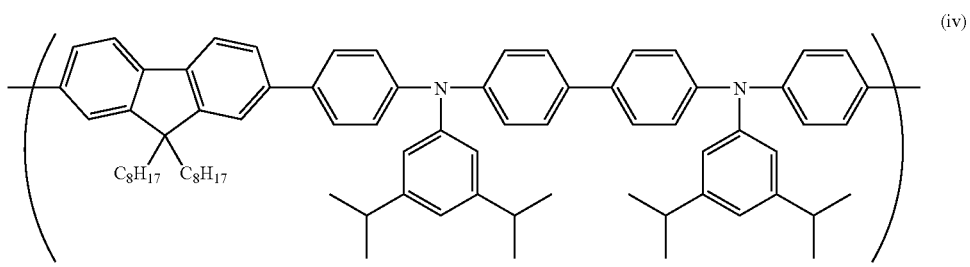

Comparative Example 2-1

An organic TFT was prepared in exactly the same manner as in Example 2-1, except that the channel control layer was not used. Results are shown in Table 2.

Comparative Example 2-2

An organic TFT was prepared in exactly the same manner as in Example 2-2, except that NPD represented by the following formula (Ip=5.45 eV, molecular weight: 588.74) was used in place of the TFB. When PCBM was deposited by means of coating, NPD of the channel control layer was eroded by a PCBM coating operation, and the PCBM film became non-uniform and did not exhibit FET characteristics. Results are shown in Table 2.

TABLE 2

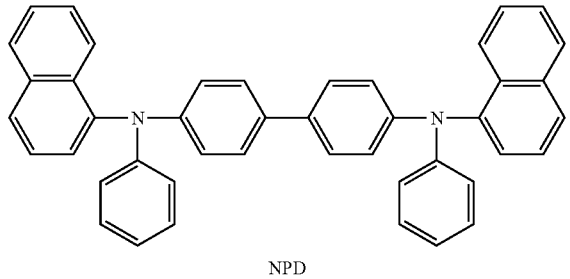 [SMILES: c1ccc(N(c2ccc(-c3ccc(N(c4ccccc4)c4cccc5ccccc45)cc3)cc2)c2cccc3ccccc23)cc1 ; "NPD"]

NPD

| | Channel control layer | | | | Mobility immediately after the preparation ($cm^2/Vs$) | Mobility after a lapse of 2000 hours at 50° C. ($cm^2/Vs$) |
|---|---|---|---|---|---|---|
| | Amorphous organic compound | Ip (eV) | Molecular weight | Organic semiconductor layer | | |
| Example 2-1 | TFB | 5.31 | 30,000 | PTCDI-C13 | 0.3 | $8.3 \times 10^{-2}$ |
| Example 2-2 | TFB | 5.31 | 30,000 | PCBM (coated) | 0.12 | $6.4 \times 10^{-2}$ |
| Example 2-3 | Formula (i) | 5.29 | 1,355.71 | C60 | 1.4 | 0.25 |
| Example 2-4 | Formula (ii) | 5.16 | 1,820.43 | C60 | 1.1 | 0.30 |
| Example 2-5 | Photo-crosslinked material of formula (iii) | 5.45 | 100,000 | PCBM (coated) | 0.11 | $8.2 \times 10^{-2}$ |
| Example 2-6 | Oxidizing agent-crosslinked material of formula (iii) | 5.45 | 80,000 | PTCDI-C13 | 0.34 | $7.2 \times 10^{-2}$ |
| Example 2-7 | Formula (iv) | 5.50 | 120,000 | PTCDI-C13 | 0.25 | $6.0 \times 10^{-2}$ |
| Comparative Example 2-1 | None | — | — | PTCDI-C13 | $4.0 \times 10^{-2}$ | $1.0 \times 10^{-4}$ |
| Comparative Example 2-2 | NPD | 5.45 | 588.74 | PCBM (coated) | No FET characteristics were revealed. | — |

From Table 2, it has become clear that in the devices provided with a channel control layer having an Ip of less than 5.8, the mobility is enhanced and that when a compound having a molecular weight of 1,000 or more is used, the storage stability is enhanced.

INDUSTRIAL APPLICABILITY

As has been described in detail, since the organic TFT of the present invention has a high mobility and high storage stability, it is useful as a transistor.

The invention claimed is:

1. An organic thin film transistor comprising a substrate having thereon at least three terminals of a gate electrode, a source electrode and a drain electrode, an insulator layer and an organic semiconductor layer, with a current between a source and a drain being controlled upon applying a voltage to the gate electrode, wherein a channel control layer including an amorphous organic compound having an ionization potential of less than 5.8 eV is provided between the organic semiconductor layer and the insulator layer, wherein the molecular weight of the amorphous organic compound is 1,000 or more and the thickness of the channel control layer is 20 nm to 100 nm.

2. The organic thin film transistor according to claim 1, wherein a glass transition temperature of the amorphous organic compound is 100° C. or higher.

3. The organic thin film transistor according to claim 2, wherein the amorphous organic compound is an amino group-containing organic compound.

4. The organic thin film transistor according to claim 2, wherein the amorphous organic compound is a condensed aromatic ring-containing hydrocarbon compound.

5. The organic thin film transistor according to claim 1, wherein the amorphous organic compound is an amino group-containing organic compound.

6. The organic thin film transistor according to claim 1, wherein the amorphous organic compound is a condensed aromatic ring-containing hydrocarbon compound.

7. The organic thin film transistor according to claim 1, wherein the organic semiconductor layer includes an organic semiconductor having n-channel driving capability.

8. The organic thin film transistor according to claim 5, wherein the amorphous organic compound is represented by the following general formula (A):

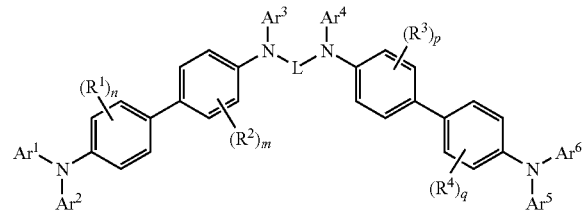

(A)

wherein
each of $Ar^1$ to $Ar^6$ independently represents a substituted or unsubstituted aryl group having from 6 to 40 ring carbon atoms or a substituted or unsubstituted heteroaryl group having from 3 to 40 ring carbon atoms, and $Ar^1$ and $Ar^2$, and $Ar^5$ and $Ar^6$, are each optionally connected to each other via a single bond to form a carbazolyl group;

each of $R^1$ to $R^4$ independently represents a halogen atom, a carboxyl group, an amino group, a hydroxyl group, a substituted or unsubstituted alkyl group having from 1 to 40 carbon atoms, a substituted or unsubstituted alkenyl group having from 2 to 40 carbon atoms, a substituted or unsubstituted alkynyl group having from 2 to 40 carbon atoms or a substituted or unsubstituted alkoxy group having from 1 to 40 carbon atoms;

each of n, m, p and q represents an integer of from 0 to 4; and

L represents a divalent connecting group represented by the following general formula (B) or general formula (C):

$$—(Ar^7)_a—(Ar^8)_b—(Ar^9)_c—$$ (B)

wherein
each of $Ar_7$ to $Ar_9$ independently represents a substituted or unsubstituted divalent aryl group having from 6 to 40 ring carbon atoms or a substituted or unsubstituted divalent heteroaryl group having from 3 to 40 ring carbon atoms; and
each of a, b and c independently represents an integer of from 1 to 3; and

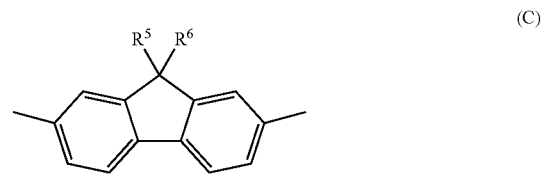

(C)

wherein
each of $R^5$ and $R^6$ independently represents a halogen atom, a carboxyl group, an amino group, a hydroxyl group, a substituted or unsubstituted alkyl group having from 1 to 40 carbon atoms, a substituted or unsubstituted alkenyl group having from 2 to 40 carbon atoms, a substituted or unsubstituted alkynyl group having from 2 to 40 carbon atoms or a substituted or unsubstituted alkoxy group having from 1 to 40 carbon atoms; and
$R^5$ and $R^6$ may be connected to each other to form a cyclic structure.

9. The organic thin film transistor according to claim 5, wherein the amorphous organic compound is an amino group-containing polymer compound having a repeating unit represented by the following general formula (D) or (E):

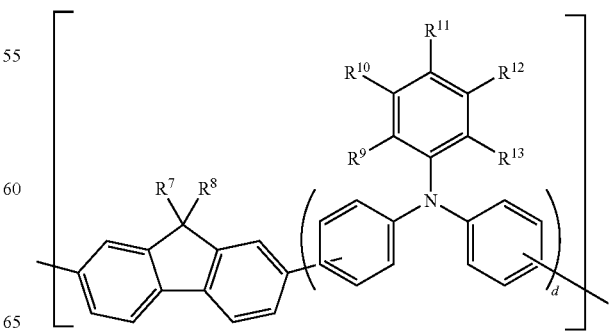

(D)

wherein each of $R^7$ to $R^{13}$ independently represents a hydrogen atom, a halogen atom, an alkyl group having from 1 to 20 carbon atoms, an alkenyl group having from 1 to 20 carbon atoms, an alkynyl group having from 1 to 20 carbon atoms, a haloalkyl group having from 1 to 20 carbon atoms, an alkoxyl group having from 1 to 30 carbon atoms or a group having a carbonyl group having from 1 to 20 carbon atoms, and adjacent groups in $R^9$ to $R^{13}$ may form a saturated or unsaturated cyclic structure with each other; and d is 1 or 2; and

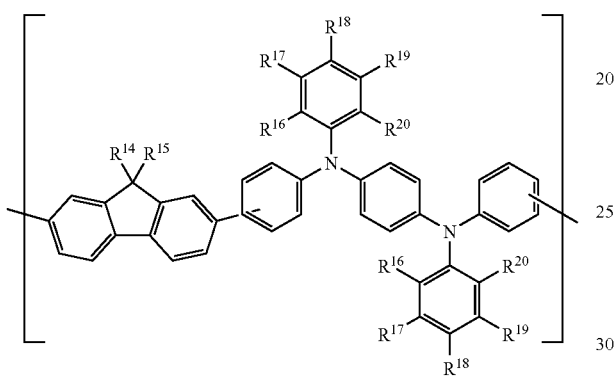

(E)

wherein each of $R^{14}$ to $R^{20}$ independently represents a hydrogen atom, a halogen atom, an alkyl group having from 1 to 20 carbon atoms, an alkenyl group having from 1 to 20 carbon atoms, an alkynyl group having from 1 to 20 carbon atoms, a haloalkyl group having from 1 to 20 carbon atoms, an alkoxyl group having from 1 to 30 carbon atoms or a group having a carbonyl group having from 1 to 20 carbon atoms, and adjacent groups in $R^{16}$ to $R^{20}$ may form a saturated or unsaturated cyclic structure with each other.

10. The organic thin film transistor according to claim 5, wherein the amorphous organic compound is a compound obtained by crosslinking an amino group-containing low-molecular weight compound having a crosslinking site.

11. The organic thin film transistor according to claim 10, wherein the crosslinking site of the amino group-containing low-molecular weight compound is a group represented by any one of the following general formulae (1) to (4):

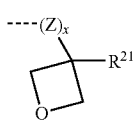

(1)

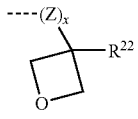

(2)

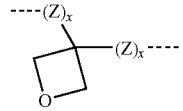

(3)

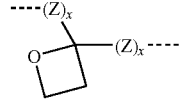

(4)

wherein each $R^{21}$ is the same or different at every appearance and represents a hydrogen atom, a linear, branched or cyclic alkyl group, alkoxyalkyl group, alkoxy group or thioalkoxy group each having from 1 to 20 carbon atoms, an aryl group or a heteroaryl group each having from 4 to 18 aromatic ring atoms or an alkenyl group having from 2 to 10 carbon atoms, wherein one or more hydrogen atoms are each optionally replaced by a halogen or CN, and one or more non-adjacent carbon atoms are each optionally replaced by —O—, —S—, —CO—, —COO— or —O—CO—;

each $R^{22}$ is the same or different at every appearance and represents a hydrogen atom, a linear, branched or cyclic alkyl group or alkoxyalkyl group each having from 1 to 20 carbon atoms, an aryl group or a heteroaryl group each having from 4 to 18 aromatic ring atoms or an alkenyl group having from 2 to 10 carbon atoms, wherein one or more hydrogen atoms are each optionally replaced by a halogen or CN, and one or more non-adjacent carbon atoms are each optionally replaced by —O—, —S—, —CO—, —COO— or —O—CO—; each Z is the same or different at every appearance and represents a divalent group —($CR^{23}R^{24}$)$_r$— (wherein one or more non-adjacent carbon atoms may be substituted with —O—, —S—, —CO—, —COO— or —O—CO—) or a divalent aryl group or N-, S- and/or O-heteroaryl group each having from 4 to 40 carbon atoms (which is optionally substituted with one or more $R^{23}$ groups;

each of $R^{23}$ and $R^{24}$ is the same or different at every appearance and represents a hydrogen atom, a linear, branched or cyclic alkyl group, alkoxy group, alkoxyalkyl group or thioalkoxy group each having from 1 to 20 carbon atoms, an aryl group or a heteroaryl group each having from 4 to 20 aromatic ring atoms or an alkenyl group having from 2 to 10 carbon atoms, wherein one or more hydrogen atoms are each optionally replaced by a halogen or CN; the $R^{23}$ or $R^{24}$ group may form a cyclic structure each other or together with $R^{21}$ or $R^{22}$;

each r is the same or different at every appearance and represents an integer of from 0 to 30;

each x is the same or different at every appearance and represents an integer of from 0 to 5; and each broken line represents a bond to the low-molecular weight compound.

12. The organic thin film transistor according to claim 10, wherein the amorphous organic compound is a crosslinked material obtained by crosslinking the amino group-containing low-molecular weight compound by the addition of at least one onium compound.

13. The organic thin film transistor according to claim 1, wherein the interval between the source electrode and the drain electrode is from 0.1 µm to 1 mm.

14. The organic thin film transistor according to claim 1, wherein the interval between the source electrode and the drain electrode is from 1 µm to 100 µm.

15. The organic thin film transistor according to claim 1, wherein the amorphous organic compound has an ionization potential of less than 5.7 eV.

16. The organic thin film transistor according to claim 1, wherein the amorphous organic compound has an ionization potential of less than 5.5 eV.

17. The organic thin film transistor according to claim 1, wherein the amorphous organic compound is selected from the following compounds:

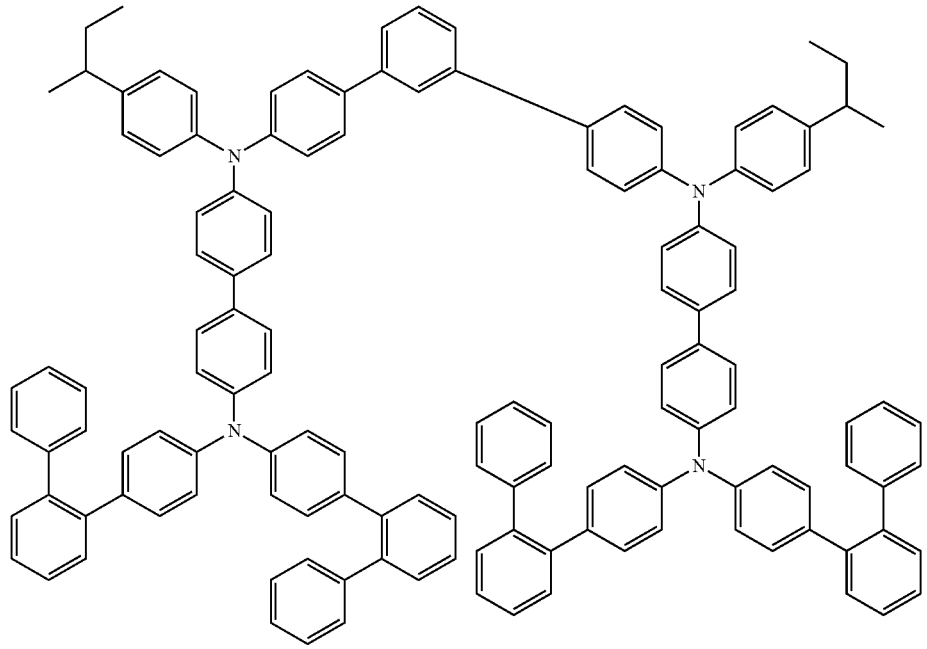

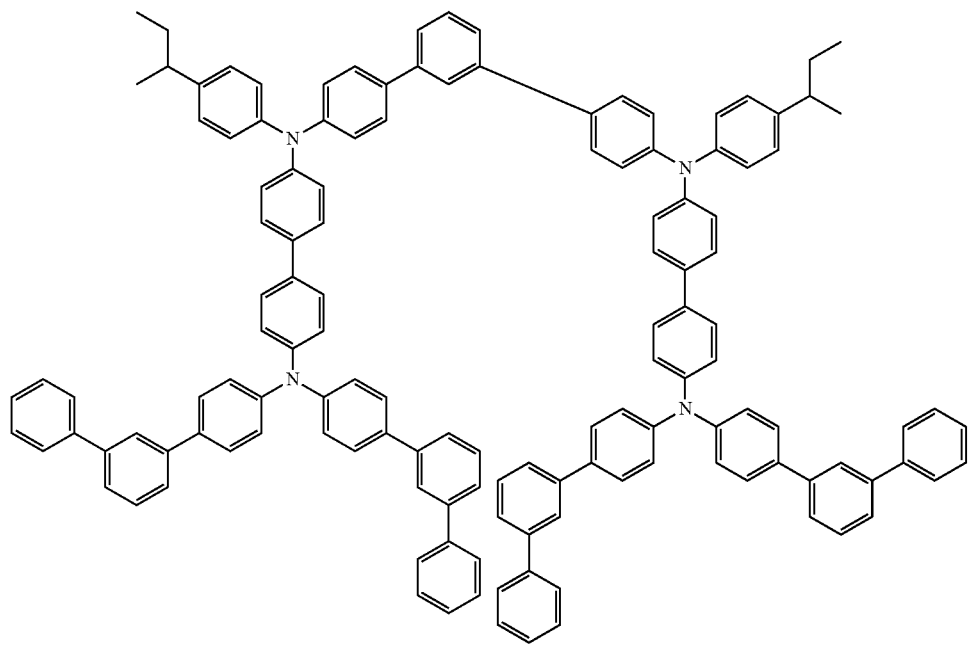 [SMILES: c1ccc(-c2cccc(-c3ccc(N(c4ccc(-c5ccc(N(c6ccccc6)c6ccc(-c7cccc(-c8ccc(N(c9ccccc9)c9ccc(-c%10ccc(N(c%11ccc(-c%12cccc(-c%13ccccc%13)c%12)cc%11)c%11ccc(-c%12cccc(-c%13ccccc%13)c%12)cc%11)cc%10)cc9)cc8)c7)cc6)cc5)cc4)c4ccc(-c5cccc(-c6ccccc6)c5)cc4)cc3)c2)cc1]

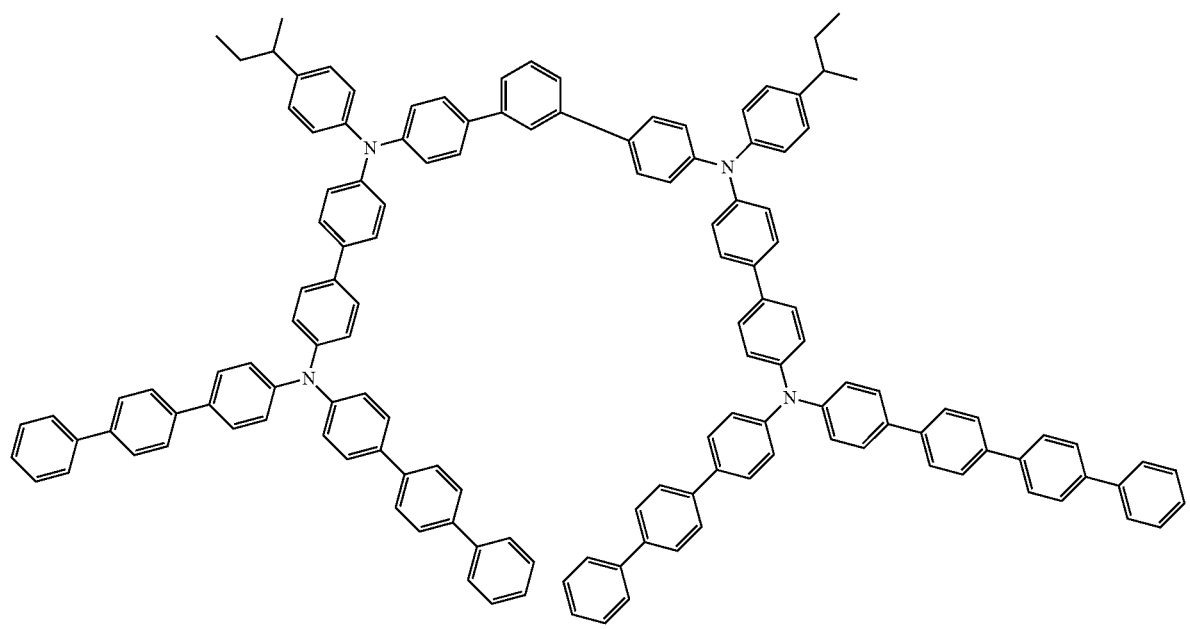
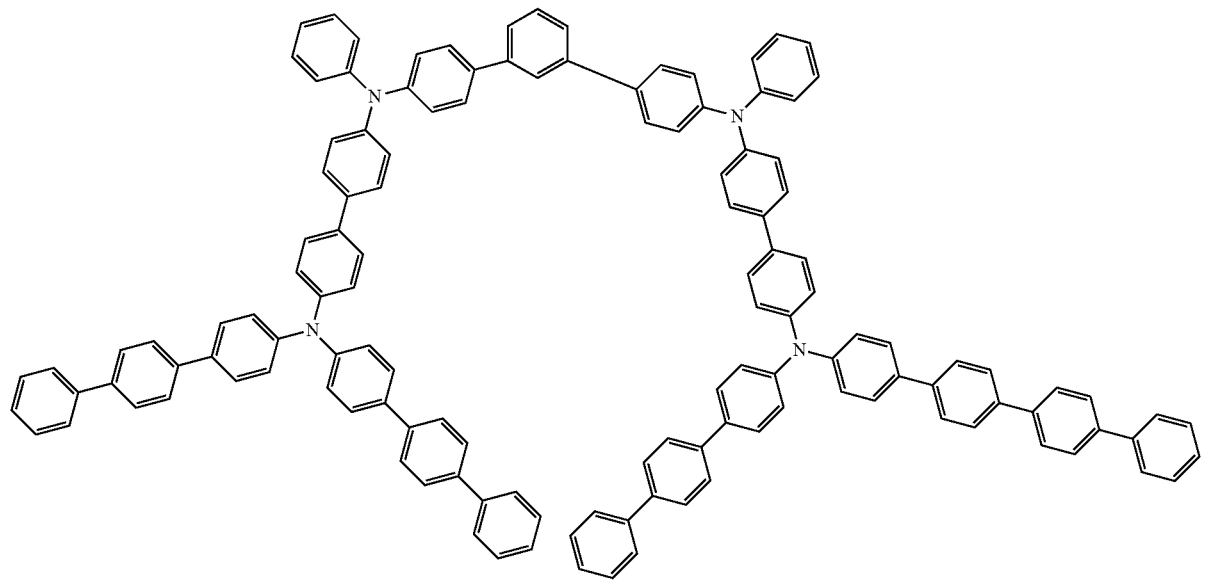

-continued
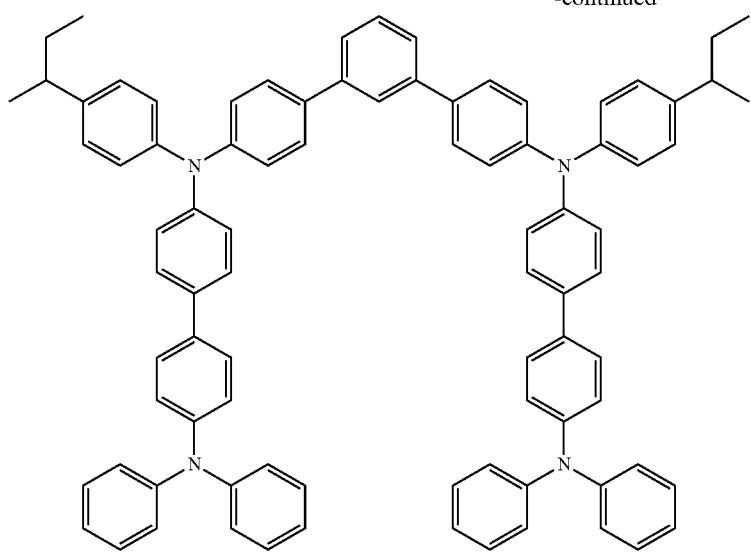
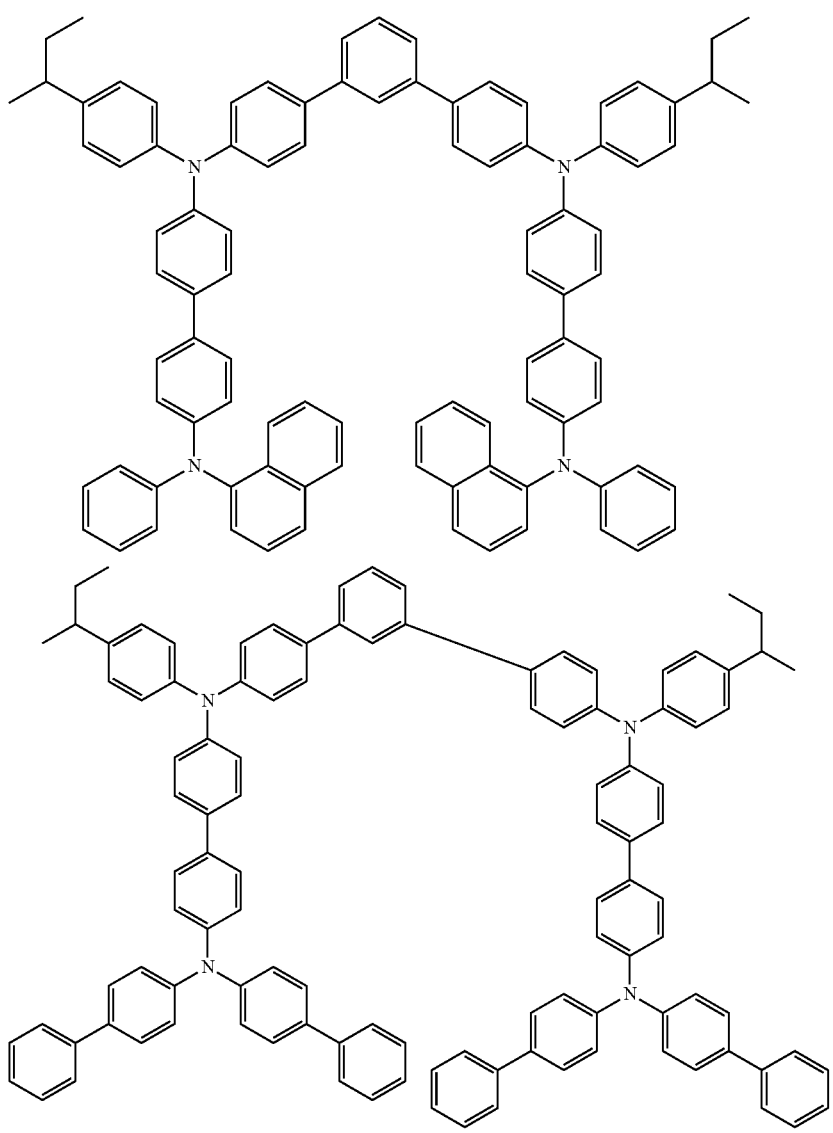

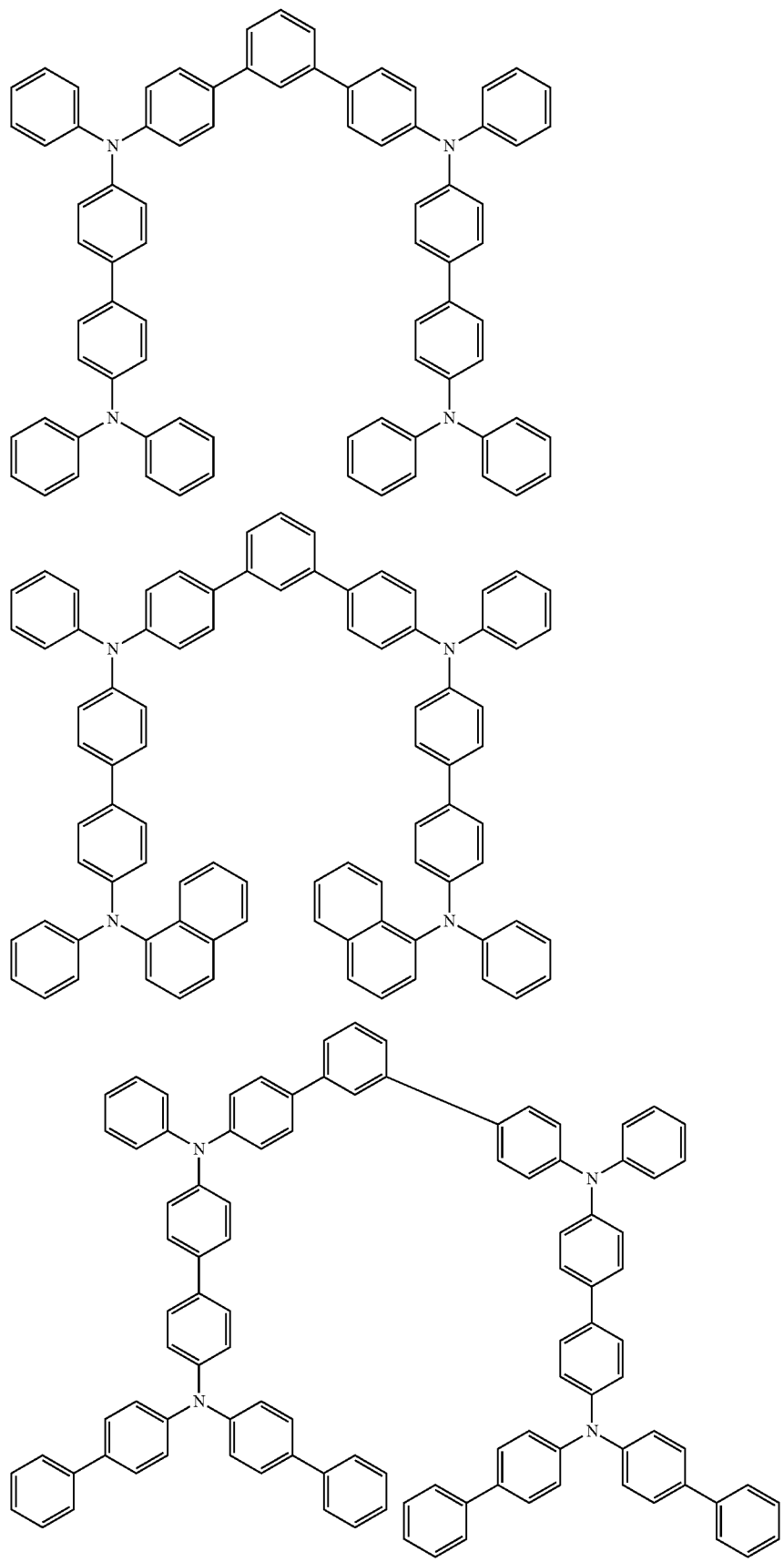

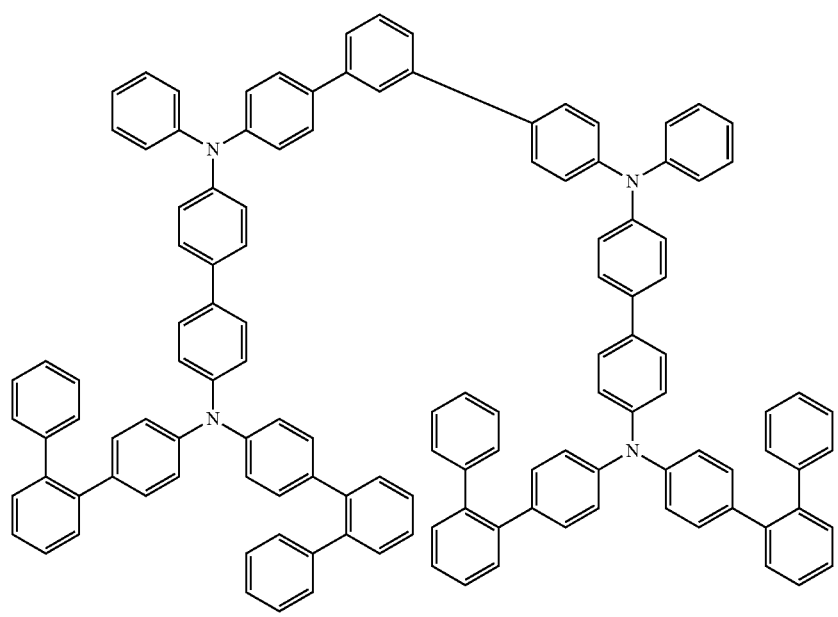
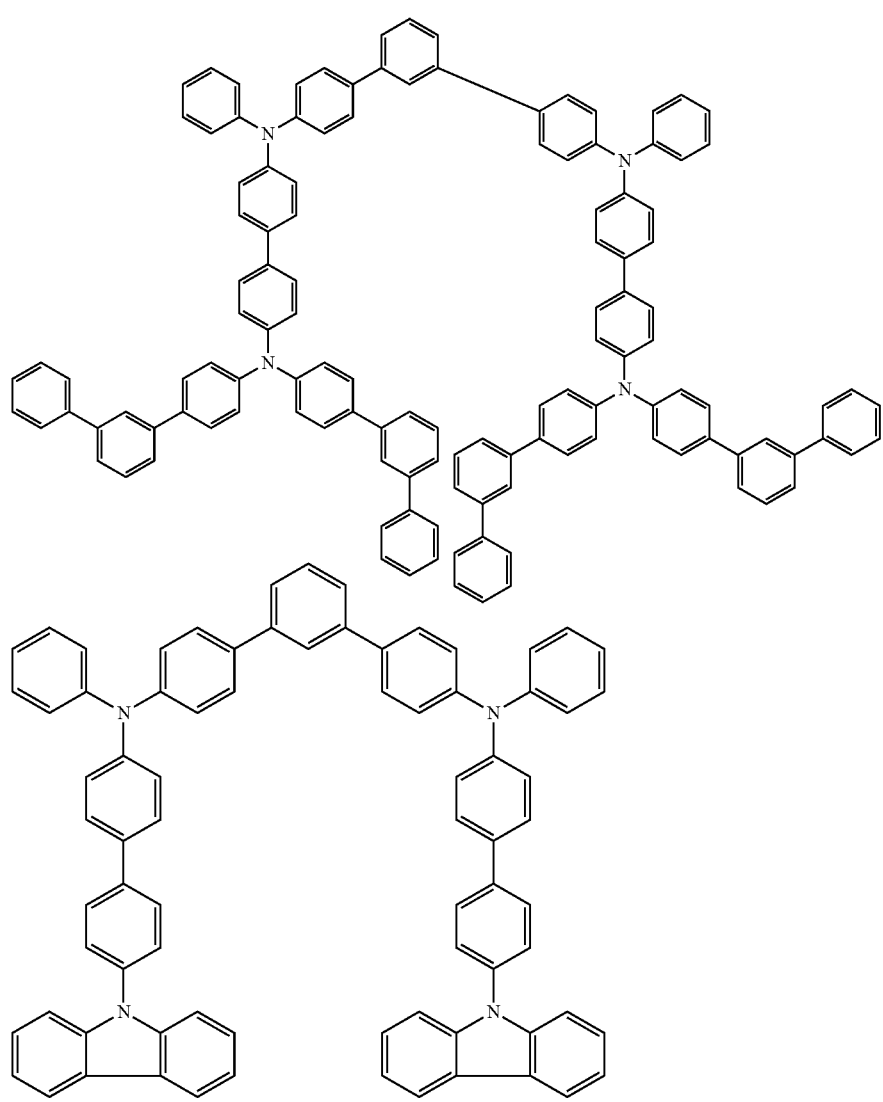

-continued
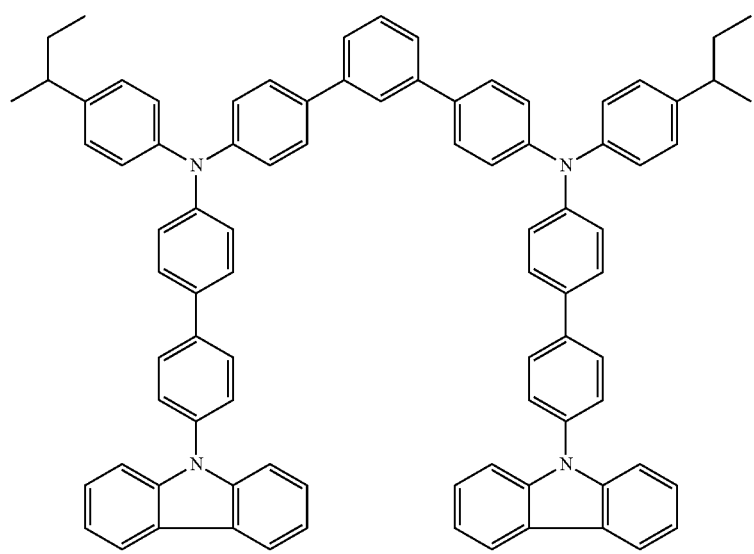
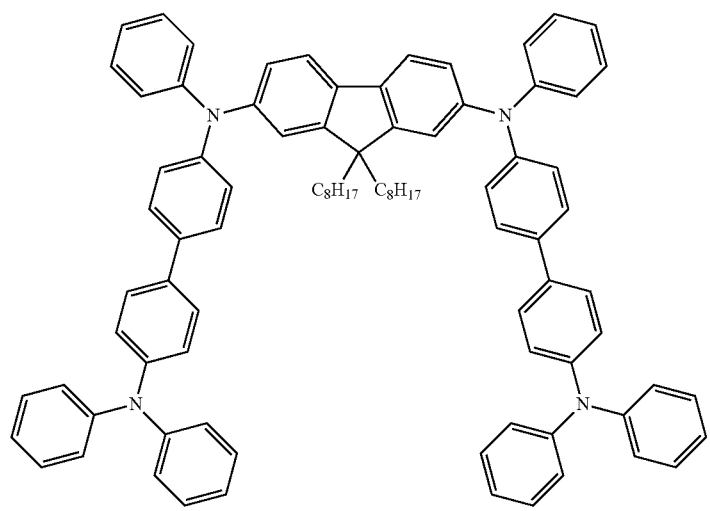
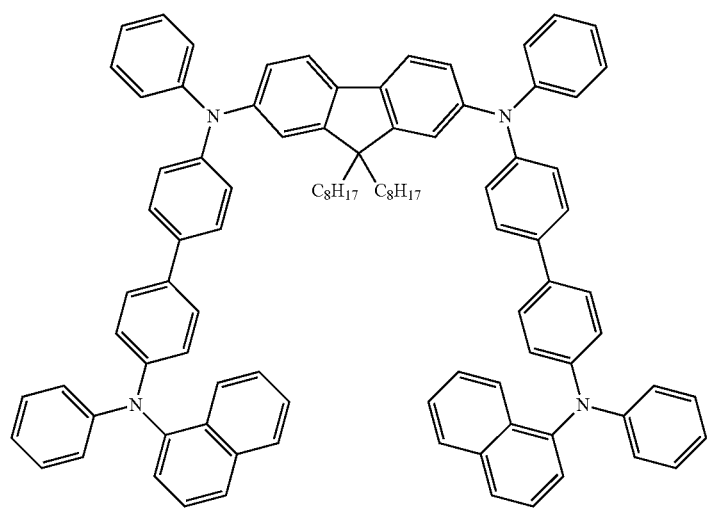

-continued
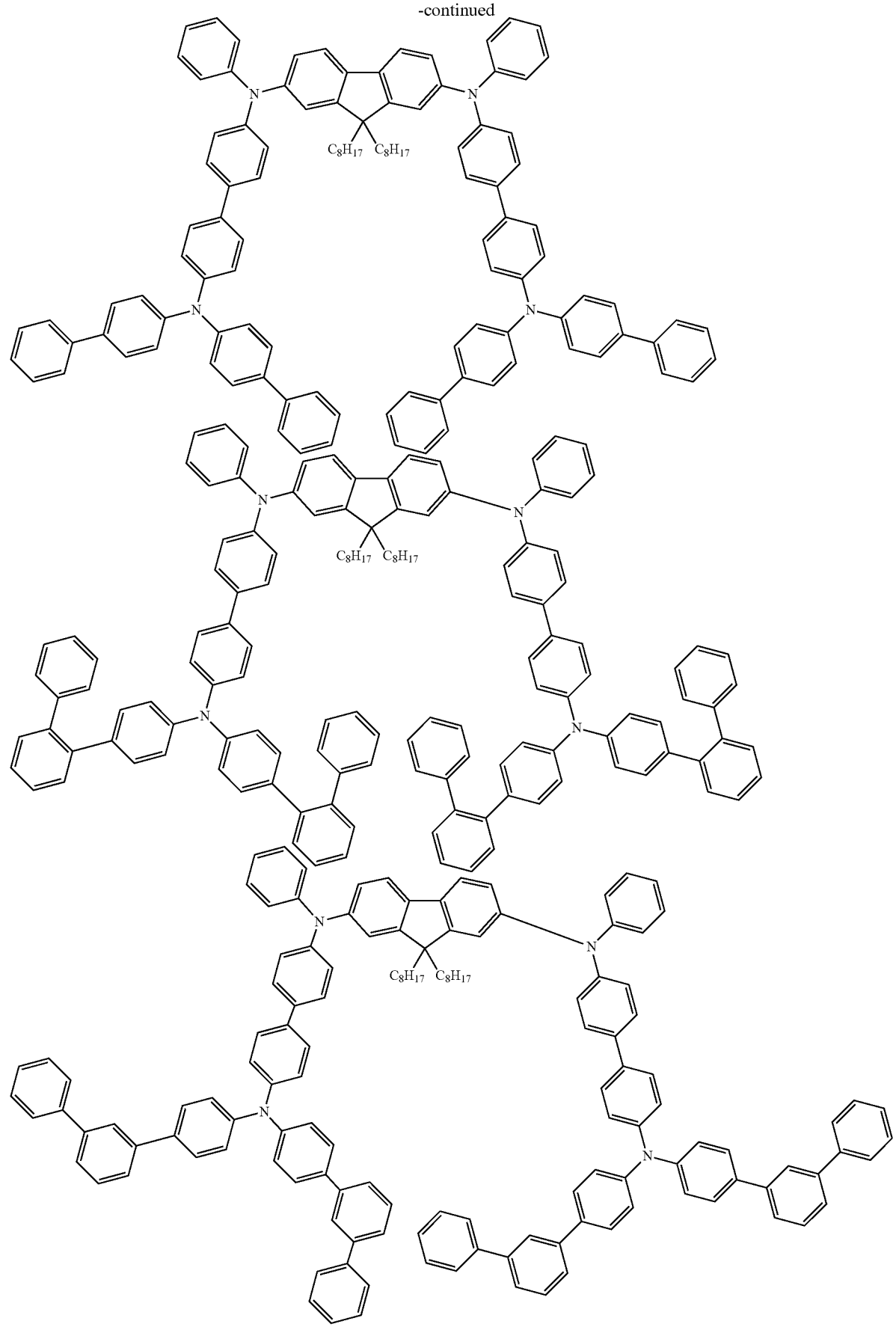

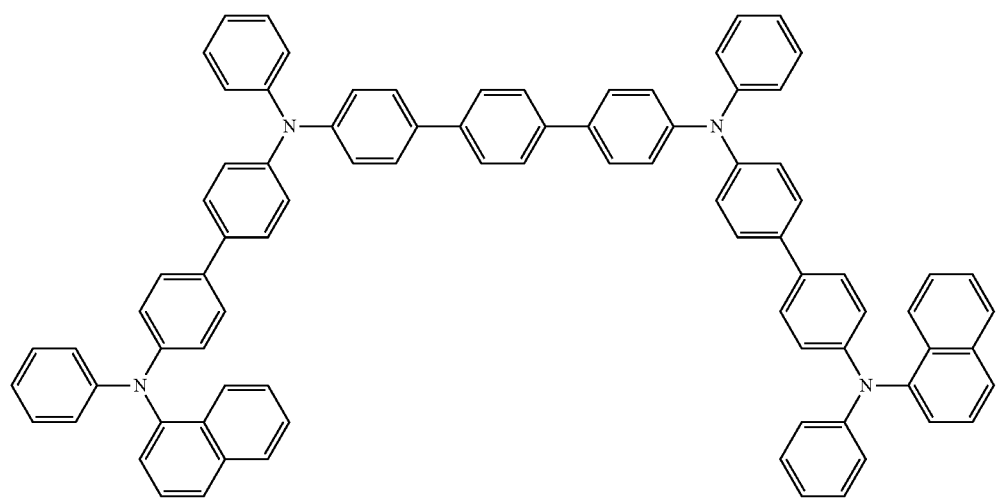
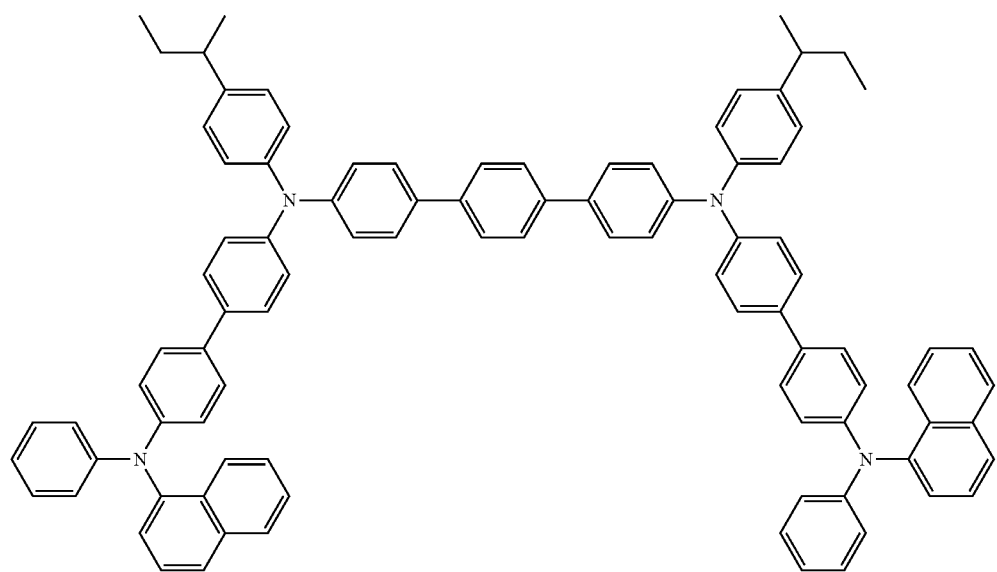
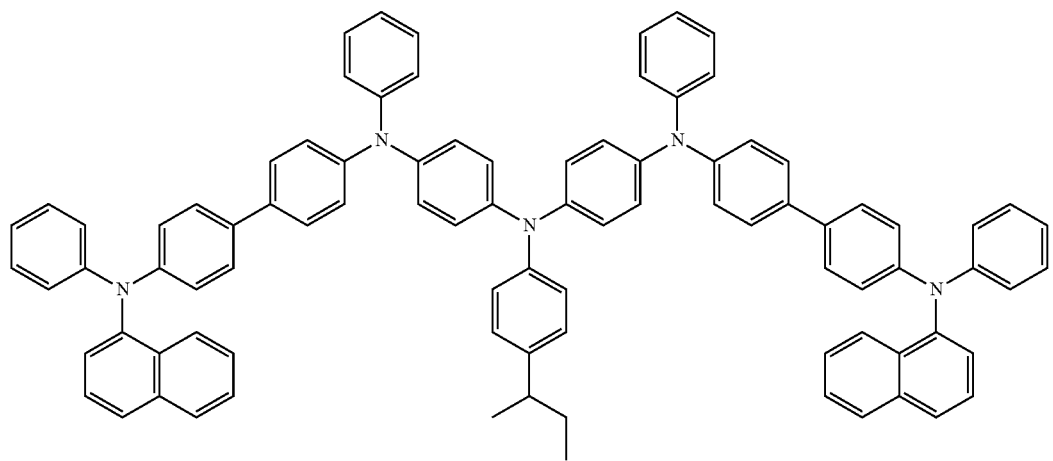

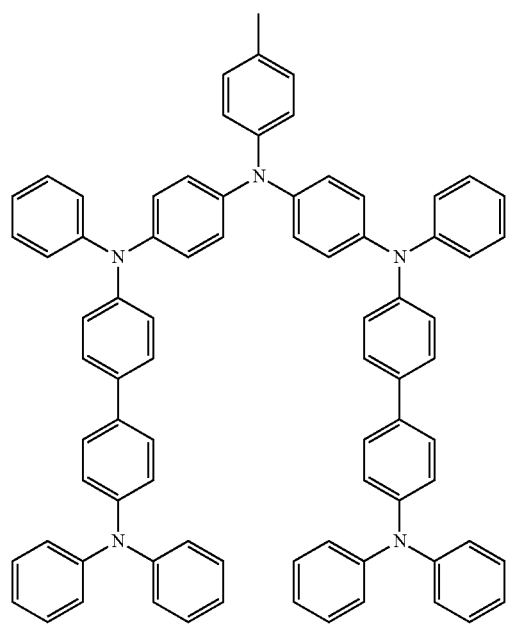
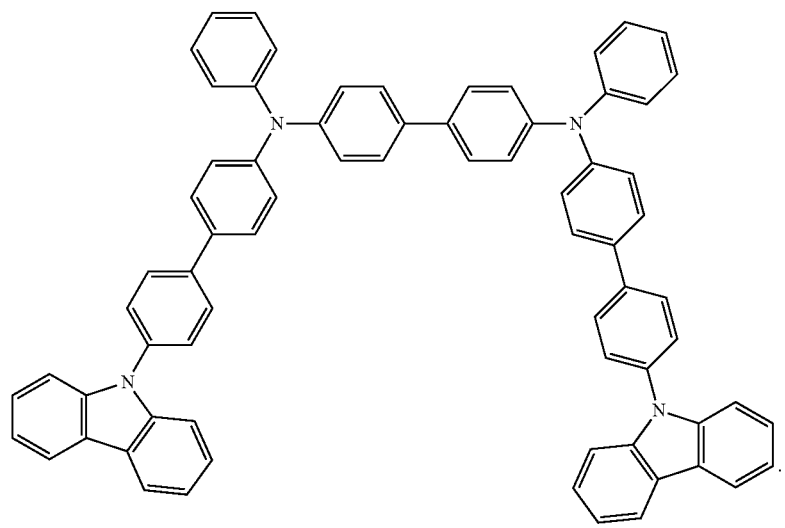 [SMILES: c1ccc(N(c2ccc(-c3ccc(N(c4ccccc4)c4ccc(-c5ccc(-n6c7ccccc7c7ccccc76)cc5)cc4)cc3)cc2)c2ccc(-c3ccc(-n4c5ccccc5c5ccccc54)cc3)cc2)cc1]
18. The organic thin film transistor according to claim 9, wherein the repeating unit represented by formula (D) or formula (E) are selected from the following units:
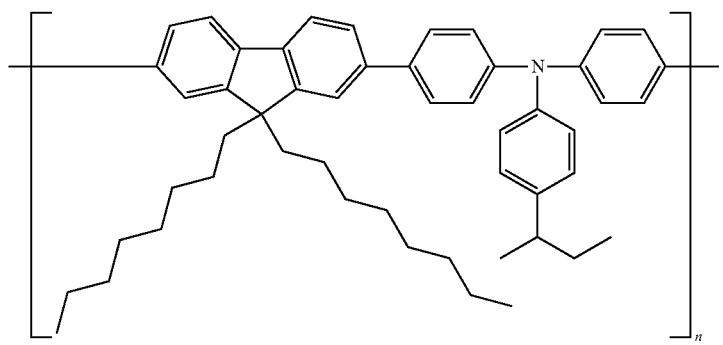

-continued
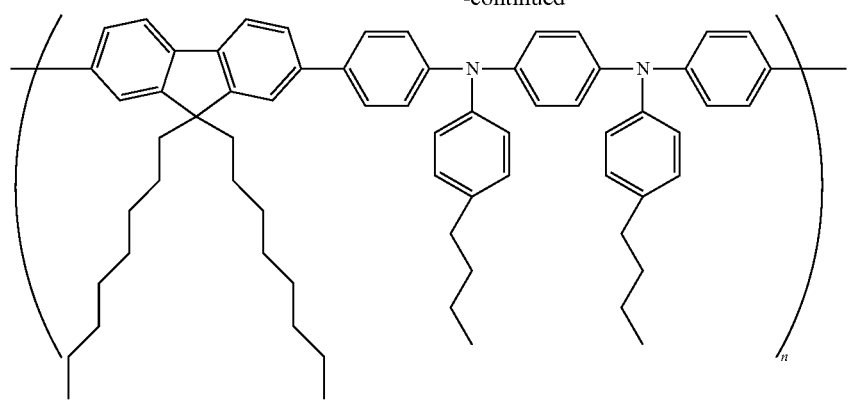
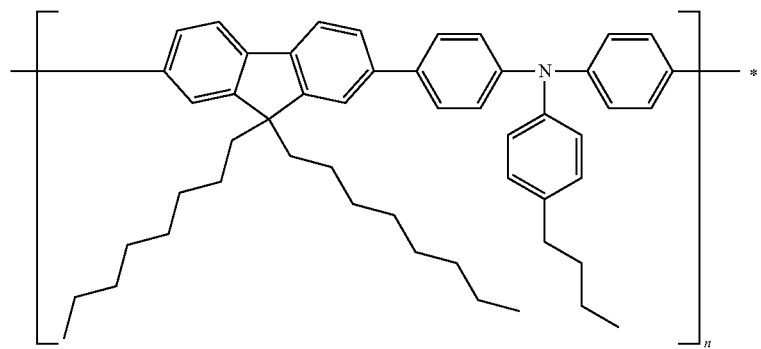
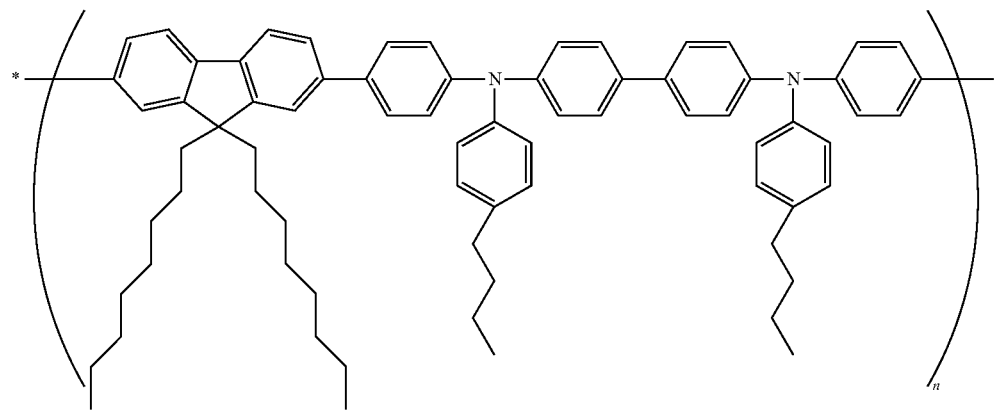
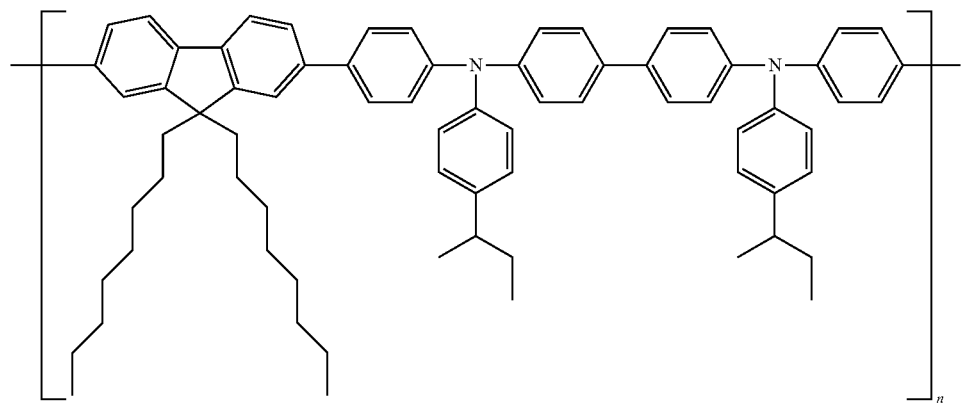

-continued
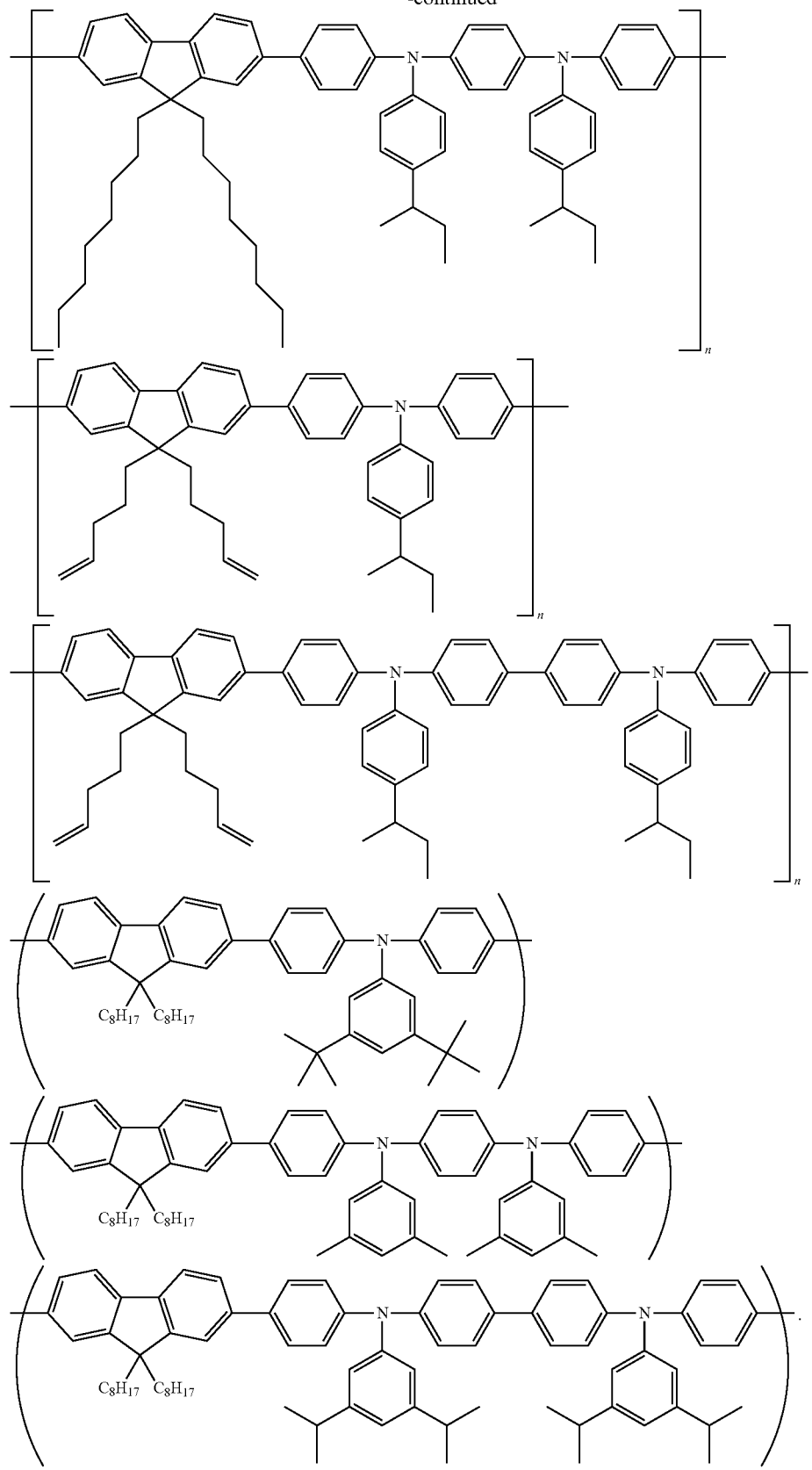

UNITED STATES PATENT AND TRADEMARK OFFICE
CERTIFICATE OF CORRECTION

PATENT NO. : 8,525,156 B2  
APPLICATION NO. : 12/679634  
DATED : September 3, 2013  
INVENTOR(S) : Nakamura et al.

It is certified that error appears in the above-identified patent and that said Letters Patent is hereby corrected as shown below:

In the Claims

Columns 109-110, the last structure reads:

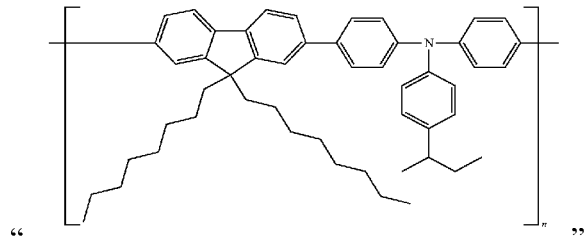

" "

Should read:

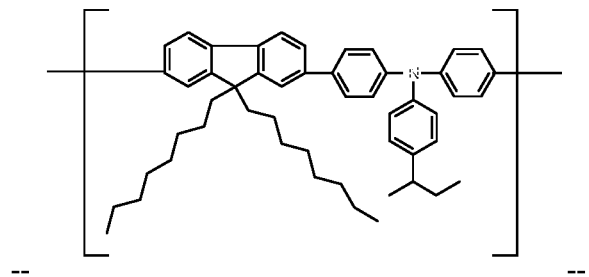

-- --

Columns 111-112, the first structure reads:

Signed and Sealed this  
Thirteenth Day of June, 2017

Joseph Matal  
*Performing the Functions and Duties of the*  
*Under Secretary of Commerce for Intellectual Property and*  
*Director of the United States Patent and Trademark Office*

"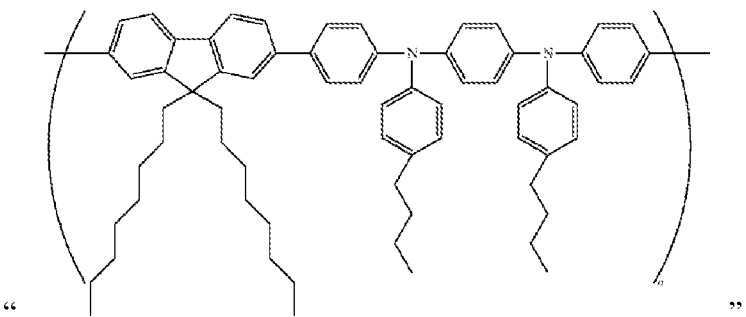"
Should read:
--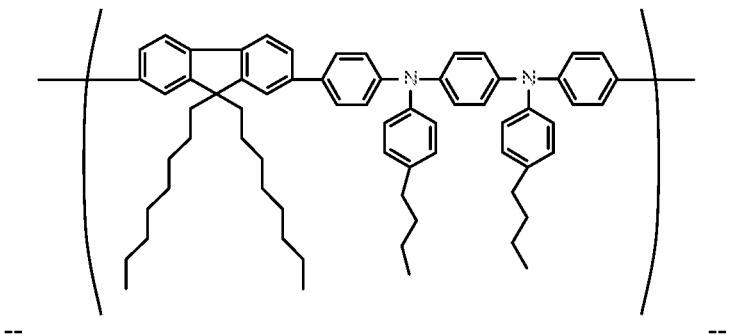--
Columns 111-112, the second structure reads:
"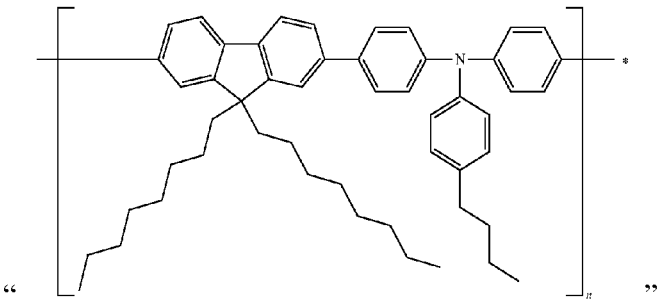"
Should read:
--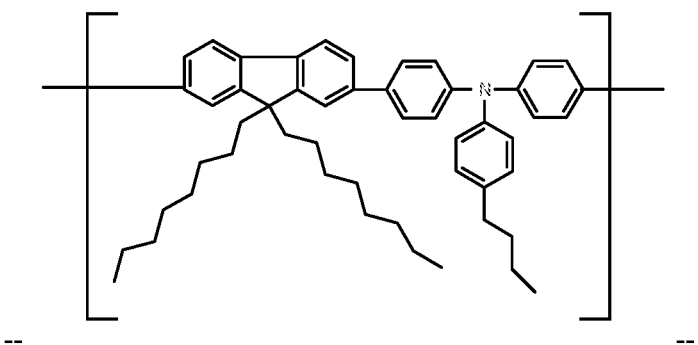--
Columns 111-112, the third structure reads:

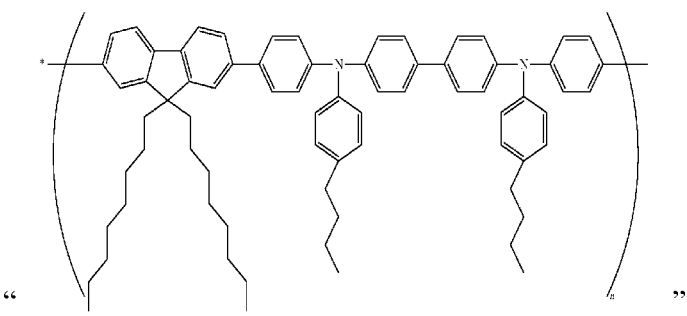
Should read:
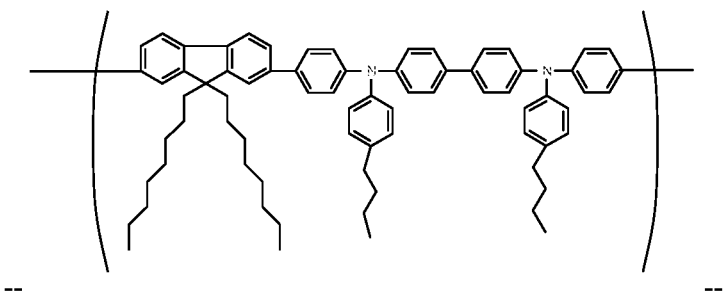
Columns 111-112, the fourth structure reads:
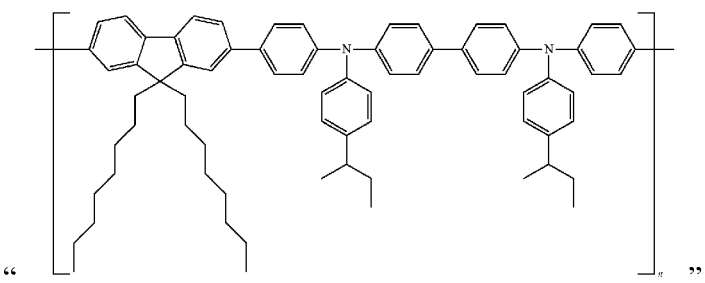
Should read:
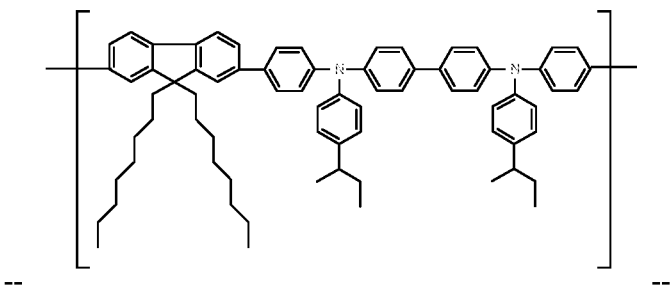
Columns 113-114, the first structure reads:

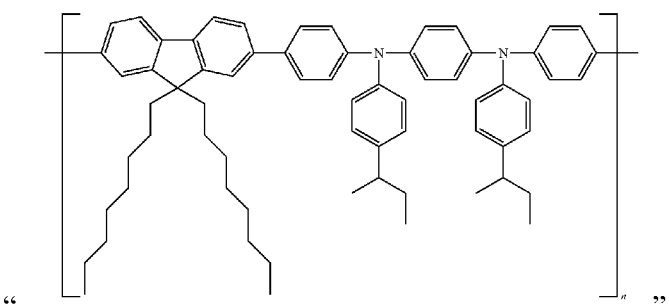
Should read:
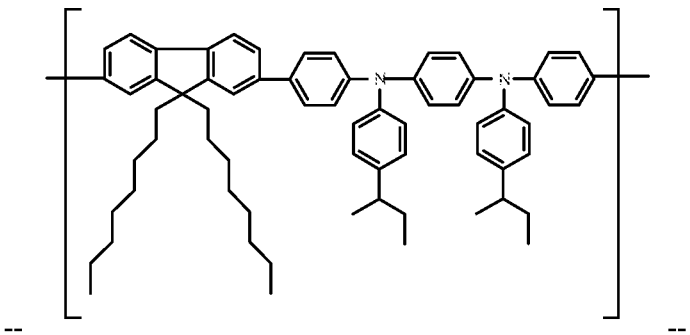
Columns 113-114, the second structure reads:
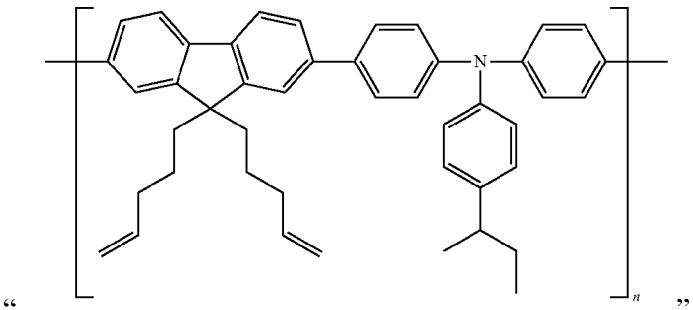
Should read:
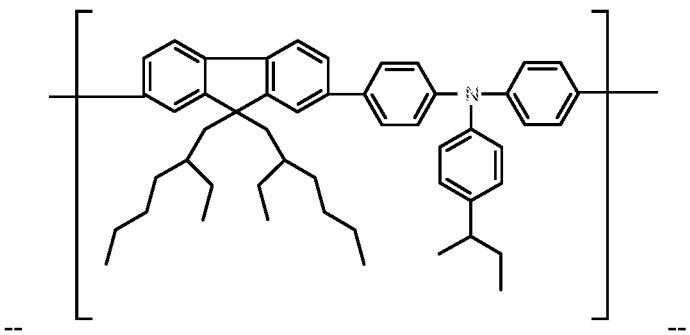
Columns 113-114, the third structure reads:

CERTIFICATE OF CORRECTION (continued)
U.S. Pat. No. 8,525,156 B2

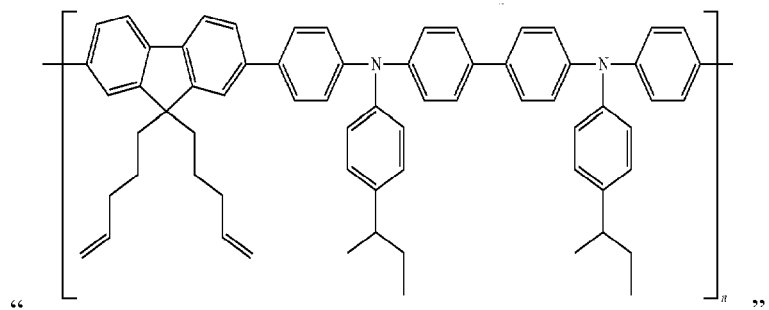

" "

Should read:

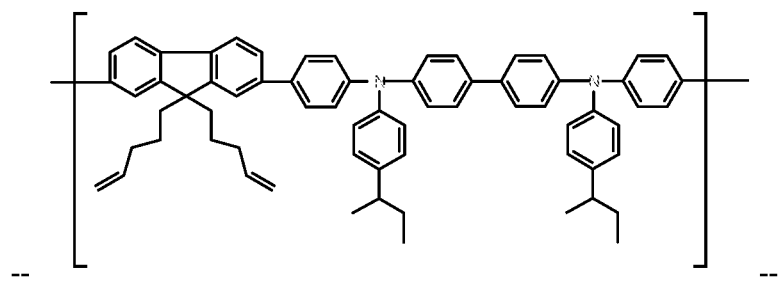

-- --

Columns 113-114, after the third structure, the following structures should be inserted:

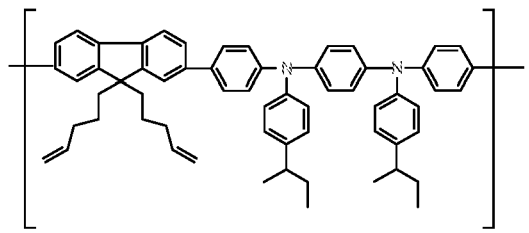

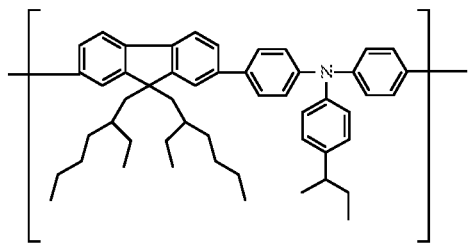

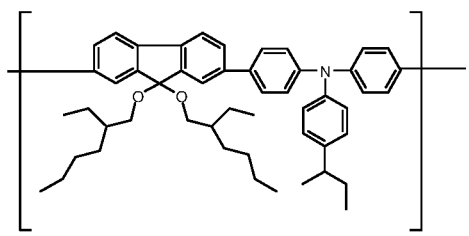

-- --